United States Patent
Ludwig

(10) Patent No.: US 8,565,355 B2
(45) Date of Patent: Oct. 22, 2013

(54) PULSE SIGNAL WAVEFORM ASYMMETRY IDENTIFICATION UTILIZING SYMBOLIC DYNAMICS

(75) Inventor: Lester F. Ludwig, Belmont, CA (US)

(73) Assignee: Pike Group LLC, Dover, DE (US)

( * ) Notice: Subject to any disclaimer, the term of this patent is extended or adjusted under 35 U.S.C. 154(b) by 216 days.

(21) Appl. No.: 13/004,020

(22) Filed: Jan. 10, 2011

(65) Prior Publication Data

US 2011/0103525 A1      May 5, 2011

Related U.S. Application Data

(63) Continuation of application No. 11/463,557, filed on Aug. 9, 2006, now Pat. No. 7,873,130.

(60) Provisional application No. 60/707,287, filed on Aug. 10, 2005.

(51) Int. Cl.
    *H04L 27/06* (2006.01)

(52) U.S. Cl.
    USPC ........................................................ 375/340

(58) Field of Classification Search
    USPC ................. 375/340, 360, 362, 371, 375–376; 327/39–40, 47
    See application file for complete search history.

(56) References Cited

U.S. PATENT DOCUMENTS

| | | | |
|---|---|---|---|
| 3,947,775 A | 3/1976 | Thiebaut | |
| 3,956,710 A * | 5/1976 | Seitz et al. | .................... 331/1 A |
| 3,958,269 A | 5/1976 | Davis | |
| 3,987,365 A | 10/1976 | Okada et al. | |
| 4,068,171 A | 1/1978 | Huguenin et al. | |
| 4,278,898 A | 7/1981 | Rhode | |
| 4,320,527 A | 3/1982 | Takasaki | |
| 4,322,686 A | 3/1982 | Butin | |
| 4,516,250 A * | 5/1985 | Grimes | .................... 375/328 |
| 4,527,080 A | 7/1985 | Zweig | |
| 4,677,322 A | 6/1987 | Burson et al. | |
| 4,772,852 A | 9/1988 | Viti | |
| 4,940,952 A | 7/1990 | Kegasa | |
| 5,550,864 A * | 8/1996 | Toy et al. | .................... 375/293 |
| 5,559,840 A * | 9/1996 | Melas et al. | .................... 375/355 |
| 5,939,901 A | 8/1999 | Geddes | |

(Continued)

OTHER PUBLICATIONS http://zone.ni.com/devzone/cda/tut/p/id/2875 National Instruments "Pulse-Width Measurement with a Counter" Sep. 6, 2006.

(Continued)

*Primary Examiner* — Khanh C Tran

(57) ABSTRACT

A method for identifying asymmetry in a pulse signal is disclosed. An asymmetrical condition is when the time interval of a first input pulse signal having a first value is longer than the time of a second input pulse signal having a second value. Identifying asymmetry includes receiving and detecting the instantaneous signal values of first and second input pulse signals, and associating a unique state symbol with each distinct pair of instantaneous signal values thereby producing a sequence of state symbols. A sequence of state symbols of a first type, a second type, and a third type is identified and associated with a distinct enveloping event pattern. A macroscopic behavioral signature pattern indicating an asymmetrical condition is identified when a first symmetry event symbol of a first kind is followed by a first interval having no identified symmetry event symbol, a second symmetry event symbol of a second kind, and a second interval having no identified symmetry event symbol.

20 Claims, 52 Drawing Sheets

Event-driven

(56) References Cited

U.S. PATENT DOCUMENTS

| | | | |
|---|---|---|---|
| 6,218,907 B1 | | 4/2001 | Tamaki et al. |
| 6,392,494 B2 | | 5/2002 | Takeyabu et al. |
| 6,493,378 B1 | * | 12/2002 | Zhodzishsky et al. ........ 375/149 |
| 6,563,346 B2 | | 5/2003 | Abbiate et al. |
| 6,650,146 B2 | | 11/2003 | Liu et al. |
| 7,079,612 B2 | * | 7/2006 | Tarng ............................ 375/354 |
| 7,342,986 B2 | * | 3/2008 | Nakamura et al. ............ 375/376 |
| 7,760,840 B2 | | 7/2010 | Chang |
| 2004/0160874 A1 | * | 8/2004 | Hwang et al. .............. 369/47.53 |

OTHER PUBLICATIONS http://electronicdesign.com/article/test-and-measurement/pulse-width-measurement-made-by-microcontroller-wi.aspx Electronic Design "Pulse-Width Measurement Made by Microcontroller With MFT" Feb. 9, 1998.

http://www.datasheetcatalog.org/datasheets/560/492560_DS.pdf Texas Instruments "Bidirectional Servo-AMP Pulse Width Detector" Aug. 1980.

"Frequency Comparator", Electronics Design Magazine, Sep. 5, 1995, available at http://www.newcircuits.com/circuit.php?id=msr006, 1 page. [Retrieved Jan. 15, 2004].

Baranauskas, Dalius, "Frequency comparator draws 8 uA", EDN Access, Mar. 3, 1997, available at http://www.edn.com/archives/1997/030397/05DI.sub.--05.htm, 1 page. [Retrieved Jan. 15, 2004].

Forster, Edward, "The Phase/Frequency Comparator Simplified", Electronics World, Feb. 1997, available at http://ecforster.netfirms.com/phfrqdet/Doc1.html, 4 page. [Retrieved Jan. 15, 2004].

Holton, Charles et al., "Symmetry in Packing Problems and Tiling Systems", University of Texas at Austin, Oct. 12, 2003, 36 pages.

Holton, Charles et al., "Conjugacies for Tiling Dynamical Systems", Department of Mathematics, University of Texas, at Austin, Jul. 18, 2003, available at http://arxiv.org/PS.sub.--cache/math/pdf/0307/0307259v1.pdf, 19 pages.

Dijkstra, W., "Frequency window comparator has hysteresis", EDN Access, 1996, available at http://www.edn.com/archives/1996/110796/23DI.sub.--05.htm, 2 pages. [Retrieved Jan. 15, 2004].

Maggio, Gian Mario, "Applicatons of Symbolic Dynamics to Differential Chaos Shift Keying", IEEE Transactions on Circuits and System I: Fundamental Theory and Applications, vol. 49, No. 12, Dec. 2002, pp. 1729-1735.

"Invited Presentations (IP)", exercised on Mar. 22, 2004 at http://arofe.army.mil/Confences/siam.sub.--abstract/siam.sub.--table.sub.- --lv1, 3 pages. [Retrieved Mar. 22, 2004].

Adler, Roy L., "Symbolic Dynamics and Markov Partitions", Bulletin (New Series) of the American Mathematical Society, vol. 35, No. 1, Jan. 1998, pp. 1-56.

Hao, Bai-Lin., "Applied Symbolic Dynamics", Chinese Journal of Physics, vol. 36, No. 6, Dec. 1998, pp. 753-757.

Rosenblum, Michael G. and Pikovsky, Arkady S., "Detecting direction of coupling in interacting oscillators", Physical Review E (Statistical, Nonlinear, and Soft Matter Physics), vol. 64, Oct. 2001, p. 045202-1-045202-4.

Tufillaro, Nicholas B., "Symbolic Dynamics", Mar. 3, 1997, available at http://www.drchaos.net/drchaos/Book/node49.html, 2 pages. [Retrieved Mar. 5, 2004].

Mingo, James A., "A Classification One Dimensional Almost Periodic Tilings Arising from the Projection Method", Transactions of the American Mathematical Society, vol. 352, No. 11, Jul. 18, 2000, pp. 5263-5277.

Keller, K. et al., "Distances of Time Series Componentsby Means of Symbolic Dynamics", Mathematical Institute, Lubeck, Germany, 2004, 15 pages.

Boyle, Mike, "Positive K-Theory and Symbolic Dynamics", 2000 Mathematics Subject Classification 37B10, Jun. 22, 2001, pp. 1-17.

Robinson, C., "Symbolic Dynamics for Transition Tori", Apr. 21, 2001, available at http://www.math.northwestern.edu/.about.clark/preprints/tori/tori.pdf, pp. 1-9.

Reid, Gordon, "Synth Secrets: Synthesizing Strings, PWM & String Sounds", SOS—Sound on Sound, Mar. 2003, available at http://www.soundonsound.com/sos/Mar03/articles/synthsecrets47.asp, 7 pages. [Retrieved May 14, 2007].

Weisstein, Eric W., "Homoclinic Point", MathWorld—A Wolfram Web Resource, available at http://mathworld.wolfram.com/HomoclinicPoint.html, 1 page. [Retrieved Mar. 22, 2004].

Weisstein, Eric W., "Quasiperiodic Motion", MathWorld—A Wolfram Web Resource, available at http://mathworld.wolfram.com/QuasiperiodicMotion.html, 1 page. [Retrieved Mar. 15, 2004].

Weisstein, Eric W., "Group Cycle", MathWorld—A Wolfram Web Resource, available at http://mathworld.wolfram.com/GroupCycle.html, 1 page. [Retrieved Mar. 15, 2004].

Rowland, Todd and Weisstein, Eric W., "Group Orbit", MathWorld—A Wolfram Web Resource, available at http://mathworld.wolfram.com/GroupOrbit.html, 2 pages. [Retrieved Mar. 22, 2004].

Tufillaro, Nicholas B., "Homoclinic and Heteroclinic Points", Mar. 3, 1997, available at http://www.drchaos.net/drchaos/Book/node120.html, 3 pages. [Retrieved Mar. 15, 2004].

"Dynamics", HUT, Institute of mathematics, Mar. 5, 2004, available at http://math.tkk.fi/.about.kve/resabs.html, 2 pages. [Retrieved Mar. 5, 2004].

* cited by examiner

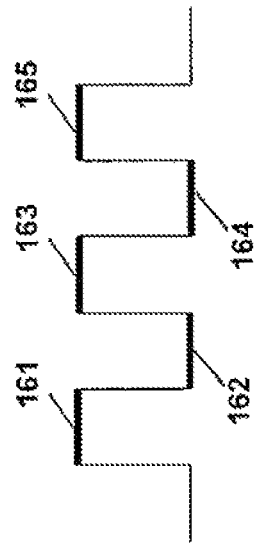
*Fig. 1c* State-determined
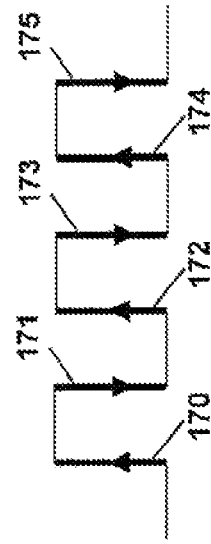
*Fig. 1d* Transition-determined
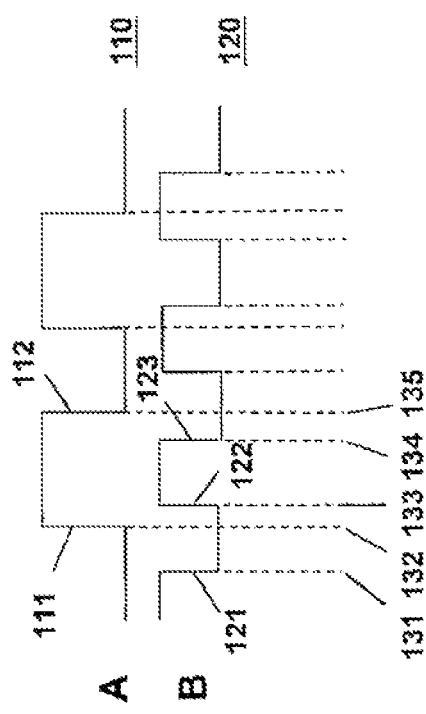
*Fig. 1a* Event-driven
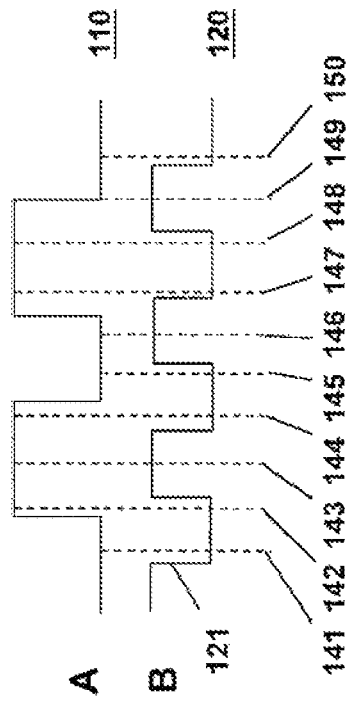
*Fig. 1b* Time-driven

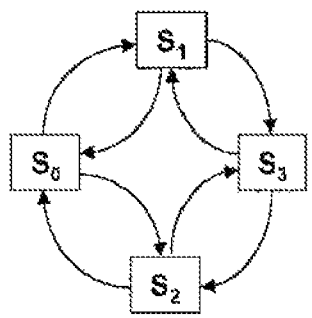
*Fig. 1e*     Event-driven
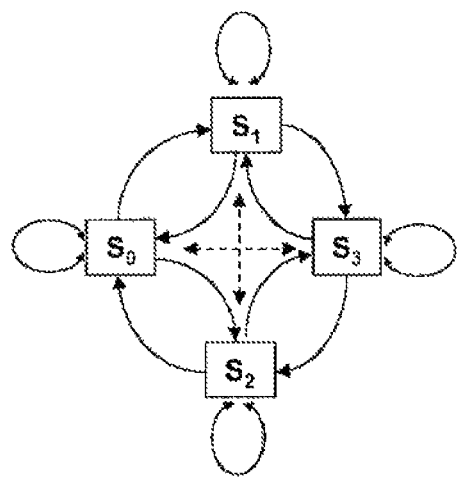
*Fig. 1f*     Time-driven

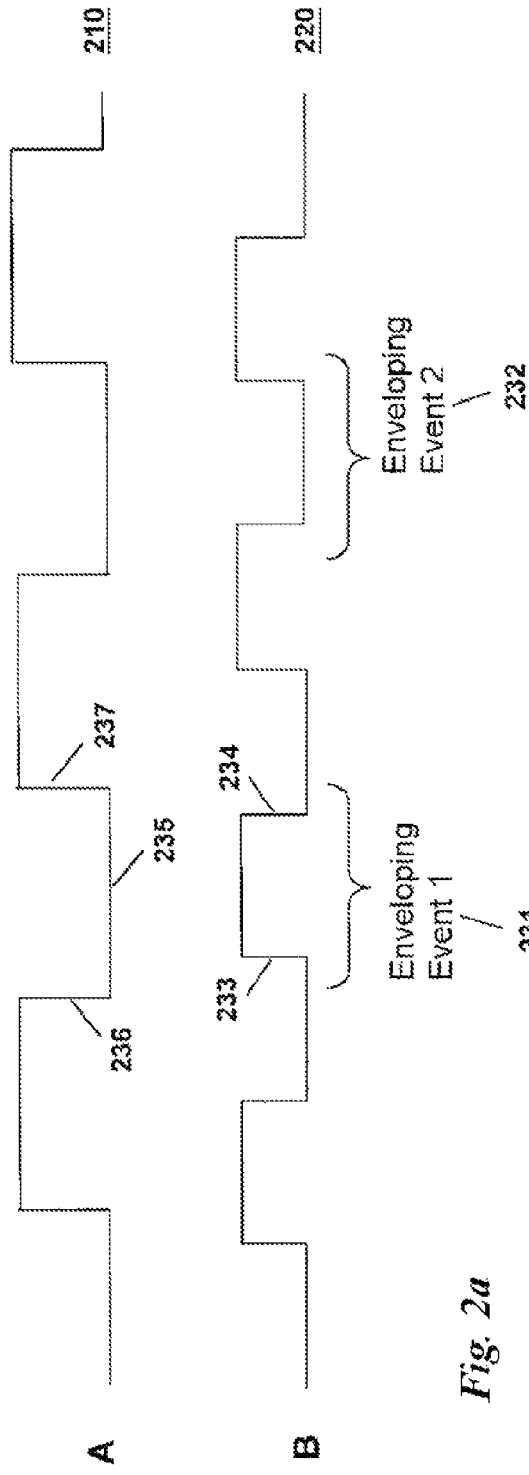
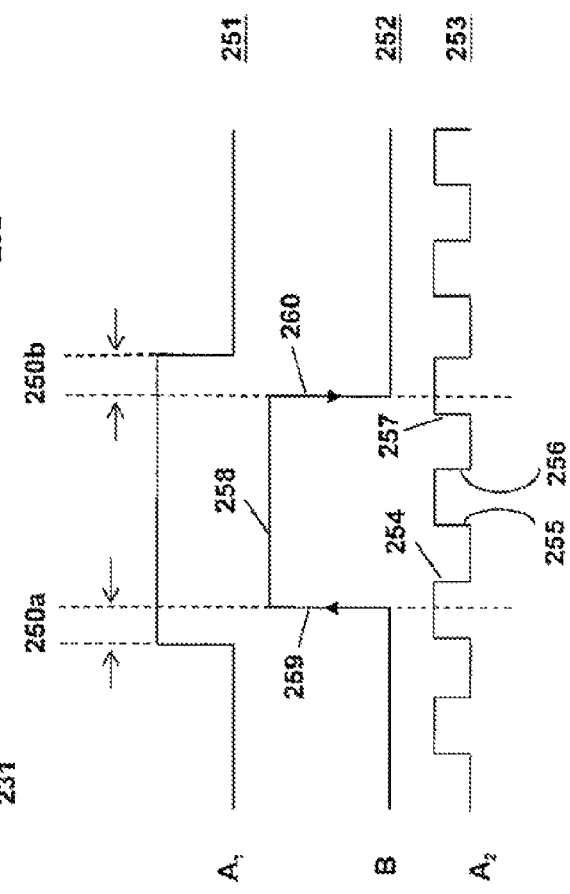
Fig. 2a
Fig. 2b

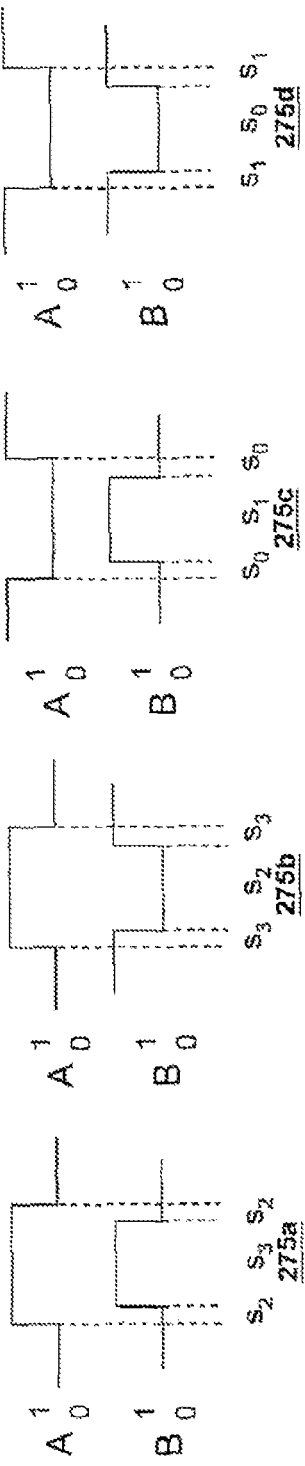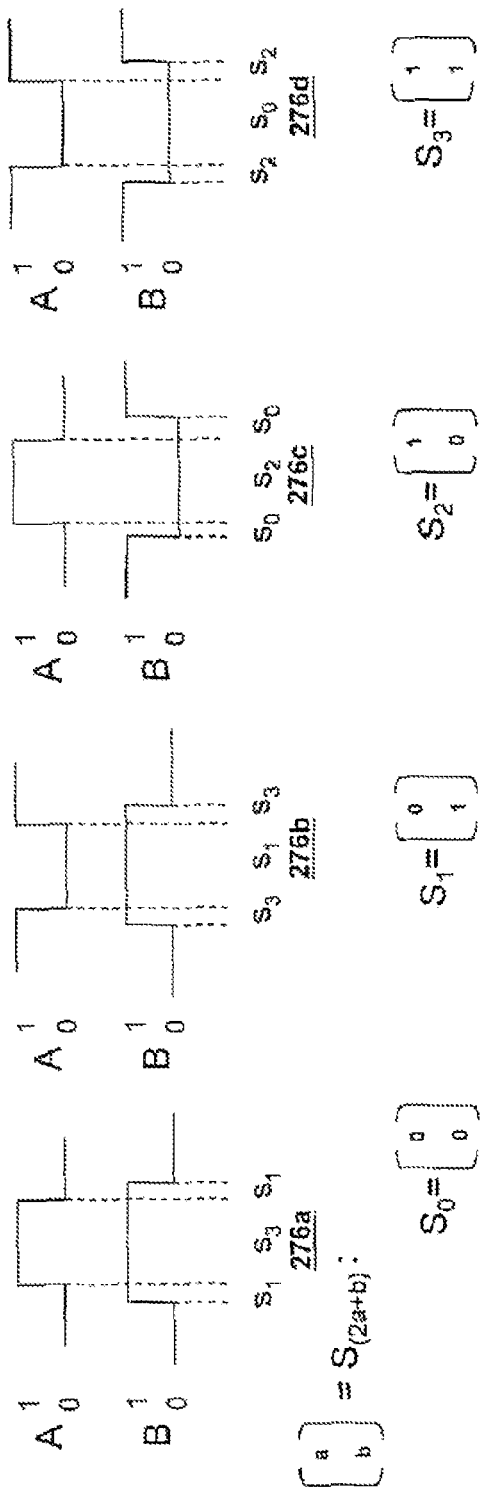
Fig. 2c

B faster than A

320a, 320b, 320c, 320d $S_0 \rightarrow S_1 \rightarrow S_0$  310a
$S_1 \rightarrow S_0 \rightarrow S_1$  310b
$S_2 \rightarrow S_3 \rightarrow S_2$  310c
$S_3 \rightarrow S_2 \rightarrow S_3$  310d

A faster than B

340a, 340b, 340c, 340d $S_0 \rightarrow S_2 \rightarrow S_0$  330a
$S_1 \rightarrow S_3 \rightarrow S_1$  330b
$S_2 \rightarrow S_0 \rightarrow S_2$  330c
$S_3 \rightarrow S_1 \rightarrow S_3$  330d

Notation

$S_0 = \begin{bmatrix} 0 \\ 0 \end{bmatrix}$  $S_1 = \begin{bmatrix} 0 \\ 1 \end{bmatrix}$  $S_2 = \begin{bmatrix} 1 \\ 0 \end{bmatrix}$  $S_3 = \begin{bmatrix} 1 \\ 1 \end{bmatrix}$ $S_{(2a+b)} = \begin{bmatrix} a \\ b \end{bmatrix}$

*Fig. 3a*

| Symmetric-Event Symbol | Symbol Sequence | Waveform View | Transition Representation | Higher Freq |
|---|---|---|---|---|
| $W_{01}$ | $s_0$ $s_1$ $s_0$ | | B  360a 360b<br>↑  ↓<br>A ――― 365b | B |
| $W_{10}$ | $s_1$ $s_0$ $s_1$ | | B ↓ ↑<br>A | B |
| $W_{23}$ | $s_2$ $s_3$ $s_2$ | | A⟋370a ――― 365a<br>⟋370b↑ ↓<br>B | B |
| $W_{32}$ | $s_3$ $s_2$ $s_3$ | | A<br>↓ ↑<br>B | B |
| $W_{02}$ | $s_0$ $s_2$ $s_0$ | | A ↑ ↓<br>B | A |
| $W_{13}$ | $s_1$ $s_3$ $s_1$ | | B<br>↑ ↓<br>A | A |
| $W_{20}$ | $s_2$ $s_0$ $s_2$ | | A ↓ ↑<br>B | A |
| $W_{31}$ | $s_3$ $s_1$ $s_3$ | | B ↓ ↑<br>A | A |

*Fig. 3b*

401 — Rate-Distinguishing Outer Symbols

| Common Center Symbol | Rate-Distinguishing Outer Symbols | |
|---|---|---|
| | A faster than B | B faster than A |
| $S_0$ | $S_2$ | $S_1$ |
| $S_1$ | $S_3$ | $S_0$ |
| $S_2$ | $S_0$ | $S_3$ |
| $S_3$ | $S_1$ | $S_2$ |
| 405 | 410 | 415 |

402 — Rate-Distinguishing Center Symbol

| Common Outer Symbols | Rate-Distinguishing Center Symbol | |
|---|---|---|
| | A faster than B | B faster than A |
| $S_0$ | $S_2$ | $S_1$ |
| $S_1$ | $S_3$ | $S_0$ |
| $S_2$ | $S_0$ | $S_3$ |
| $S_3$ | $S_1$ | $S_2$ |
| 420 | 425 | 430 |

*Fig. 4*

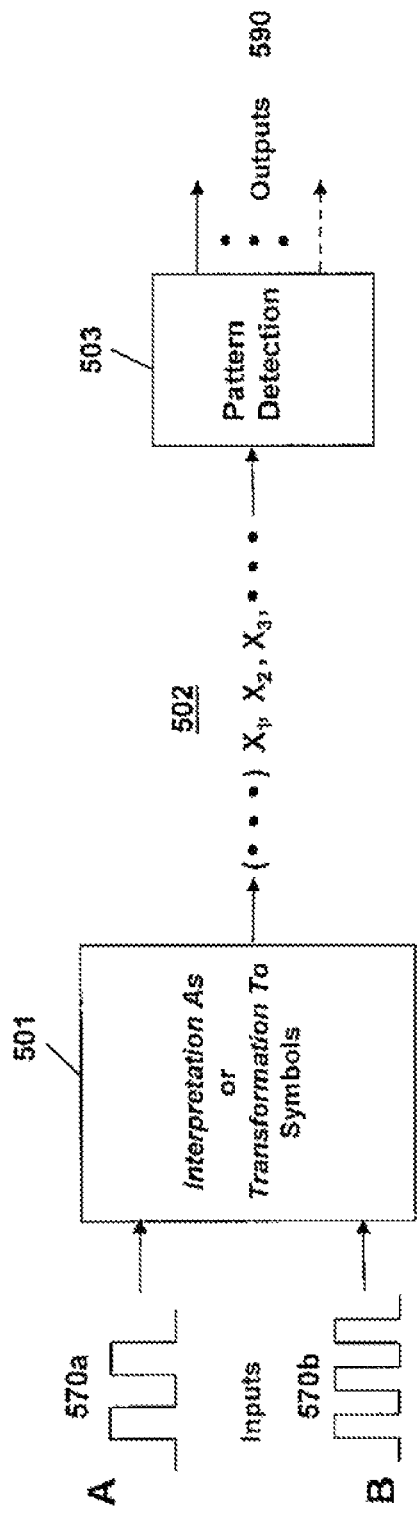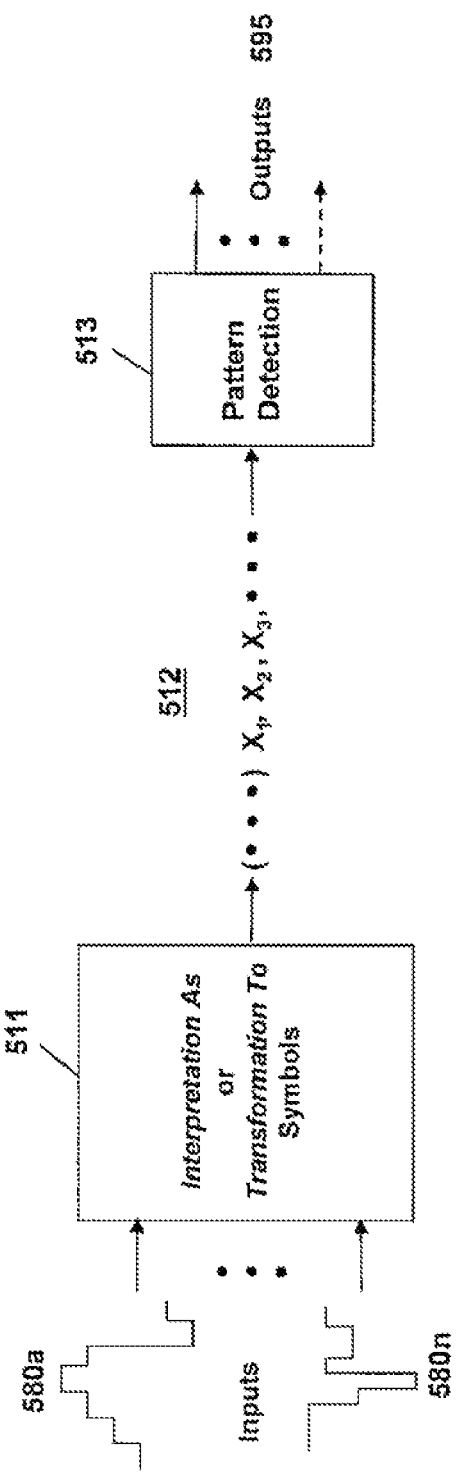

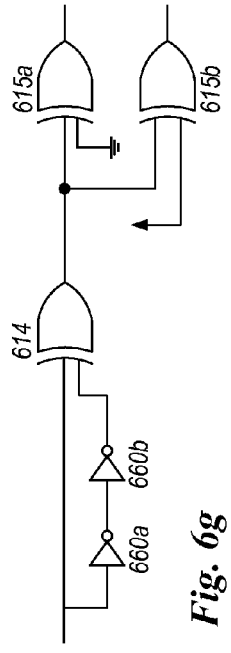
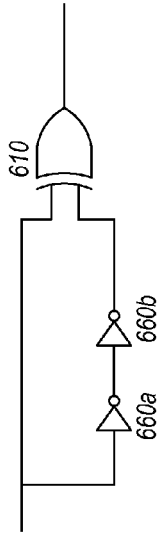
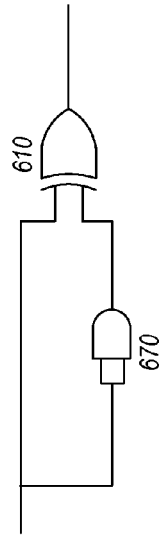
Fig. 6e
Fig. 6f
Fig. 6g
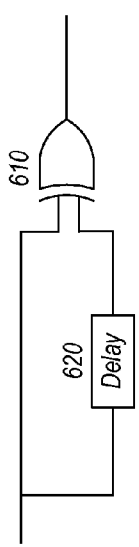
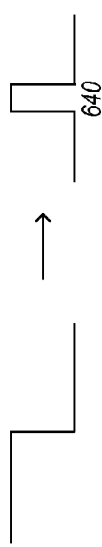
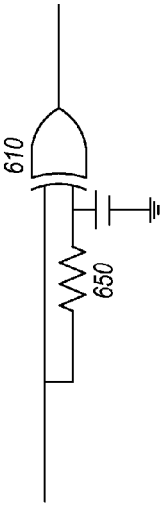
Fig. 6a
Fig. 6b
Fig. 6c
Fig. 6d

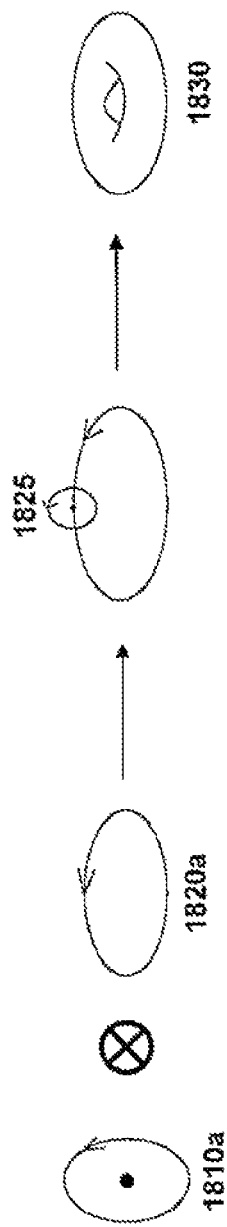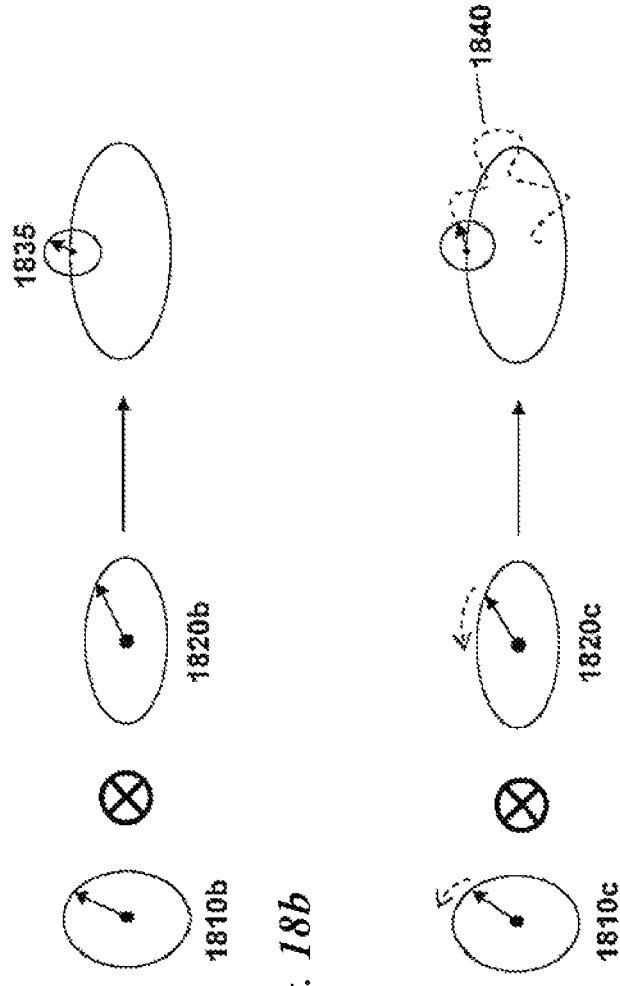
Fig. 18a
Fig. 18b
Fig. 18c

A:B=1:1

A:B=2:1

A:B=3:2

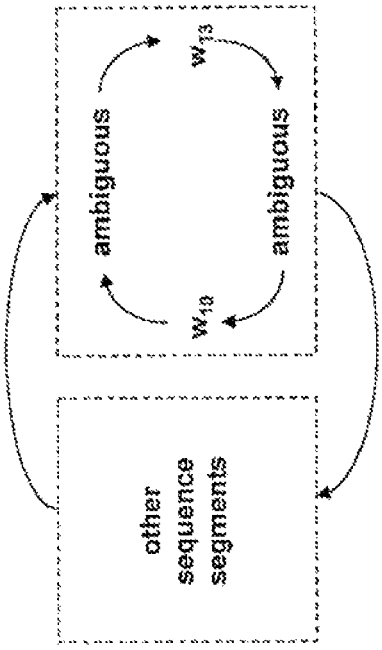
*Fig. 30a* Signature of $\{T_{(a=0)}>T_{(a=1)}, T_{(b=0)}>T_{(b=1)}\}$
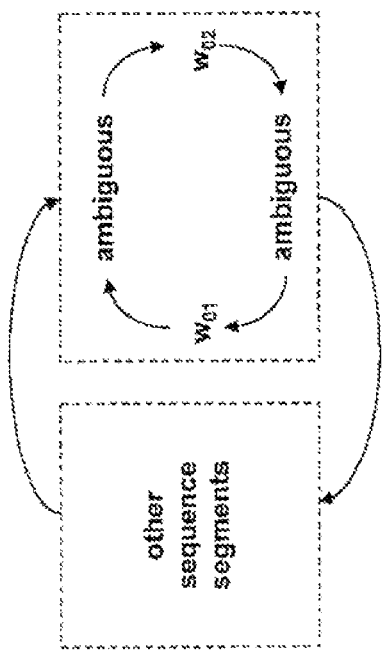
*Fig. 30b* Signature of $\{T_{(a=0)}>T_{(a=1)}, T_{(b=1)}>T_{(b=0)}\}$
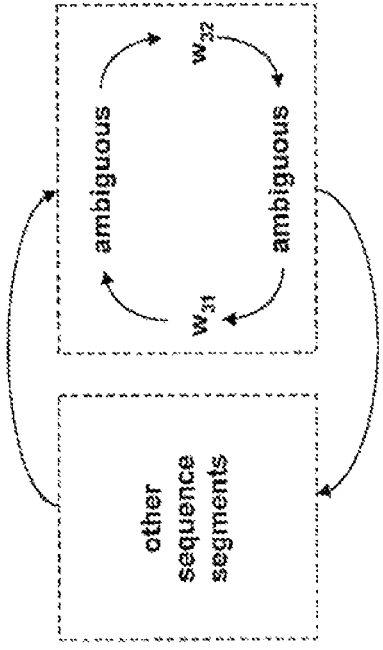
*Fig. 30c* Signature of $\{T_{(a=1)}>T_{(a=0)}, T_{(b=0)}>T_{(b=1)}\}$
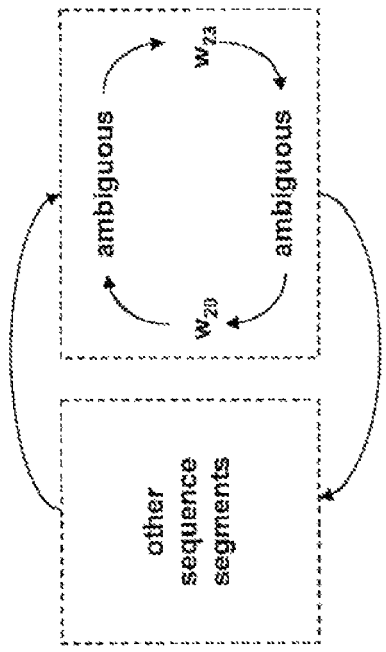
*Fig. 30d* Signature of $\{T_{(a=1)}>T_{(a=0)}, T_{(b=1)}>T_{(b=0)}\}$

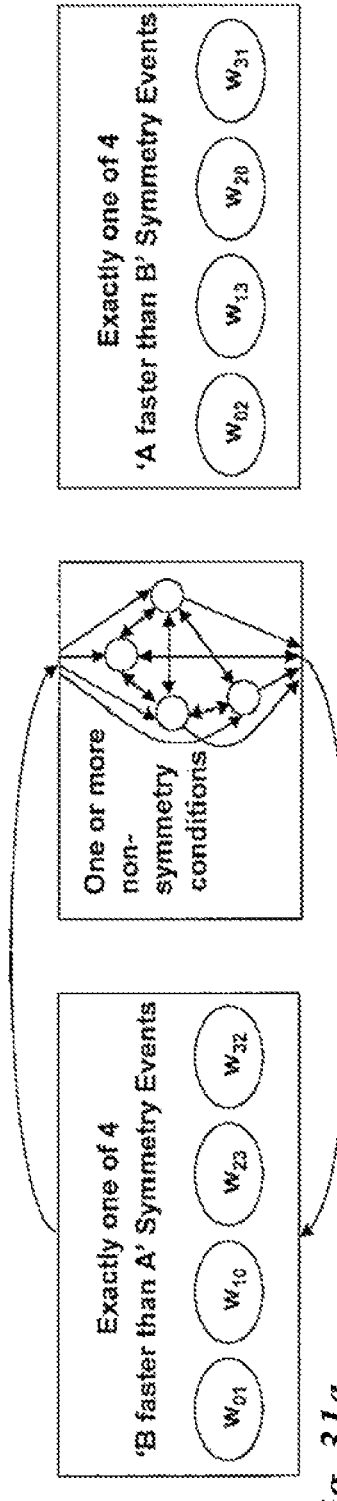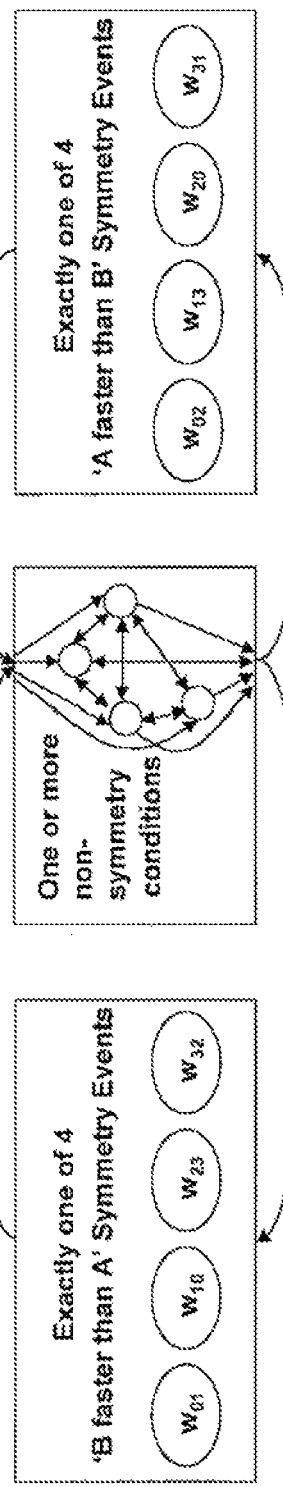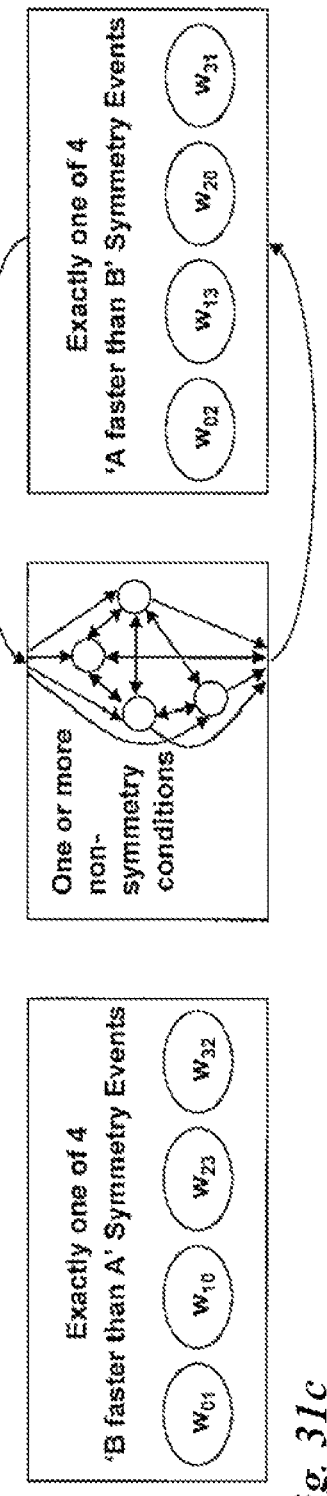
Fig. 31a
Fig. 31b
Fig. 31c

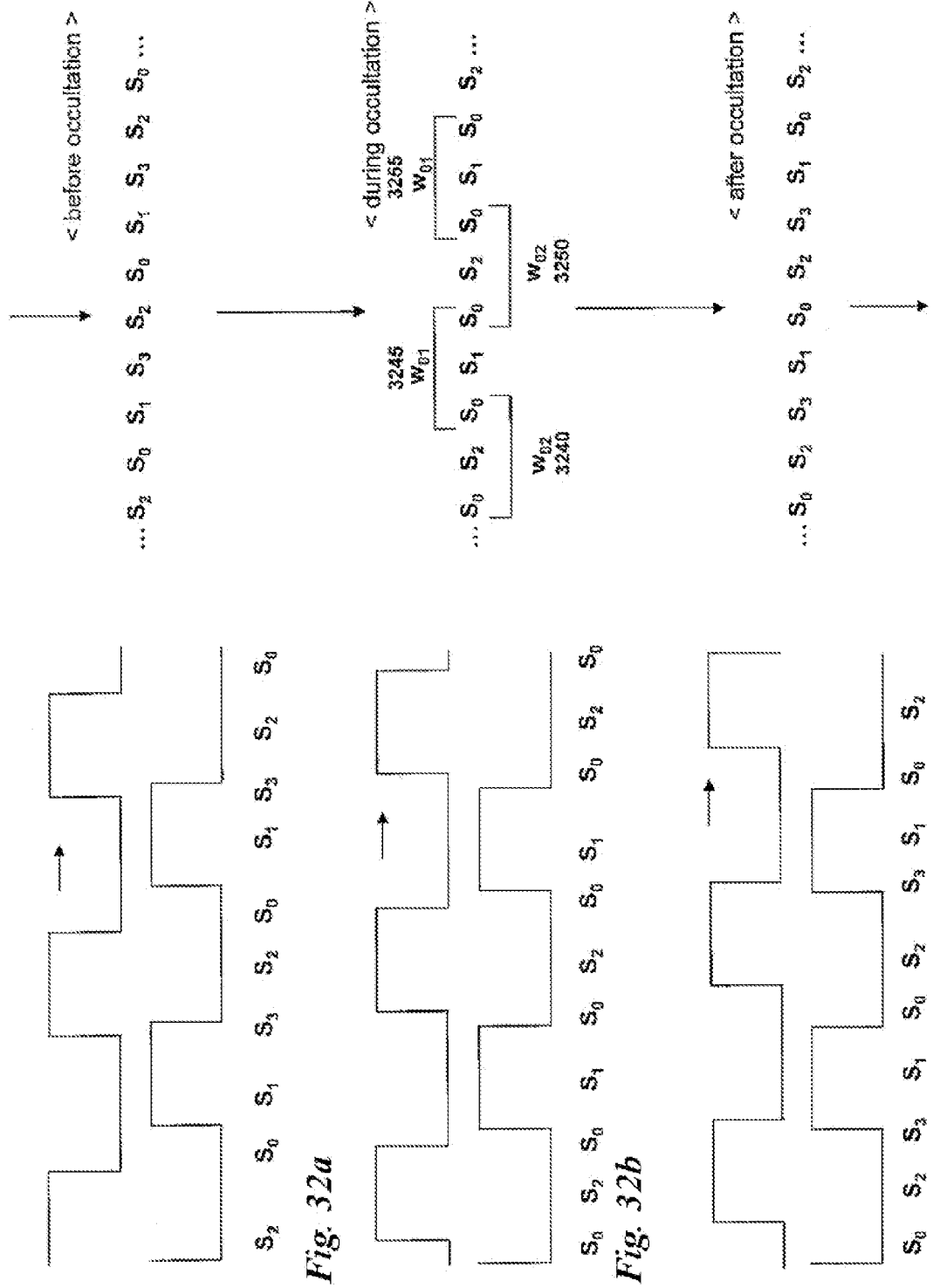

PULSE SIGNAL WAVEFORM ASYMMETRY IDENTIFICATION UTILIZING SYMBOLIC DYNAMICS

CROSS-REFERENCE TO RELATED APPLICATIONS

This application is a continuation of U.S. patent application Ser. No. 11/463,557, now U.S. Pat. No. 7,873,130, filed on Aug. 9, 2006 and issued on Jan. 18, 2011, and pursuant to 35 U.S.C. §119(e), claiming benefit of priority from provisional patent application Ser. No. 60/707,287, filed Aug. 10, 2005, the contents of which are incorporated by reference in their entirety.

BACKGROUND OF THE INVENTION

1. Field of the Invention

The present invention pertains to electronics, algorithms, signal processing, communications systems and computers, and more specifically to frequency comparators, phase comparators, and processes involving symbolic dynamics and quasi-periodic phenomena.

2. Description of the Related Art

Frequency and phase comparators are classic subsystem elements used in a wide variety of applications in communications, signal analysis, and other areas. A number of approaches have been employed or proposed including the use of digital counters, analog integrators, quadrature-phase signal formats provided in parallel, and state machines with state feedback.

SUMMARY OF THE INVENTION

Embodiments of the present invention utilize "enveloping" event phenomena, intrinsic to the dynamics of pairs of square waves or pulse waves waveform signals of different frequencies, to determine which of the pair is of a higher frequency than the other, as well as other types of information. The frequency and duty-cycle of one or both of the waveforms may be modulated in time, allowing many applications, including those in communications and measurement instrumentation. The potential frequency operating range is enormous: the low end is ultimately determined by state memory duration (i.e., waveform period time-scales of up to multiple years) and the high-end is ultimately determined by waveform-transition detection recovery intervals (i.e., waveform period time-scales of down to 2-3 logic gate propagation times).

An enveloping-event detection approach may be used to facilitate at least two new classes of frequency comparator and related functions that are entirely feed-forward in state signal flow, and unlike the related art, do not require digital counters, analog integrators, quadrature-phase signal formats, or state machines with state signal feedback. These approaches work over an extremely wide frequency range. The enveloping-event detection and classification can be done in a number of ways as provided for by embodiments of the invention.

Additionally, embodiments of the present invention may be applied to synchronous motor control and operation, transportation systems, manufacturing or project scheduling, the scheduling of real-time tasks in operating systems, astronomy calculations (including analyses of ancient archaeoastronomy sites), oscillator-coupling phenomena in chaotic and self-organizing systems, geometric lattice design, quantum effects, long-duration timing systems for radioactive waste storage or long-distance space travel, molecular vibration, energy-transfer among inharmonic periodic modes of oscillation, and biological and ecological systems.

In a first class of implementations, square wave enveloping events occurring between pairs of square wave signals may be detected by identifying consecutive opposite transitions in one signal occurring between consecutive opposite transitions of the other signal, and vice versa.

In a second class of implementations, instantaneous values of two square waves may be collectively regarded as a symbol of asynchronous state. Square wave enveloping events are detected by identifying signature symmetries in the resulting sequence of symbols. Realizations of this second class of implementations amount to interpreting the relative values of the two applied square waves as a type of symbolic dynamics to which pattern detection is applied. This class of implementations can be used to provide additional detailed information, such as a course indication of relative phase, for example, utilizing specific symbol sequence signatures that can be detected in real time.

Although these two exemplary classes of implementations involve different philosophies, they share many properties including the ones mentioned above. Either approach may be realized in software, hardware, and combinations thereof. If the provided square waves are not co-synchronized to an underlying clock, they may be sampled periodically for one level of accuracy or performance, or implemented asynchronously with logic circuits and flip-flops at a higher level of accuracy or performance. Sampling rate, race conditions, and transition detection recovery-time facilities that may be utilized in various implementations determine the limits of maximal operational frequency range and minimum measurable frequency difference. In hardware, for example, a typical logic circuit implementation includes two to four flip-flops or two-stage two-bit shift registers and modest combinational logic. The resulting system can thus be readily implemented as a utility integrated circuit of modest "MSI" scale or as a small "IP core" within larger-scale system-on-a-chip realizations.

BRIEF DESCRIPTION OF THE DRAWINGS

The above and other aspects, features, and advantages of the present invention will become more apparent upon consideration of the following description of preferred embodiments, taken in conjunction with the accompanying drawing figures.

FIGS. 1a-1f illustrate event-driven and time-driven symbol sequences as well as conditions determined by state or by transitions between states.

FIGS. 2a-2b illustrate exemplary enveloping events between square wave signals of differing frequencies.

FIG. 2c formalizes aspects of FIGS. 2a-2b, illustrating eight types of symmetry events, their constituent symbols, and associated notations.

FIGS. 3a-3b illustrate additional aspects and notations pertaining to eight types of symmetry events, their constituent symbols, and associated notations.

FIG. 4 illustrates organizations of symmetry events with respect to common inner symbols and common outer symbols, showing these to be equivalent.

FIGS. 5a-5e illustrate various input signal and output signal arrangements pertaining to use of a symbolic processor. Additionally, FIGS. 5d-5e illustrate a more detailed view of the conversion of time-varying signal waveforms to sequences of symbols and subsequent application of these to pattern detection systems or methods.

FIGS. 6a and 6d-6g illustrate various exemplary clock-pulse creation means driven by input waveform transitions.

FIGS. 6b-6c illustrate input/output waveform relationships associated with FIGS. 6a and 6d-6g.

FIGS. 11c-11e show exemplary transformational steps reorganizing the arrangement of FIG. 11b so that it shares the same input structures as that of FIG. 11a.

FIG. 15a illustrates an exemplary algorithmic embodiment of a symbol-based embodiment of the invention, while

FIGS. 18a-18c illustrate how the combined state-space trajectory of a pair of continuous-time/continuous-state oscillators may be viewed as a wrapping trajectory on the surface of a hollow torus.

FIGS. 30a-30d illustrate behavioral signatures of exemplary alternating indications that each of the two exemplary oscillators is faster than the other resulting from asymmetric input waveforms and frequencies sufficiently close together.

FIGS. 31a-31c depict what occurs for waveforms with some asymmetry as the frequency ratio is increased from a value sufficiently lower than unity, through ratios sufficiently close to unity, and then to ratios sufficiently greater than unity.

FIGS. 32a-32c illustrate the evolution of symbol sequences and symmetry events before, during, and after occultations of asymmetric aspects of two exemplary asymmetric input waveforms with frequencies sufficiently close together.

DETAILED DESCRIPTION OF THE PREFERRED EMBODIMENTS

Figure 5A:
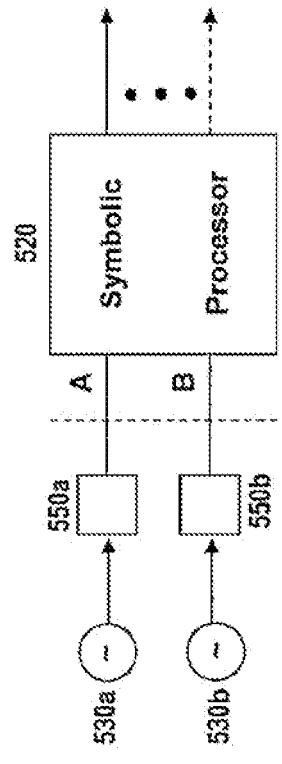

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

Various embodiments of the present invention utilize "enveloping" event phenomena, intrinsic to the dynamics of pairs of square waves of different frequencies, to determine which of the pair is of a higher frequency than the other and potentially other information. In general, the enveloping events may be detected by monitoring the pattern of states or state transitions associated with the pairs of square waves.

State View of the Dynamics of a Square Wave Pair

At a high level, state may be associated with pairs of square waves by treating the instantaneous measured value of the two square waves as a two-component vector. For example, a first square wave signal A and a second square wave signal B may each take on values of 0 or 1 at any particular time (ignoring noise and transition-related transient phenomena). There would be four resulting states, as may be cataloged and named, for instance, by the symbols $S_0$, $S_1$, $S_2$, and $S_3$ as in the exemplary list of Table 1 set forth below:

TABLE 1

| $S_{2A+B}$ = A B |
|---|
| $S_0$ = 0 0 |
| $S_1$ = 0 1 |
| $S_2$ = 1 0 |
| $S_3$ = 1 1 |

This symbol assignment may be given by the following formula:

$$S_{(2a+b)} \qquad \text{(Eq. 1)}$$

where "a" is the instantaneous value of A (i.e., either $\{0,1\}$) and "b" is the instantaneous value of B.

The first square wave signal A and the second square wave signal B typically originate from an exogenous signal source and may be measured in asynchronous (effectively) continuous time or in synchronously-sampled discrete time. Each type of measurement creates a temporal sequence of the symbols $S_0$, $S_1$, $S_2$, and $S_3$.

FIG. 1a shows the case for continuous-time measurement, which produces an "event-driven" sequence of symbols, while FIG. 1b shows the case for synchronously-sampled discrete-time measurement, which produces a "time-driven" sequence of symbols. Referring to FIG. 1a, the graphs of a first square wave signal A 110 and a second square wave signal B 120, each of which is allowed to take on one of two values at any given time, are shown evolving in time, with time increasing from left to right.

In FIG. 1a, first square wave signal A 110 is shown progressing through an "up" transition 111 between a previous "lower" value and a subsequent "higher" value, followed later in time by a "down" transition 112 between the subsequent "higher" value and further subsequent return to the previous "lower" value. This is followed by additional subsequent "up" and "down" transitions. Similarly, the second square wave signal B 120 is shown progressing through "down" transitions 121, 123, an "up" transition 122, as well as additional subsequent transitions. Between each of the transitions 121, 111, 122, 112, 123, etc. the pair of waveforms maintain a fixed state corresponding to one of the symbols $S_0$, $S_1$, $S_2$, and $S_3$, and the state changes to another symbol after the next transition. Thus, any transition (e.g., 121, 111, 122, 112, 123, etc.) of either of the two square wave signals A 110 or B 120 causes a state transition, or symbol transition, event 131, 132, 133, 134, 135, etc. between which the state is held constant.

For example, in FIG. 1a, the state just prior to transition event 131 is $S_1$ (A=0, B=1), the state between transition event 131 and transition event 132 is $S_0$(A=0, B=0), the state between transition event 132 and transition event 133 is $S_2$(A=1, B=0), the state between transition 133 and transition 134 is $S_3$(A=1, B=1), etc. The result is an "event-driven" sequence of symbols $S_0$, $S_1$, $S_2$, $S_3$ ... }.

FIG. 1b shows the case for synchronously-sampled discrete-time measurement, which may produce a "time-driven" sequence of symbols. Here the values of the same first square wave signal A 110 and the same second square wave signal B 120 are periodically measured at individual sample times, denoted by sample times 141-150, and the value of a state measured at one sample time is maintained until the next sample time. Such an arrangement is useful in regular clock-driven signal processing implementations.

In the example of FIG. 1b, the state at sample time 141 is S0, the state at sample time 142 is $S_2$, the state at sample time 143 is $S_3$, etc. Note that the state at the two consecutive sample times 147 and 148 is $S_2$. If the rate of sampling were considerably faster than that depicted, situations where the same state is held for consecutive sample times would frequently occur. By definition, the event-driven symbol sequence cannot have consecutively repeated symbols (since a driving "event" corresponds to a change in state, hence change in symbol). Thus, in general, for the same pair of square waves, an "event-driven" sequence of symbols will typically differ from the "time-driven" sequence of symbols. FIGS. 1e-1f provide a comparison of permissible state transitions among the states represented by symbols $\{S_0, S_1, S_2, S_3 \ldots \}$ for event-driven and time-driven measurements.

Referring ahead to the event-driven case of FIG. 1e, direct transitions between symbol pairs $S_0$ and $S_3$ and between symbol pairs $S_1$ and $S_2$ are forbidden as either would require both square wave signals A 110 and B 120 to change states simultaneously, a physically impossible condition except in pathological cases and even then overruled by circuitry race conditions, as is well known to those skilled in the art of electronic digital circuit design. Also, in the event-driven case of FIG. 1e, each state may transition only to another state, not back into itself; this is because, by definition, if there is no observed state transition there is no new event. Hence no repeated event symbols are possible. Taken together, the forbidden state transitions are those where the current symbol and the immediately previous symbol are either equal (transition back to same state) or complements of one another (both square wave signals A 110 and B 120 change states simultaneously).

In the time-driven case of FIG. 1f, transitions from a state back into itself are not only possible but dominate the time-driven symbol sequence as the sampling rate increases. As is clear to one skilled in the art, however, if the sampling rate is high enough to capture the effect of every transition in each of the pair of square waves (i.e., a sampling rate of at least twice the frequency of the highest-frequency square wave), the resulting time-driven event sequence can be transformed into an approximate event-driven sequence (such as that of FIG. 1a) where the only errors introduced are time-quantization delays. This transformation may be done for example, by omitting any repeated sample values such as 148 in FIG. 1b. Additionally in the time-driven case of FIG. 1f, direct transitions between symbol pairs $S_o$ and $S_3$ and between symbol pairs $S_1$ and $S_2$ are in some circumstances possible, for example:
- if the sampling rate is slow enough (the faster the sampling rate, the less likely this situation will occur);
- if the square wave signals A 110 and B 120 are digitally generated, of frequencies that are ratios of integers, and phase-locked.

These sampling-rate artifact transitions are indicated by the dashed lines in FIG. 1f. Care should be taken to adequately and stably handle cases where the sample time effectively coincides with a transition in one of the waveforms, as with sample time 149.

Whether obtained directly as in FIG. 1a, or derived from a time-driven symbol sequence, the measurements of the two square waves ultimately provide an actual or approximate event-driven symbol sequence. The measurements themselves may be made on the sustained values of the square wave, as called out by the bolded portions 161, 162, 163, 164, 165 of the square wave in FIG. 1c, or may be made on the transitions of the square wave, as called out by the bolded arrows 170, 171, 172, 173, 174, 175 of the square wave in FIG. 1d. For the measurement of sustained values of the square wave, a "low-pass" filter or system for the detection of a repeated value across a plurality of consecutive sample times may be used. For the measurement of the transitions of the square wave, a "high-pass" filter, an edge detector (employing structures such as that of FIGS. 6a-6g, to be discussed later), or a system for the detection of a change in value between consecutive sample times, may be used.

Enveloping Event Phenomena

With these concepts in place, the "enveloping-event" phenomena peculiar to square waves of different frequencies will now be described. FIG. 2a shows again a first square wave signal A 210, here in particular called out as having a lower frequency and thus a longer, wider-spread period compared with that of a second square wave signal B 220. This figure depicts two special events 231, 232 where the second square wave signal B 220 makes both an up transition 233 and a down transition 234 during an interval 235 where the first square wave signal A 210 is unchanged, On either side of these transitions in the second square wave signal B 220, the first square wave signal A 210 makes its up transition 237 and down transition 236. In this sense, an up-down or down-up "pulse" of the second square wave signal B 220 is enveloped by an up-down or down-up "pulse" of the first square wave signal A 210, and this can clearly only occur if the frequency of B is higher than the frequency of A.

If the frequency of B is sufficiently higher than that depicted in FIG. 2a, even more transitions of the second square wave signal 220 would be enveloped within an up-down or down-up "pulse" of the first square wave signal 210. An example of this can be found in FIG. 2b, where several transitions 254, 255, 256, 257 of the square wave signal $A_2$ 253 are enveloped by an up-down "pulse" 258 of the square wave signal 252. Thus, a sufficient condition for a first square wave to have a lower frequency than a second square wave is for there to be at least one consecutive pair of "up" and "down" transitions of the second square wave between a consecutive pair of "up" and "down" transitions of the first square wave. This condition will be referred to as an "enveloping event."

FIG. 2a illustrates two exemplary enveloping events, namely enveloping 1 231 and enveloping event 2 232. As an example, eight types of enveloping events may occur, and these will be discussed in conjunction with FIG. 2c, after the following remarks.

First, although an enveloping event is sufficient for one square wave to be determined as having a higher or lower frequency than another, it is not a necessary condition. For example, if two square waves of different frequencies are phase-locked, there may be many classes of conditions where enveloping events cannot occur. Similarly, if two square waves are sufficiently close in frequency (for example, originating from two cesium clocks), the two square waves are effectively phase-locked for the probable application interval (or lifetime) of the system. However, in many applications the two square waves are from separate sources and conditions that are not phase-locked and at frequencies sufficiently different so that enveloping events naturally and regularly occur. Further, in typical phase-locked applications, enveloping events can be selectively created or prevented using frequency-shift and phase-shift modulation. Such applications are generally used in communications systems.

Second, the enveloping events can be detectable over a wide range of frequencies. The limiting case is where the frequencies of two square waves are very close. Referring to FIG. 2b, if the frequencies of the two square waves $A_1$ 251 and 252 are very close, the detection arrangement must be able to resolve narrow widths 250a, 250b of the enveloping of square wave B 252 by square wave $A_1$ 251. Also, more frequently than not widths 250a, 250b of enveloping will be asymmetric and at times considerably so, thus requiring even higher performance in resolving narrow-widths of enveloping 250a, 250b.

Third, for full range of operation, the arrangement for detecting enveloping events must strictly determine that both square waves have separately completed their consecutive pair of "up" and "down" transitions, Simply detecting that a first square wave has had a consecutive pair of "up" and "down" transitions with the value of a second square wave having the same value, as might be attempted in simple implementations involving edge-triggered D flip flops, will provide one or more false results. As an example of such a false result, note that both square wave $A_1$ 251 and $A_2$ 253 have the same value on the square wave B 252 up transition 259 as they do on the subsequent square wave B 252 down transition 260; however, clearly the frequency of square wave $A_1$ 251 is less than the frequency of square wave B 252 while square wave $A_2$ 253 has frequency greater than the frequency of square wave B 252.

Fourth, it is noted that the approach described thus far can be sensitive to square wave asymmetry. At least some enveloping event conditions can be violated if pulse widths are not 50%, and enveloping events can be falsely generated if duty-cycles are extreme with respect to the difference in periods of the two waveforms. This is a condition that is endemic to frequency measurements where square waves are needed, and a common solution is to preprocess each original square wave with a toggle flip-flop frequency divider as described in, for example, the work entitled *CMOS Cookbook*, Second Edition, by Don Lancaster, revised by Howard Berlin, published by Newnes and Howard Sams, Inc., Boston, pp. 276-277 (1988).

Finally, note that if a first square wave has a lower frequency than a second square wave, the transitions of the second square wave typically happen at a faster rate than the transitions of the first square wave. In subsequent discussions this is a useful dominating concept, so the terminology "X faster than Y" will be useful as a name for the condition where the frequency of a square wave X is higher than the frequency of a square wave Y.

Enveloping Events as Symmetry Events in Consecutive States and Some of Their Properties FIG. 2c depicts eight types of enveloping events. Enveloping may be with either of the square waves having a given or opposite polarity, giving four types of events. Either square wave may be the "faster" (higher frequency) wave, giving two cases for these four types, or eight cases altogether.

Of value in both cataloging these and in subsequent analysis, it is useful to characterize the cases using the state symbols $S_0$, $S_1$, $S_2$, and $S_3$ introduced earlier. The result in so doing is the following:

Cases where B is faster than A:

| | |
|---|---|
| $S_2S_3S_2$ | 275a |
| $S_3S_2S_3$ | 275b |
| $S_0S_1S0$ | 275d |
| $S_1S_0S_1$ | 275d |

Cases where A is faster than B:

| | |
|---|---|
| $S_1S_3S_1$ | 276a |
| $S_3S_1S_3$ | 276b |
| $S_0S_2S_0$ | 276c |
| $S_2S_0S2$ | 276d |

Thus the "signature" of one square wave having a faster rate (higher frequency) than another are "symmetry events" of the form:

$$S_pS_qS_p \quad \text{(Eq. 2)}$$

as indeed it is simply impossible for two square waves of the same frequency to have these symmetric symbol sequences.

FIG. 3a summarizes the findings of FIG. 2c in a state-oriented form 310a-310d and 330a-330d, rearranging the ordering to index the outer symbols in ascending order. The state is also indicated in vector form 320a-320d and 340a-340d, representing separate samples, 2-bit words in a shift register, etc. It is equally viable to represent the findings of FIG. 2c in a transition-oriented form, indicating which square wave has enveloping transitions, in which order these transitions occur, and what value the other square wave maintains throughout the enveloping event. Further, it is useful to more concisely name each of the eight symmetry events with a "symmetry event symbol"; for example, using the notation:

$$W_{pq}=S_pS_qS_p \quad \text{(Eq. 3)}$$

FIG. 3b consolidates this notation, the results of FIG. 3a, and a representation of transition-oriented forms into a single table. As an example, this representation of transition-oriented forms may be rendered according to the following rules:

The faster square wave is represented with a pair of directionally-explicit transition arrows (e.g. 360a-360b) reflecting their consecutive order of occurrence in the enveloping event.

The slower square wave is represented with a horizontal line. This horizontal line is drawn above (e.g. 365a) the pair of transition arrows if the slower square wave maintains a high value throughout the transition event, and is drawn below (e.g. 365b) the pair of transition arrows if the slower square wave maintains a low value throughout the transition event.

The named source of each square wave (i.e., A or B) is written to the left of its representation (e.g. 370a-370b).

FIG. 3b shows there are a number of striking structural relationships exhibited, suggestive of possible underlying permutation group phenomena and worthy of further study. Some of the structural relationships may be of value in various implementations, allowing in some situations useful "don't care" simplifications in combinational logic Karnough maps, algorithm design, and the like, Independent of implementation, however, FIG. 4 draws attention to two particular views of exhibited structural relationships and reveals yet more, perhaps unexpected, inherent structure. The left table 401 is organized with common center symbol 405 indexed in increasing order and listing the rate-distinguishing outer symbols 410, 415 which indicate which of the two square waves is faster. The right table 402 is organized exactly oppositely with the outer symbols 420 indexed in increasing order and listing the rate-distinguishing common center symbol 425, 430 which indicate which of the two square waves is faster. In fact, the two tables have exactly the same entries. Further, the two rate-distinguishing columns 410, 415 and 425, 430 in both tables are, reading from top to bottom, in retrograde (i.e., of opposite order).

Some further structural analysis will also be useful. First of all, and by way of non-limiting example, exclusive pairings are noted in the formation of symmetry events:

For B faster than A:
$S_0$ is always paired with $S_1$
$S_2$ is always paired With $S_3$
For A faster than B:
$S_0$ is always paired with $S_2$
$S_1$ is always paired with $S_3$.

Next, in each of the frequency comparison cases "B faster than A" and "A faster than B," each of the symmetry events has a unique "complement" (i.e., all 0's and 1's exchanged) within the same frequency comparison case:

For B faster than A:
$W_{01}=W_{32}^*$
$W_{10}=W_{23}^*$
$W_{23}=W_{10}^*$
$W_{32}=W_{01}^*$
For A faster than B:
$W_{02}=W_{31}^*$
$W_{13}=W_{20}^*$
$W_{20}=W_{13}^*$
$W_{31}=W_{02}^*$ This is due to the fact that enveloping events occur with either polarity. Note in all cases that:

$$W_{pq}=W_{(3-p)(3-q)}^* \quad \text{(Eq. 4)}$$

in part due to the way the symbols $\{S_0, S_1, S_2, S_3 \ldots\}$ have been indexed by the following formula:

$$S_{(2a+b)}. \quad \text{(Eq. 5)}$$

In a state-oriented implementation, the sequence of measured symbols may be examined for the occurrence of eight possible symmetry event symbols so as to determine which square wave signal is faster (i.e., has the higher frequency). For an event-driven sequence (i.e., one precluding immediate symbol transitions back into themselves) a symmetry event may be detected by comparing the current symbol value to the symbol value that is two events in the past: if they are identical, a symmetry event has just occurred. Once a symmetry event has been detected, it may be classified as a particular one of eight possible symmetry event symbols based on the values of the current symbol and immediately preceding symbol, following from the definitions of the symmetry event symbols $W_{pq}$ shown in the following Table 2:

TABLE 2

| $S_{current}$ | | $S_{previous}$ | | Symmetry-Event symbol | Frequency Relationship |
| --- | --- | --- | --- | --- | --- |
| A | B | A | B | | |
| 0 | 0 | 0 | 0 | | |
| 0 | 0 | 0 | 1 | $W_{01}$ | B faster than A |
| 0 | 0 | 1 | 0 | $W_{02}$ | A faster than B |
| 0 | 0 | 1 | 1 | | |
| 0 | 1 | 0 | 0 | $W_{10}$ | B faster than A |
| 0 | 1 | 0 | 1 | | |
| 0 | 1 | 1 | 0 | | |
| 0 | 1 | 1 | 1 | $W_{13}$ | A faster than B |
| 1 | 0 | 0 | 0 | $W_{20}$ | A faster than B |
| 1 | 0 | 0 | 1 | | |
| 1 | 0 | 1 | 0 | | |
| 1 | 0 | 1 | 1 | $W_{23}$ | B faster than A |
| 1 | 1 | 0 | 0 | | |
| 1 | 1 | 0 | 1 | $W_{31}$ | A faster than B |
| 1 | 1 | 1 | 0 | $W_{32}$ | B faster than A |
| 1 | 1 | 1 | 1 | | |

Reorganization of columns (by partitioning each symbol into its A and B components and arranging like components in adjacent columns) yields a periodic clustering such as that presented in Table 3 below:

TABLE 3

| $S_{current}$ A | $S_{current}$ B | $S_{previous}$ A | $S_{previous}$ B | Symmetry-Event symbol | Frequency Relationship |
| --- | --- | --- | --- | --- | --- |
| 0 | 0 | 0 | 0 | | |
| 0 | 0 | 0 | 1 | $W_{01}$ | B faster than A |
| 0 | 0 | 1 | 0 | $W_{10}$ | B faster than A |
| 0 | 0 | 1 | 1 | | |
| 0 | 1 | 0 | 0 | $W_{02}$ | A faster than B |
| 0 | 1 | 0 | 1 | | |
| 0 | 1 | 1 | 0 | | |
| 0 | 1 | 1 | 1 | $W_{13}$ | A faster than B |
| 1 | 0 | 0 | 0 | $W_{20}$ | A faster than B |
| 1 | 0 | 0 | 1 | | |
| 1 | 0 | 1 | 0 | | |
| 1 | 0 | 1 | 1 | $W_{31}$ | A faster than B |
| 1 | 1 | 0 | 0 | | |
| 1 | 1 | 0 | 1 | $W_{23}$ | B faster than A |
| 1 | 1 | 1 | 0 | $W_{32}$ | B faster than A |
| 1 | 1 | 1 | 1 | | |

The approach will be used directly to construct an exemplary state-oriented implementation of a frequency comparator and, after later discussion, detection of waveform asymmetries. In the two tables above, note that the remaining eight of the sixteen possible conditions are not recognized as a symmetry event. Each of these unrecognized cases correspond to the previously described forbidden state transitions where the current symbol and the immediately previous symbol are either equal (transition back to the same state) or complements of one another (both square wave signals A and B change state simultaneously).

Both interesting and useful additional theory can be developed for these and further structural observations, for example,
further algebraic relationships,
topological and geometric representations,
connections to formal established symbolic dynamics theory, and
other phenomena with unique sequence phrase "signatures."

The discussion will return to these observations for further aspects of the invention. For the present, discussion is next directed toward applying the analysis developed thus far to exemplary implementations and applications of frequency comparison.

Exemplary Implementations

Two implementations will now be considered. First, exemplary symbol-based approaches are presented, and then exemplary transition-based approaches will be presented. These implementations form a foundation readily extensible to implementing additional aspects of the invention involving the aforementioned additional theory and further structural observations. Before beginning, attention is directed to the acceptance and handling of various types of input signals.

A general setting for signals directed to general implementations of the invention is illustrated in FIG. 5a. Here two sources of binary-valued rectangular waveform signals 510a-510b (i.e., binary-valued symmetric square waves, or pulse waveforms with a duty-cycle other than 50%) are presented as input signals to a state machine or other electrical, algorithmic, computational, optical, mechanical, chemical, biological, or ecological system 520 configured to operate as a symbolic processor. These input signals may, for an applicable duration of time, be fixed-periodic signals, time-modulated signals, frequency-modulated signals, and the like. The symbolic processor is shown producing one or more output signals.

Figures 2, 5B:
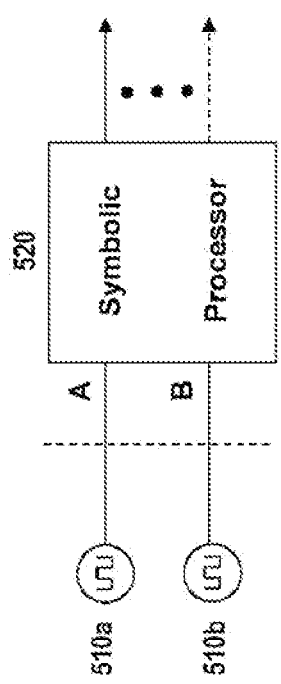
Figures 1, 5B:
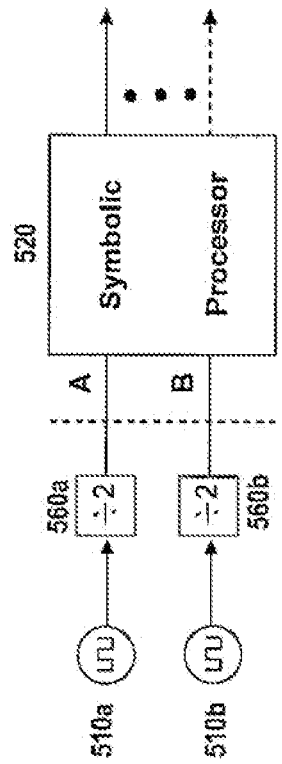

In many situations input signals presented to the symbolic processor may comprise waveform types other than binary-valued rectangular waveform signals. FIG. 5b-1 illustrates one approach for handling this situation wherein these alternate types of input waveforms 530a, 530b are first provided to preprocessing operations 550a, 550b that convert these alternate types of waveforms 530a, 530b into the binary-valued rectangular waveform signals assumed in FIG. 5a. These pre-processing operations 550a, 550b may, for example, comprise one or more of the following:
level-quantizing or comparator operations,
symbol recognition or conversion,
event recognition,
multiple-input signal aggregation, and
intra-media signal transduction.

In other implementations, input signals 530a, 530b comprising types of waveforms other than the binary-valued rectangular waveforms may be such that the waveforms themselves possess other types of symbolic attributes intrinsically recognized by a corresponding specialized implementation of a symbolic processor. FIG. 5b-2 depicts such an embodiment wherein input signals 530a-530b are applied directly to a corresponding type of symbolic processor 540.

Figure 5C:
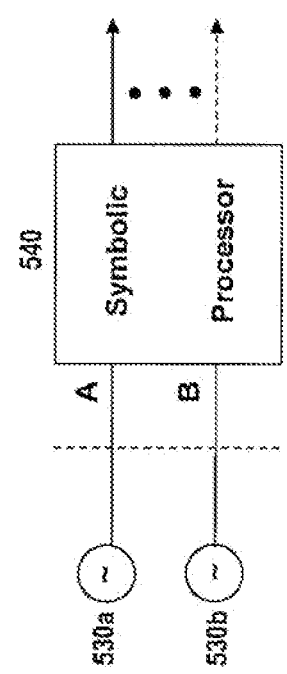

In many situations where the input signals are indeed binary-valued pulse waveforms, these waveforms may not be 50% duty-cycle square waves. In fact in most real-life systems and situations, what appear to be completely symmetric square waves reveal upon close inspection a duty-cycle slightly different than 50%. This may be the result of slight system instabilities, non-ideal system characteristics, slight system operational errors, etc. In other situations there may be deliberate variations in signal pulse width, As will be discussed later, duty-cycles other than 50% can introduce additional effects and more complex behavior, requiring more careful treatment as pulse width deviates for waveforms of frequencies sufficiently close together. However, input binary-valued rectangular waveforms with duty-cycles other than 50% signals may be successfully applied to a symbolic processor 520 designed for more precisely-symmetric square waves by preprocessing both signals by edge-triggered (toggle flip-flop) frequency dividers. This technique can be used to create symmetric square waves from only the rising or only the falling edge of the original binary-valued input signal waveforms. The applied signals are lower in frequency but retain many key properties, in particular the condition as to which input signal frequency is higher. This arrangement is depicted in FIG. 5c with input signals 560a, 560b. Additionally, this technique may be applied any number of times to reduce ultra-fast original signals (as may arise from measurements).

Symbol-Based Embodiments

FIG. 5d illustrates a high-level view of an exemplary class of symbol-based embodiments. Two square waves 570a, 570b are presented to a system or method 501 for interpretation as (or transformation to) a sequence of symbols 502. This sequence of symbols 502 may be presented to a pattern detection system or method 503 to produce one or more output signals, flags, or conditions 590. This class of symbol-based approaches is a special case of the arrangement of FIG. 5e in which a plurality of signals 580a-580n, each at a given moment talking one of a plurality of values, and which may or may not be relatively periodic, are applied to a system or method 511 for interpretation as (or transformation to) a sequence of symbols 512 which are presented to a pattern detection system or method 513 to produce one or more output signals, flags, or conditions 595.

Referring again to FIG. 5d, the system or method 501 may be an asynchronous logic circuit, a synchronous sampling system, a preceding algorithm, etc. In the case where the system or method 501 is implemented as a synchronous sampling system, transformations to an event-driven sequence, such as those described earlier, may be employed to create sequence of symbols 502. Typically, such a realization will automatically provide delineation between individual symbols within sequence 502. If it does not, or in the case of an asynchronous logic circuit or other asynchronous environment, such delineation between individual symbols must generally be synthesized or derived.

There are a number of ways in which clock signals can be derived from transitions of a given square wave signal. The simplest of these involves capacitive-coupling, as is well known to those skilled in the art; an example of this will be employed later in the circuit depicted in FIGS. 12a-12b, as will be discussed in more detail below.

A capacitive-coupling approach has frequency-range limitations, so FIGS. 6a-6g illustrate additional ways in which clock signals can be derived from transitions of a given square wave signal. FIG. 6a shows a configuration comprising exclusive-OR gate 610 and time delay element 620. When the input to this circuit experiences a logical value transition, the inputs to the exclusive-OR gate are briefly of different logical values. As shown in FIGS. 6b and 6c, this produces a pulse 630, 640 comprising a width in time nearly that of the delay element 620 of FIG. 6a. This approach may be implemented in electronics, or within an algorithm utilizing, for example, a delay operation and conditional test within a running loop.

FIG. 6d shows the time delay realized by an analog RC circuit 650. The pulse width created here is determined by the RC-time constant and the logic threshold of the exclusive-OR gate. FIG. 6e shows the time delay realized by a pair of inverters 660a, 660b. The pulse width created here is approximately two gate propagation times. FIG. 6f shows the time delay realized by a single positive-logic gate 670. An AND gate is shown in FIG. 6f, but other types of gates may be used. The inputs are shown jointly connected, but as appropriate for the type of logic gate used one input may alternatively be tied high or low. The pulse width created here is approximately a single gate propagation time.

FIG. 6g illustrates an exemplary way of generating complementary pulses with essentially identical wavefronts and durations to minimize race conditions. Here, the delay implementation of FIG. 6e is used. The FIG. 6g implementation includes inverters 660a, 660b, but this arrangement can readily be replaced by other delay implementations, such as those depicted in FIGS. 6a, 6d, 6f, and the like. The transition pulse produced is simultaneously applied to two symmetric-implementation Exclusive OR gates 615a, 615b. A first of these two Exclusive OR gates 615b has its second input tied high, producing a logically identical transition pulse delayed by the Exclusive OR gate propagation time, while the second input of the other Exclusive OR gate 615a is tied low, producing a logically-inverted transition pulse also delayed by the (typically nearly identical) Exclusive OR gate propagation time. The resulting pair of complementary pulses, with nearly identical wavefronts and durations, is of importance in some approaches to symbol transition detection implementation.

The acceptance and handling of various types of input signals thus addressed, attention is now directed to exemplary symbol-based embodiments.

Figure 7:
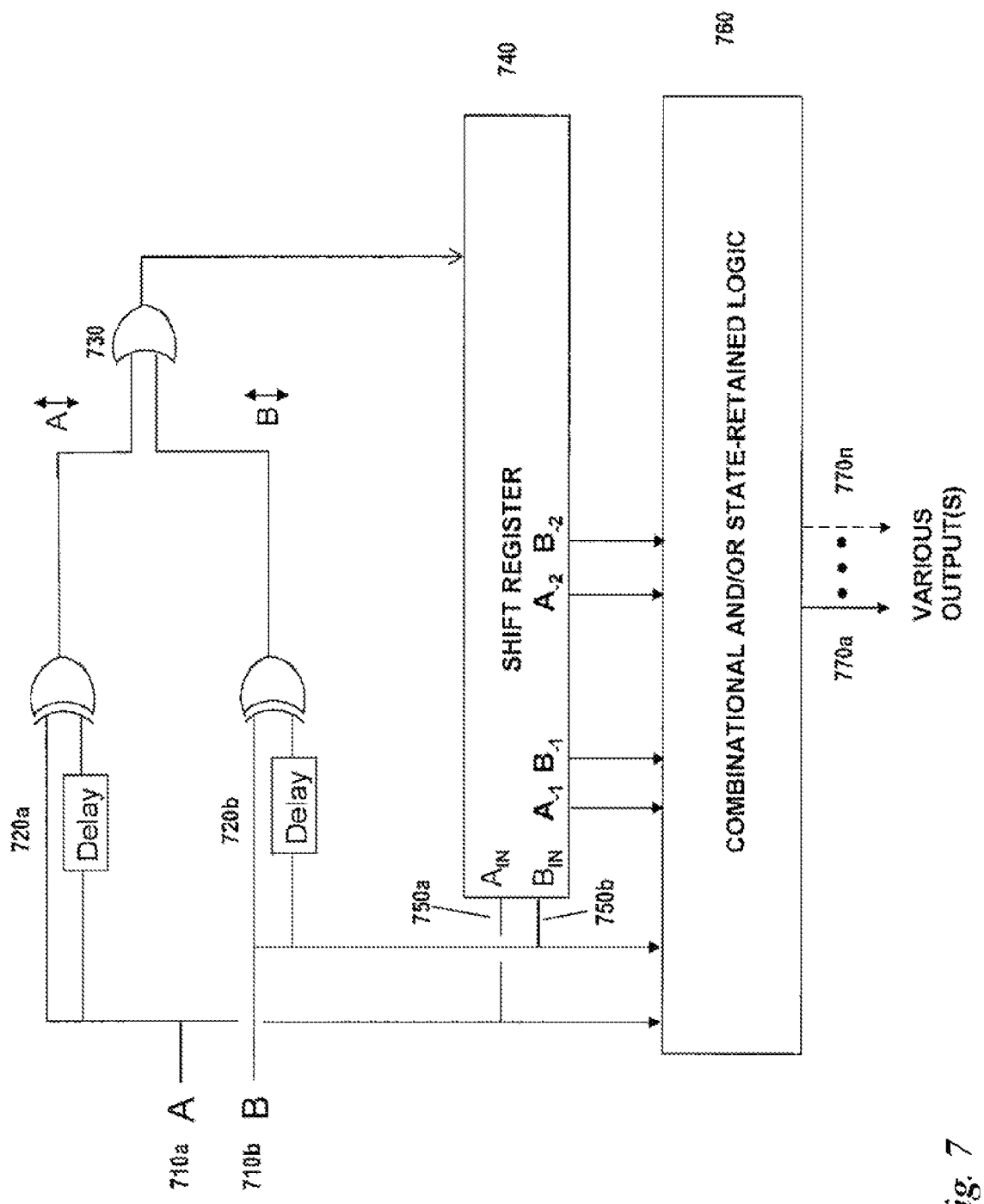
FIG. 7 illustrates an exemplary approach to a symbol-based embodiment of the invention.

FIG. 7 depicts an exemplary symbol-based embodiment based upon the example of FIG. 5d. Each of the two square wave input signals (A 710a and B 710b) is provided with a dedicated transition detector circuit 720a, 720b (e.g., FIG. 6a), and the resulting transition detection pulses are combined (here by a subsequent OR gate 730) to create a "new-symbol-event" clock pulse. This clock pulse is used to clock a 2-bit-wide shift register 740, to which the square waves are applied. Note that the 2-bit-wide shift register 740 driven by the combined transition detection pulses is used rather than two separately clocked 1-bit shift registers. This is in accordance with the third remark in the previous noted remark list.

The delay used in the two dedicated transition detector circuits 720a, 720b is sufficient for the shift register to adequately perform shift operations. The combination of these delays and the combining logic gate 730 create typically more than a two gate propagation time delay between the arrival of a square wave transition at the shift register input and the subsequent arrival of the clock pulse. This allows for a clean clocked capture operation at the shift register inputs 750a, 750b. The result is an event-driven symbol sequence whose most recent three symbols in the sequence are available for subsequent pattern detection. The instantaneous square waves, or their equivalents, together with their values at one and two clock pulses in the past, are presented to a pattern detection circuit 760. The pattern detection circuit may include at least combinational logic (and perhaps state-retained logic comprising elements such as flip-flops, additional shift registers, etc.), resulting in one or more outputs 770a-770n derived from pattern detection operations.

FIGS. 8a-8d show an exemplary demonstration circuit based on the principles described so far, and may be constructed from standard low-level logic TTL and CMOS chip families. Additional design transformations and considerations have been included regarding the opportune use of spare gates available in multiple-gate chip packages, adequate clock time needed for operation of the co-clocked pair of shift-registers, and the like. Alternatively, ASIC/PAL cells may be employed.

Figure 8A:
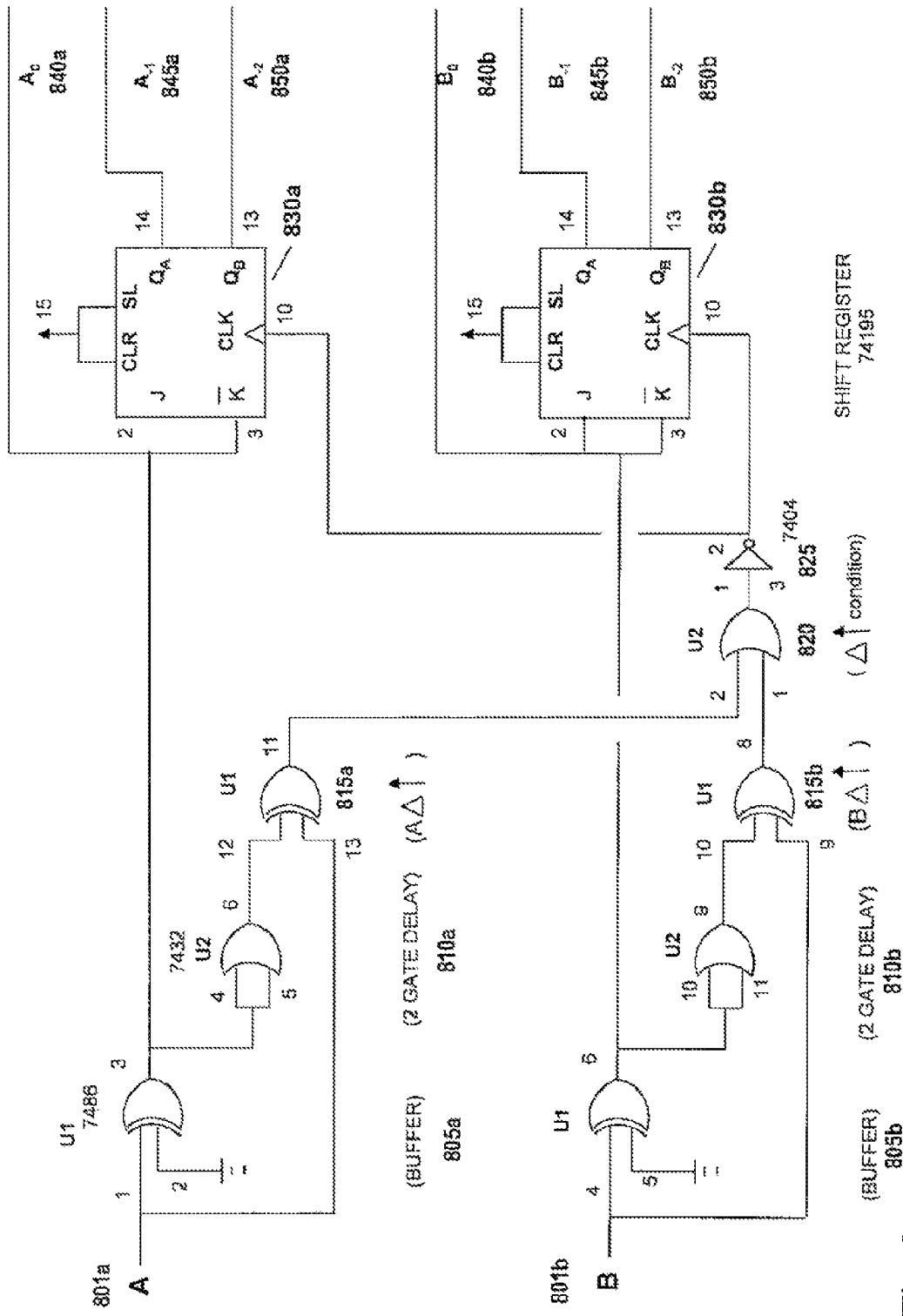
FIGS. 8a-8d illustrate an exemplary approach to a symbol-based embodiment of the invention. LED indicators are provided to indicate various operating conditions, states, and obtained results.

In FIG. 8a, each input 801a-801b is buffered using buffers 805a and 805b, respectively, to produce a well-defined internal signal which is then directed to transition detectors 810a and 810b, respectively, of the style depicted in FIG. 6a. This arrangement is similar to that of FIG. 6f, but instead utilizes spare Exclusive-OR gates 815a and 815b, respectively, as delay elements 620 (FIG. 6a) rather than the AND gate 670 (FIG. 6f).

The transition detections are directed to a logic OR operation 820 which after inversion 825 is suitable to clock a pair of 74195-series (TTL or CMOS) shift registers 830a, 830b. One shift register 830a is configured to store the past two values (with respect to symbol event changes) of input A 801a, while the other shift register 830b is configured to store the past two values (with respect to symbol event changes) of input B 801b. The current values of inputs A 801a and B 801b, respectively notated $A_0$ 840a and $B_0$ 840b, as well as their most recent earlier value, respectively notated $A_{-1}$ 845a and $B_{-1}$ 845b, as well as their next previous earlier value, respectively notated $A_{-2}$ 850a and $B_{-2}$ 850b, provide signals applicable to determining the presence and type of symmetry event that may be present at any given instant.

Figure 8B:
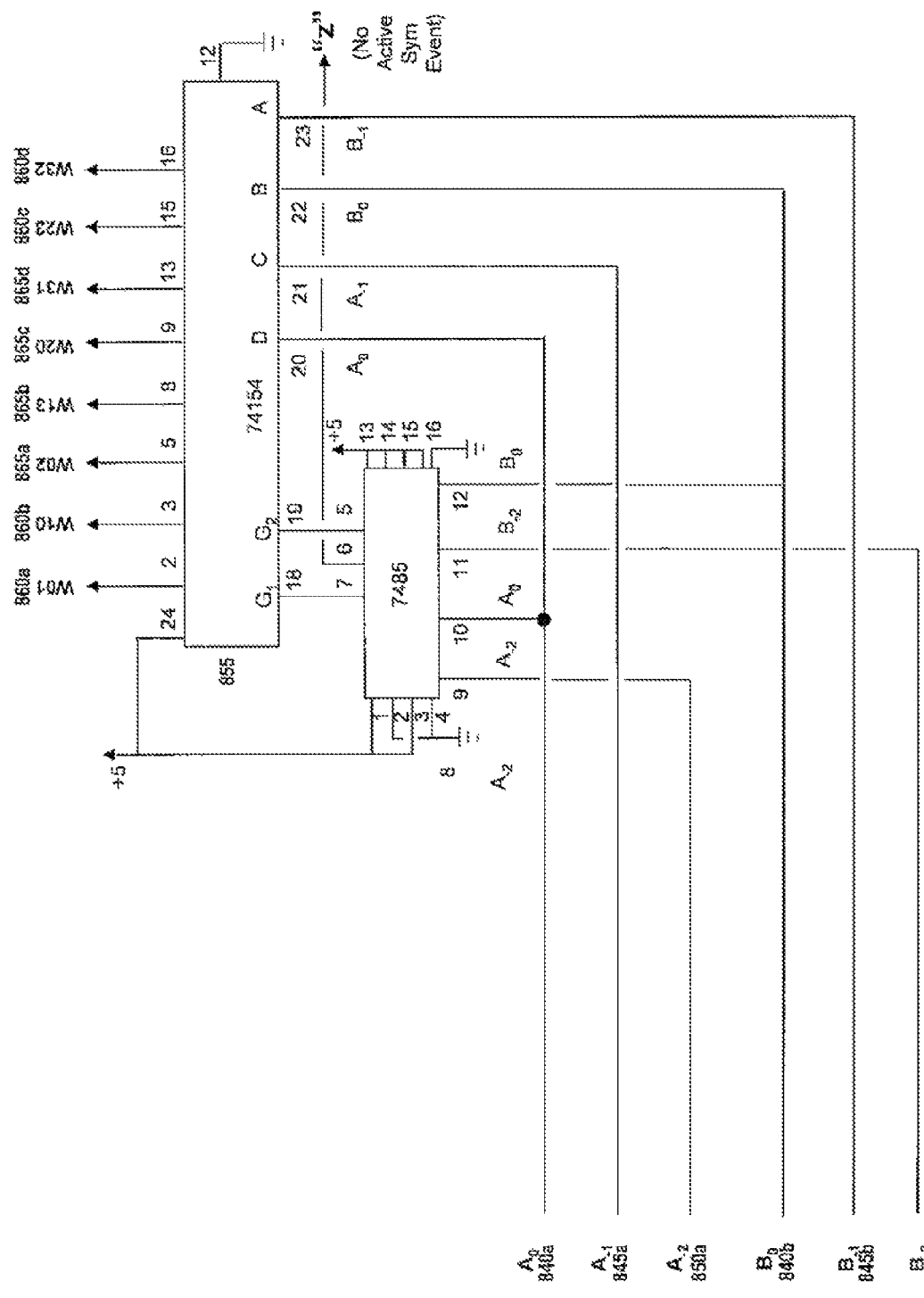

These six signals 840a-840b, 845a-845b, and 850a-850b are directed to the exemplary circuit of FIG. 8b. Here, for the sake of simplicity in discrete logic chip realization, symmetry-events are detected by a magnitude comparator, and full-range primitive pattern detection is performed by selected outputs of a de-multiplexer chip 855 (many alternative arrangements are also possible as is clear to one skilled in the at of basic logic circuit design). Also for the sake of simplicity in discrete logic chip realization, otherwise needed logic gates have subsequently been saved by employing the "a>b" and "b<a" outputs of the magnitude comparator "NOR-ed" together by the negative-logic enable pins of the de-multiplexer 855 to equivalently perform the simple operation of enabling the de-multiplexer on detection of a symmetry event. Many other arrangements are also possible, as is clear to one skilled in the art of basic logic circuit design.

Further as to FIG. 8b, the sixteen outputs of the 4-bit 74154 series (TTL or CMOS) de-multiplexer identify the four "A faster than B" 865a-865d and four "B faster than A" 860a-860d conditions. The remaining eight outputs corresponding to forbidden combinations are therefore not used here. Logic operations, such as OR-ing of the four "A faster than B" conditions to create a single "A faster than B" output, OR-ing of the four "B faster than A" conditions to create a single "B faster than A" output, and the like, can be performed. Of these, some of the eight viable symmetry event conditions can be omitted in trade-offs of circuit complexity and speed versus system performance requirements. In appropriate contexts, the inversion of the symmetry event detection signal may be interpreted and used as indication of "No Symmetry Event" conditions (alternatively interpreted as "Ambiguity" conditions), as may logical operations on derived "A faster than B" and "B faster than A" indications.

Figure 8C:
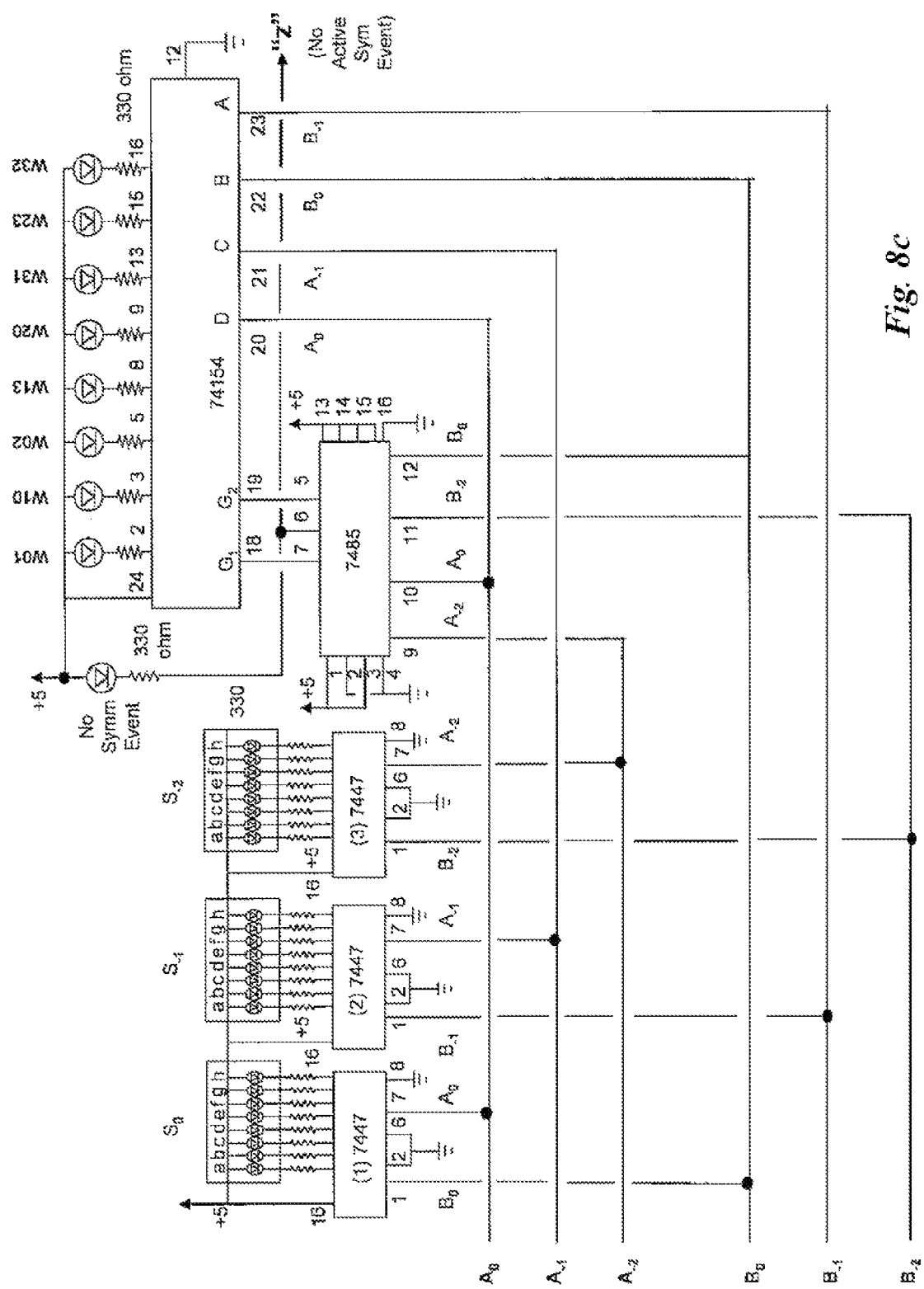

FIG. 8c illustrates an adaptation of the circuit of FIG. 8b featuring the addition of a number of status-indication LEDs and symbol-indication 7-segment displays to enhance the study and more explicitly demonstrate operational principles of various embodiments disclosed herein. The status-indication LEDs provided here include individual notice of the eight symmetry events $\{W_{01}, W_{02}, W_{10}, W_{13}, W_{20}, W_{23}, W_{31}, W_{32}\}$, as well as indication of "No Symmetry Event" conditions (alternatively, "Ambiguity" conditions).

The various signals produced by the exemplary circuits of FIG. 8b or 8c, or their equivalents, may be further processed to obtain more general or other derived information. For example, all four symmetry event detection output signals associated with the "A faster than B" condition $\{W_{02}, W_{13}, W_{20}, W_{31}\}$ may be directed to a logical OR operation to create a general overall indication of "A faster than B," and similarly all four symmetry event detection output signals associated with the "B faster than A" condition $\{W_{01}, W_{10}, W_{23}, W_{32}\}$ may be directed to a logical OR operation to create a general overall indication of "B faster than A." As another example, SR latches or other storage methods may be used to retain results until a subsequent symmetry event detection.

Figure 8D:
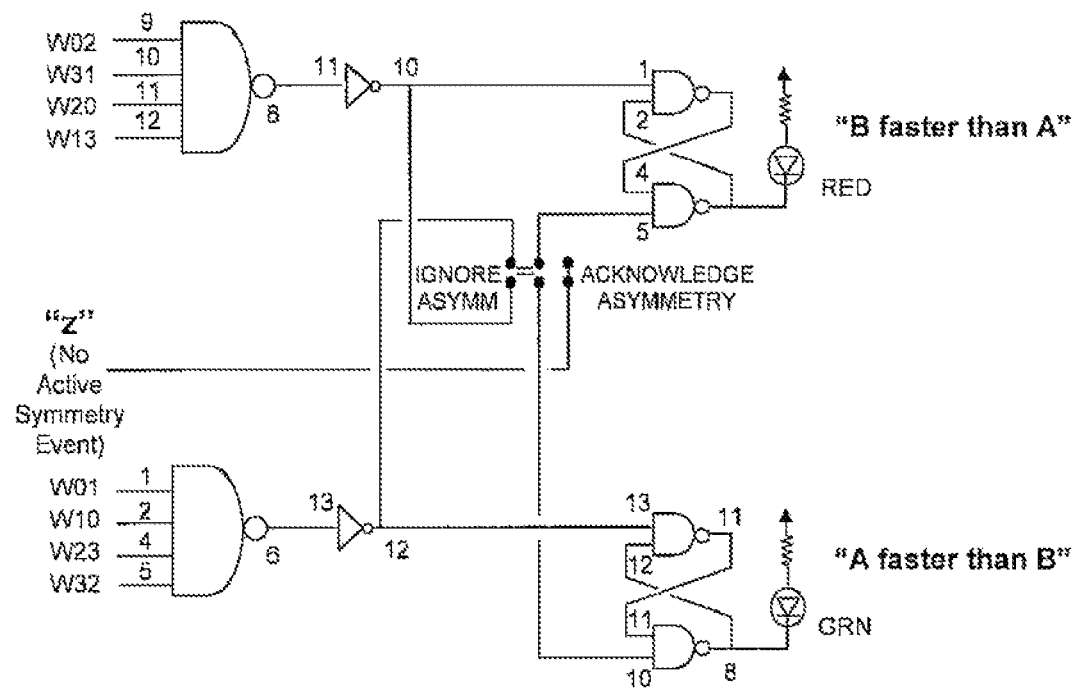
Figure 9:
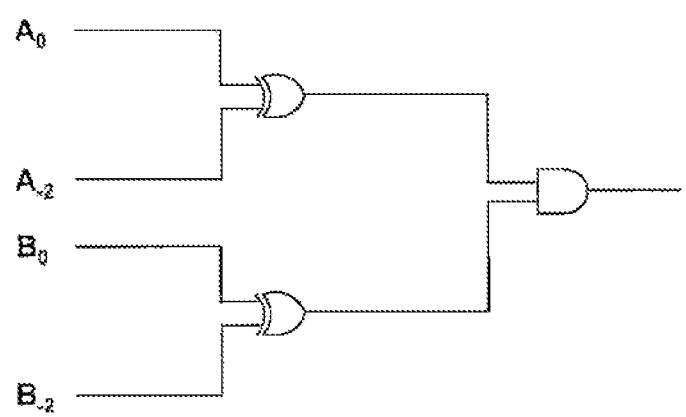
FIG. 9 illustrates a more concise symmetry-event detector structure that may be used in place of the general magnitude-comparator function shown in FIG. 8b.

As another example, logical operations may be performed on the three indications of "Ambiguity," "A faster than B" and "B faster than A" indications to derive an "A and B same frequency within resolution" indication. FIG. 8d shows an exemplary circuit incorporating these examples and a few additional features. SR latches are used to retain the last known outcome as to which frequency was faster. The circuit provides a DPDT switch, selectively allowing the SR latches to be reset whenever there is an "Ambiguity" (No Symmetry Event") condition, or allowing the SR latches to ignore that situation and retain the last value. Numerous other approaches and derived signals may be realized as is clear to one skilled in the art (and demonstrated later in conjunction with FIG. 26). One skilled in the art will recognize that the full functionality of a magnitude comparator is not needed to detect the symmetry events. For example, the circuit of FIG. 9 could also be used.

Transition-Based Embodiments

Next, exemplary transition-based approaches for the invention are considered. These effectively set states of a plurality of latching flip-flops responsive to the rising and falling edges of the two square waves, and apply combinational logic operations to the resulting state values.

As an orienting note, transition-based implementations effectively set the state of a plurality of flip-flops with the rising and falling edges of signals and invoke combinational logic operations. The implementation circuits for the invention may at first appear at a high level to somewhat resemble some types of edge-triggered frequency comparator circuits known in the art. However, these implementations are completely different in principle, structure, and operation. Derived from the novelties of the invention, the signal flow is entirely feed-forward (i.e., no stored-state feedback) and requires no quadrature signal inputs. These properties alone make the implementations to follow entirely different from edge-triggered frequency comparator circuits known in the art.

A transition-based implementation may identify eight symmetry event conditions separately, as was done in the state-oriented implementation, or in related groupings ("equivalence-classes"). In state-oriented implementations, equivalence-classes are naturally implemented using don't care" conditions across the grouping of states (utilizing the common practice of Karnaugh maps). Such detailed states need not be kept in transition-based implementations; it is possible to realize "don't care" structures across time, i.e., detecting classes of grossly similar phenomena independent of the fine-structure in the temporal ordering of events. However, this must be done carefully to avoid the situation depicted in FIG. 2b, for example.

Figure 10:
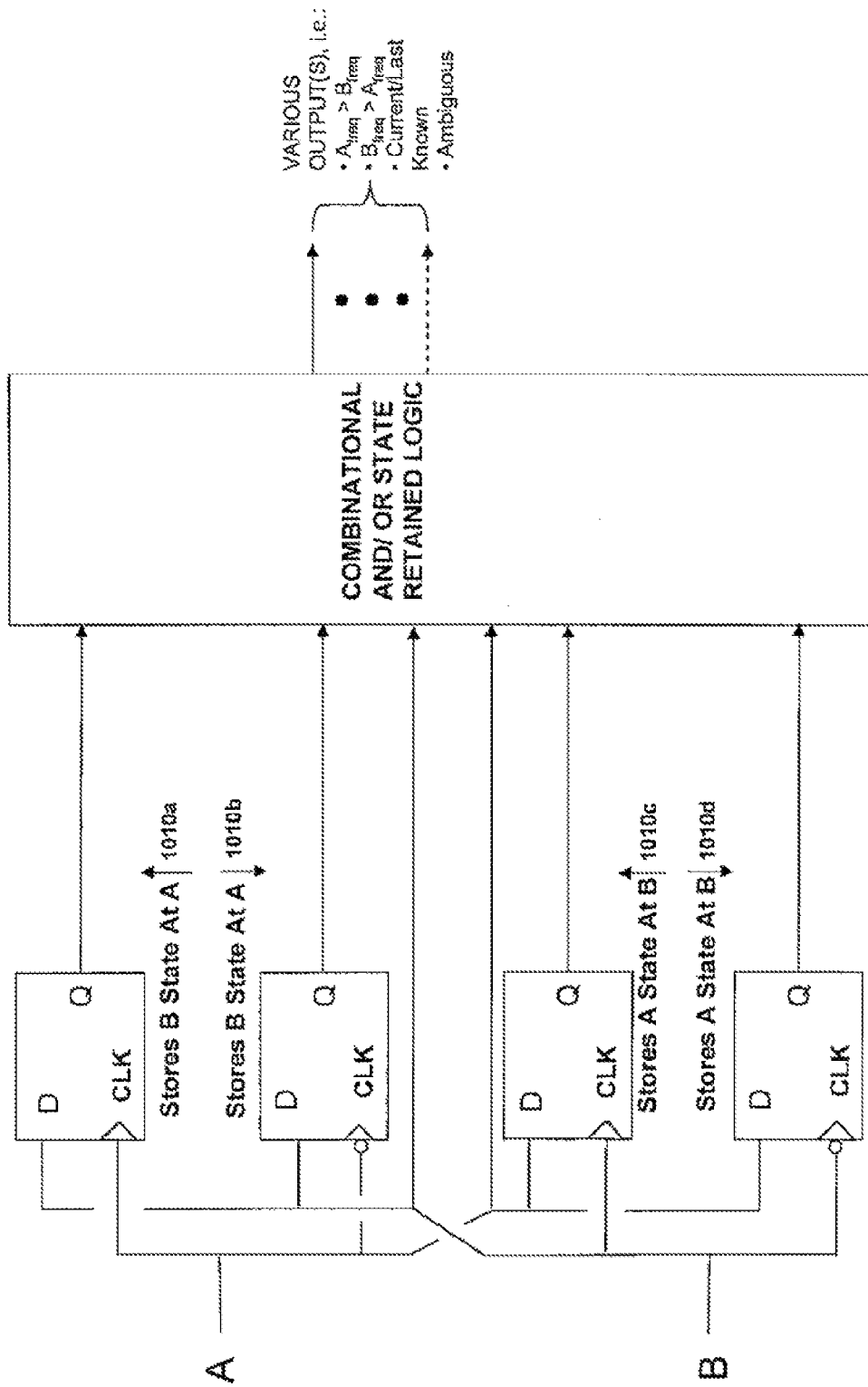
FIG. 10 illustrates an exemplary problematic implementation of a problematic attempt at a transition-based embodiment of the invention, demonstrating the need to attend to details of interleaved transitions between input waveforms as raised in conjunction with FIG. 2b.

To illustrate this concern, FIG. 10 illustrates a problematic approach (one that ignores the third remark cited earlier). In this example, the rising and falling transitions of each square wave are used to trigger sampling of the value of the other square wave at that instant (1010a-1010d). The resulting data appears at first readily useful, but fails to be definitive. Referring to FIG. 2b, the approach of FIG. 10 will give the same results when square wave B 252 is compared to relatively lower-frequency square wave $A_1$ 251 or relatively higher-frequency square wave $A_2$ 253.

The key condition in the sequence of transitions that must be captured is:
  the slower square wave must malice a transition (either up or down);
  the faster square wave must make at least the next two transitions (either up then down or down then up);
  and only then may the slower square wave malice its transition.

Data capture and pattern detection thus operate in a manner not unlike that of a combination lock that recognizes combination codes. As an additional caution, this approach to a transition-based implementation employs the use of both rising and falling edges of the square waves. Thus the circuit involves the co-presence of inversions and non-inversions of the same signal. The generation and handling of these co-present inversions and non-inversions of the same signal require care to prevent unnecessary limitations due to race conditions.

Figure 11A:
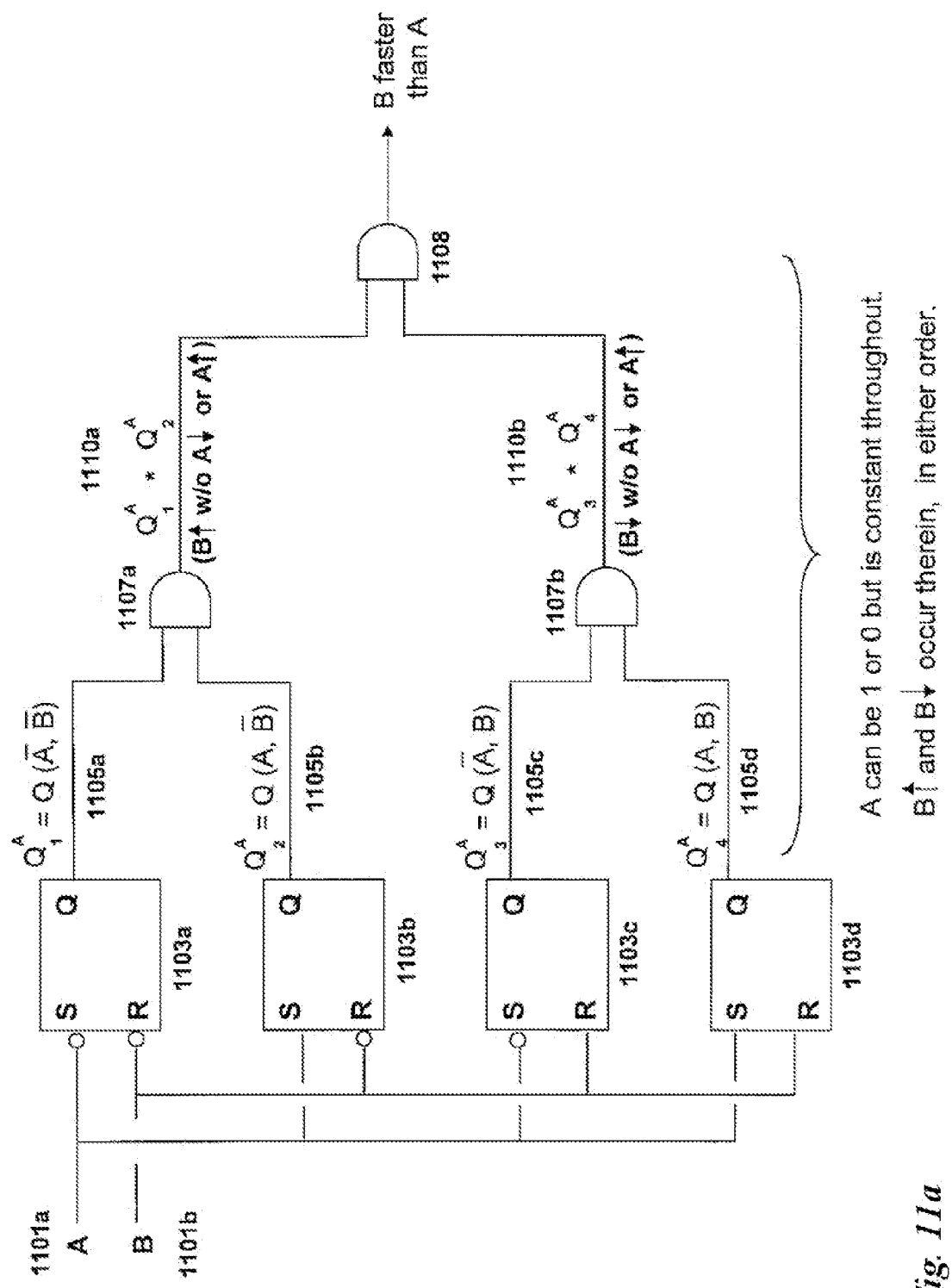
FIG. 11a illustrates an exemplary successful implementation of one detection step of a transition-based embodiment of the invention, demonstrating the ability to ignore the relative order of up and down transitions of the lower-frequency waveform.

FIG. 11a illustrates a first step in an exemplary abstract logic circuit realization of a transition-based implementation responsive to both rising and falling edges of the symmetric square wave signals A 1101a and B 1101b, and taking the above concerns into consideration. Here, four SR ("set-reset") flip-flop latches 1103a-1103d are driven by transients of inverted and non-inverted versions of binary waveforms A 1101a and B 1101b. The notation Q(S,R) denotes the state of the latch output as a function of S and R:

TABLE 4

| S | R | Q(S, R) |
|---|---|---------|
| 0 | 0 | Previous value of Q |
| 1 | 0 | 1 |
| 0 | 1 | 0 |
| 1 | 0 | 1 (pseudo-stable) |

Thus the configuration depicted in FIG. 11a causes the four SR latches to behave as follows:
  The first latch output $Q_1$ is:
    set to 1 when A makes a transition from 1 to 0;
    set to 0 when B makes a transition from 1 to 0;
  The second latch output $Q_2$ is:
    set to 1 when A makes a transition from 0 to 1;
    set to 0 when B makes a transition from 1 to 0;
  The third latch output $Q_3$ is:
    set to 1 when A makes a transition from 1 to 0;
    set to 0 when B makes a transition from 0 to 1;
  The fourth latch output $Q_4$ is:
    set to 1 when A makes a transition from 0 to 1;
    set to 0 when B makes a transition from 0 to 1.

The status of these latches 1103a-1103d can thus be used to keep track of the relevant most recent sequential status of the rising and falling (up and down transitions) of each of the input waveforms. There are at least two high-level approaches to employing subsequent combinational logic to determine the occurrence of enveloping events relevant to frequency comparison in accordance with embodiments of the invention:

Trapping the two conditions (a) and (b) where one waveform makes both an up transition and a down transition during an interval of time when the other waveform undergoes
  (a) no up transition;
  (b) no down transition
and taking the logical "OR" of these (as either condition (a) or (b) can indicate which input waveform is at the higher frequency);

Trapping the conditions (c) and (d) where one input waveform undergoes:
  (c) an up transition;
  (d) an down transition
during an interval of time when the other waveform does not undergo either, transition and taking the logical "AND" of these (as both conditions (c) and (d) are required to determine which input waveform is at the higher frequency).

The exemplary embodiment of FIGS. 11a-11f, described below, implements the latter approach.

If A 1101a a makes no transition up nor down transition in an interval where B 1101b makes an up transition 1110a, then outputs $Q_1$ 1105a and $Q_2$ 1105b are both set to 1, and remain in that condition until B 1101a either makes a down transition (which then causes $Q_1$ 1105a to reset to 0) or makes an up transition (which then causes $Q_2$ 1105b to reset to 0). Referring to cases 275a-276d of FIG. 2c, these are two of the partial conditions in which the symmetric square oscillation of B 270b must be faster than the symmetric square oscillation of A 270a. An AND operation 1107a acting on outputs $Q_1$ 1105a and $Q_2$ 1105b produces a logical 1 under these first two "B faster than A" cases.

Similarly, if A 1101a makes no up nor down transition in an interval where B 1101b makes a down transition, then outputs $Q_3$ 1105c and $Q_4$ 1105d are both set to 1, and remain in that condition until A 1101a either makes a down transition (which then causes $Q_3$ 1105c to reset to 0) or makes an up transition (which then causes $Q_4$ 1105d to reset to 0). Referring to cases 275a-275d of FIG. 2c, these are remaining two partial conditions in which the symmetric square oscillation of B 270b must be faster than the symmetric square oscillation of A 270a. An AND operation 1107b acting on outputs $Q_3$ 1105c and $Q_4$ 1105d produces a logical 1 under these second two "B faster than A" cases.

A subsequent AND operation 1108 acting on previous AND outputs 1110a and 1110b, captures the condition where signal B makes both an up and a down transition during an interval with no transition of either type by signal A. This situation corresponds to the four "A faster than B" cases 275a-275d depicted in FIG. 2c. When this condition is met, the AND operation 1108 ultimately produces a logical 1 if A 1101a is faster than B 1101b (at least where A 101a and B 1101b are symmetric square waves). Although not pursued here, it is noted that the three two-input AND operations 1107a, 1107b, 1108 may be combined into a single four-input AND operation, which can be used to reduce chip count if implemented using standard small-scale logic ICs.

Figure 11B:
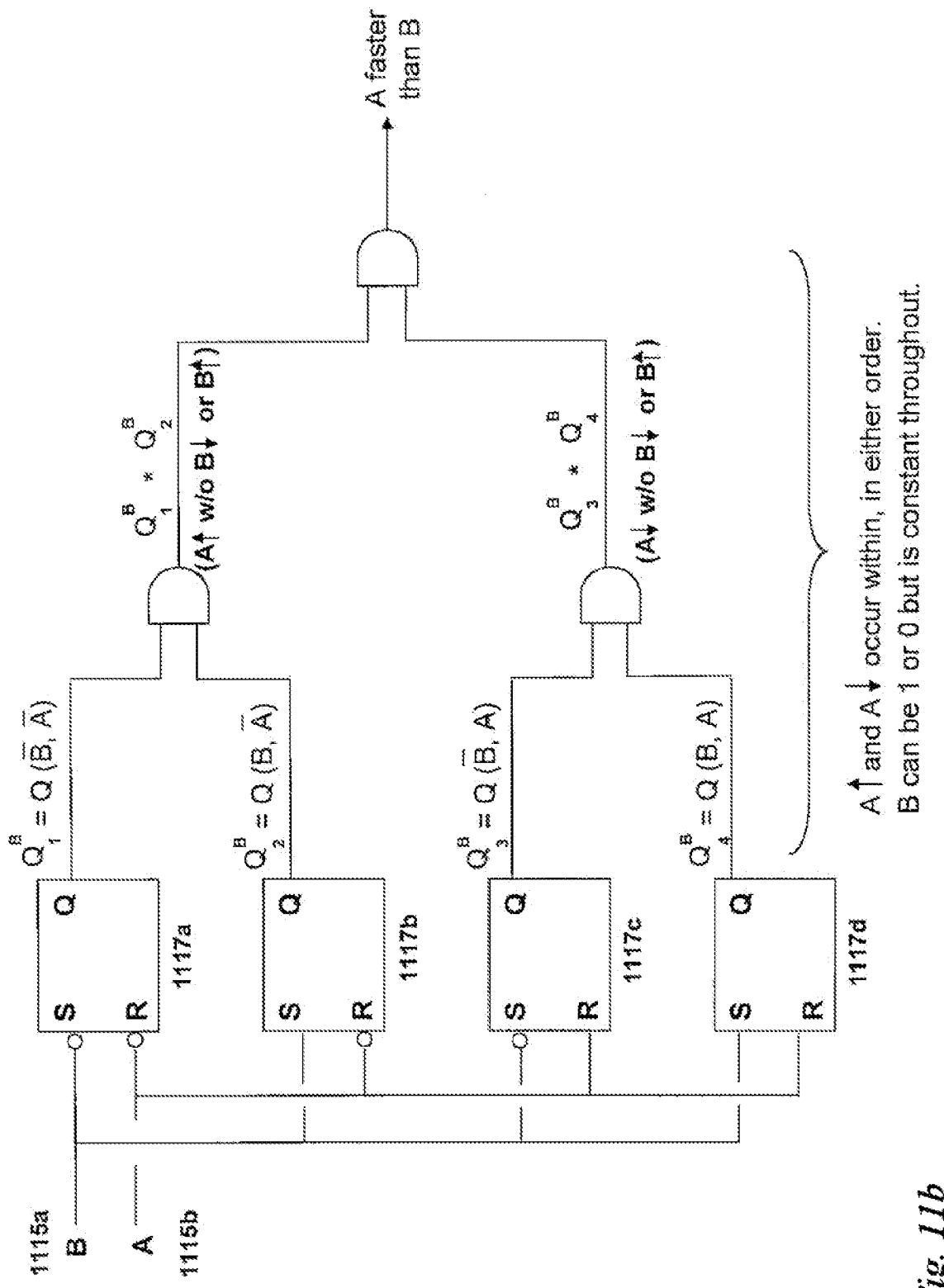
FIG. 11b illustrates an exemplary exchange of input waveforms shown in FIG. 11a so as to implement the complementary detection step of a transition-based embodiment of the invention.

By replicating the arrangement of FIG. 11a with the roles of A 1101a and B 1101b reversed, one obtains the arrangement of FIG. 11b, which ultimately produces a logical 1 if A 1115a is faster than B 1115b, where A 1115a and B 1115b are symmetric square waves.

Even though the configurations of FIGS. 11a and 11b use different latch driving arrangements, they are very similar. In fact, either may be converted to use the same latch driving arrangement as the other, allowing the two circuits to be readily merged into a form sharing the same four SR latches.

This will be illustrated by converting the latch driving arrangement of FIG. 11*b* into the latch driving arrangement of FIG. 11*a*. Because of the symmetry of the SR latch, one has the inversion relation:

$$\overline{Q}(S,R) = Q(R,S) \quad \text{(Eq. 6)}$$

Figure 11C:
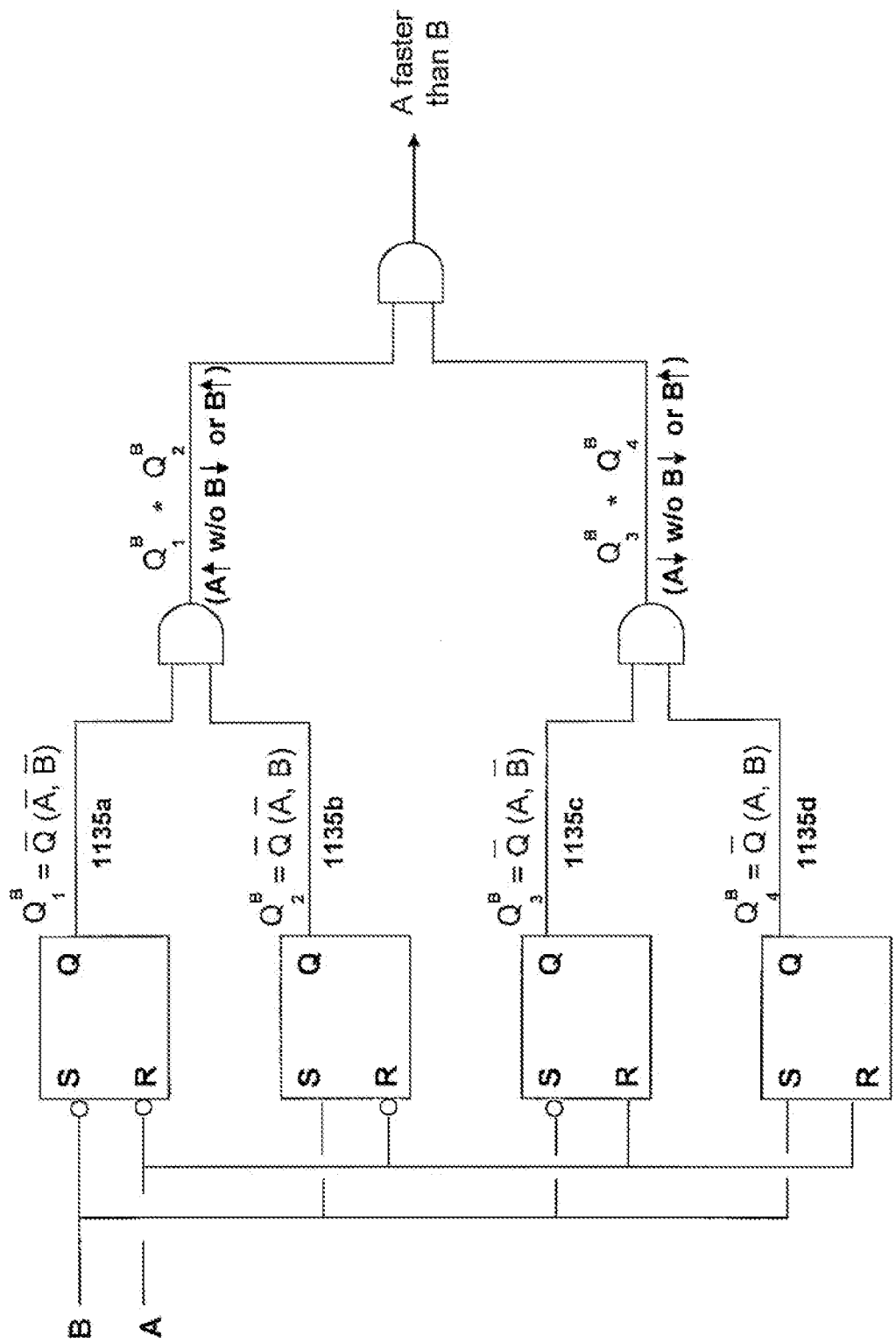

Applying this to the values produced by the outputs of each of the four SR latches 1117*a*-1117*d* in FIG. 11*b* yields the equivalent latch outputs 1135*a*-1135*d* depicted in FIG. 11*c*. However, these complemented latch outputs are in fact readily provided by an SR latch (as known to those skilled in the art and later seen in FIG. 12*a*) as the $\overline{Q}$ output, thus immediately yielding the configuration of FIG. 11*d*.

Figure 11D:
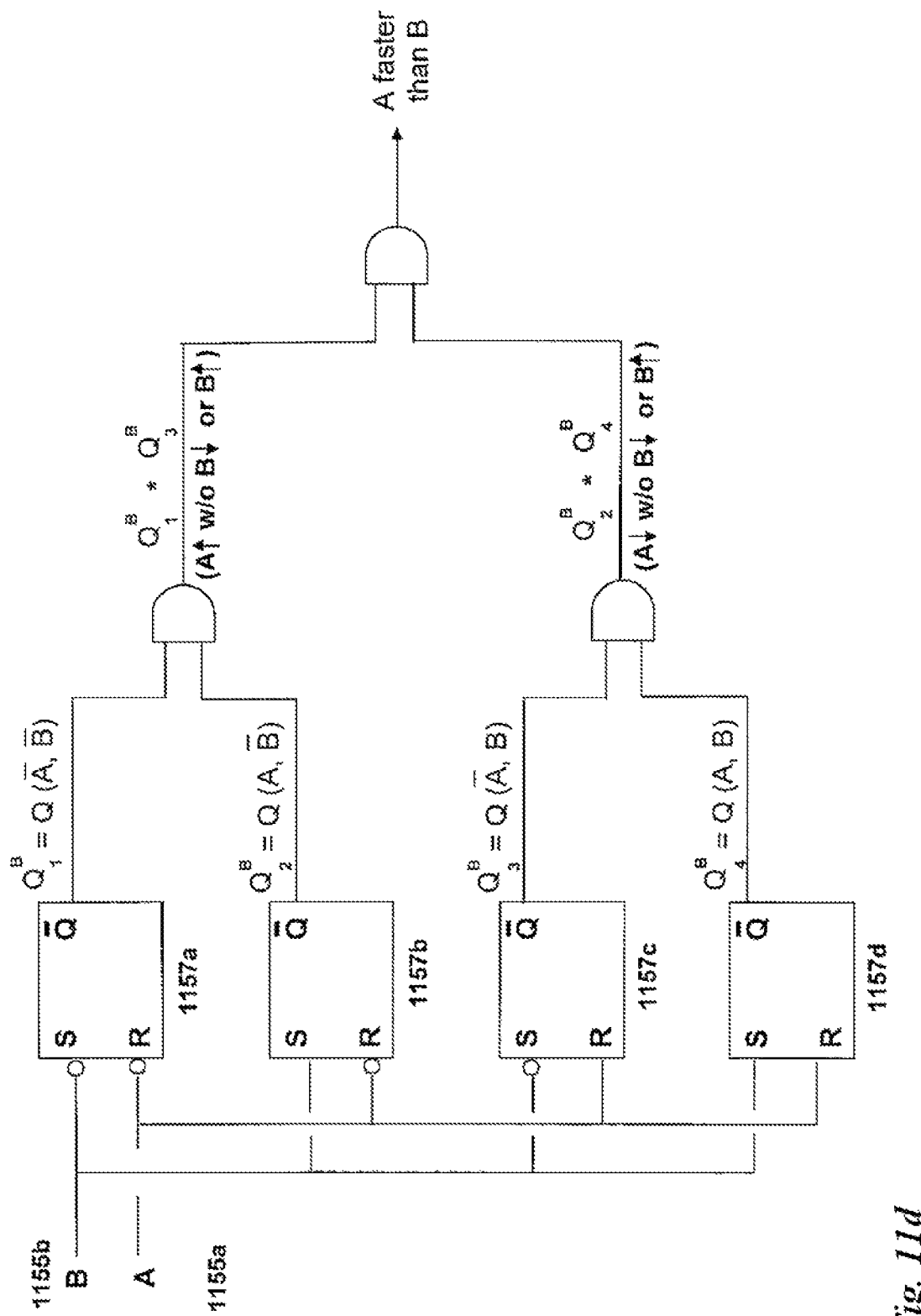
Figure 11E:
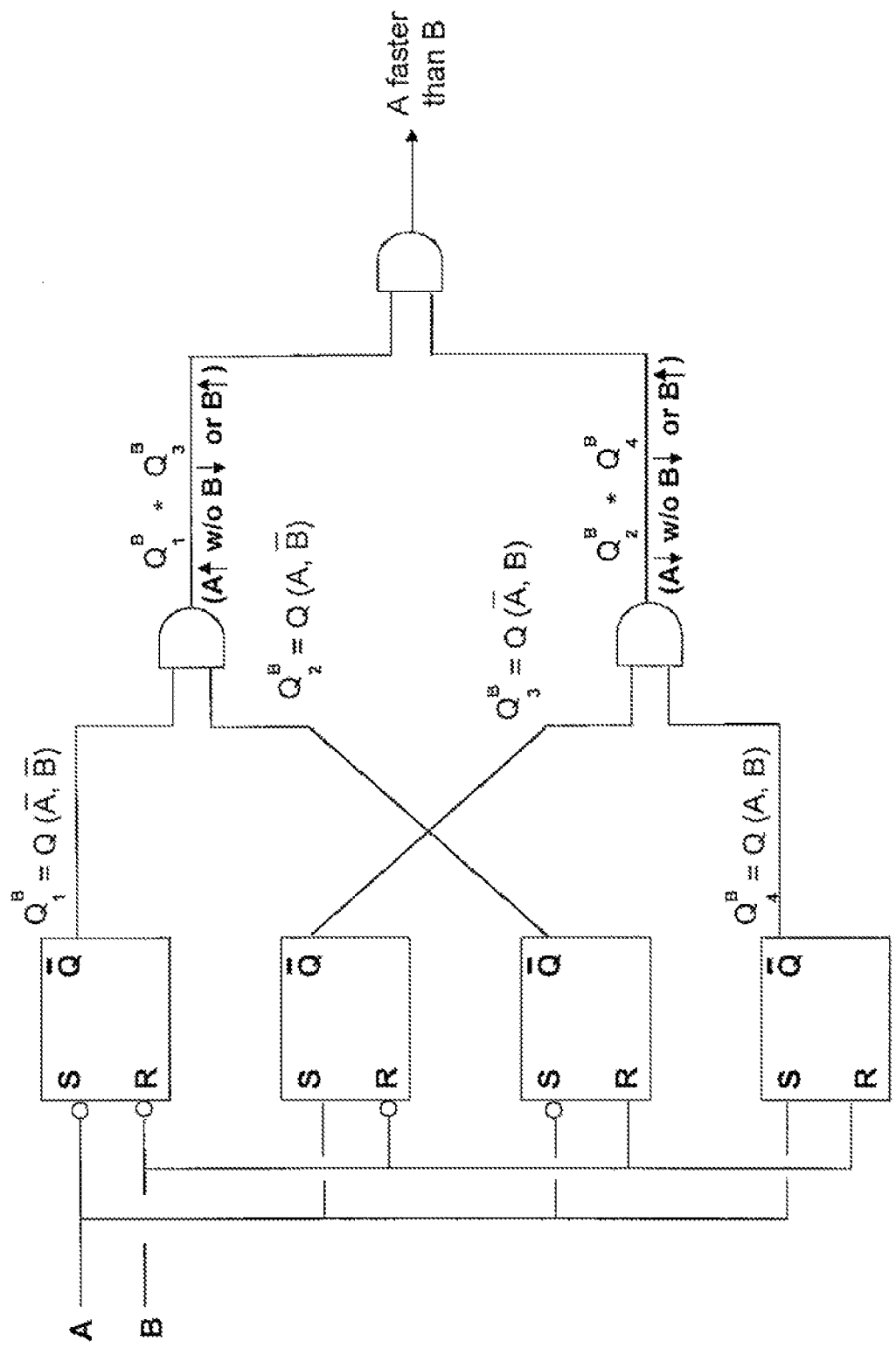

Reversing inputs A 1155*a* and B 1155*b* of FIG. 11*d* now only causes the need to swap outputs of the second 1157*b* and third 1157*c* latches, resulting in the configuration shown in FIG. 11*e*. Comparing FIG. 11*e* with 11*a* reveals the same latch driving arrangement, readily enabling the combined circuit of FIG. 11*f*.

Figure 11F:
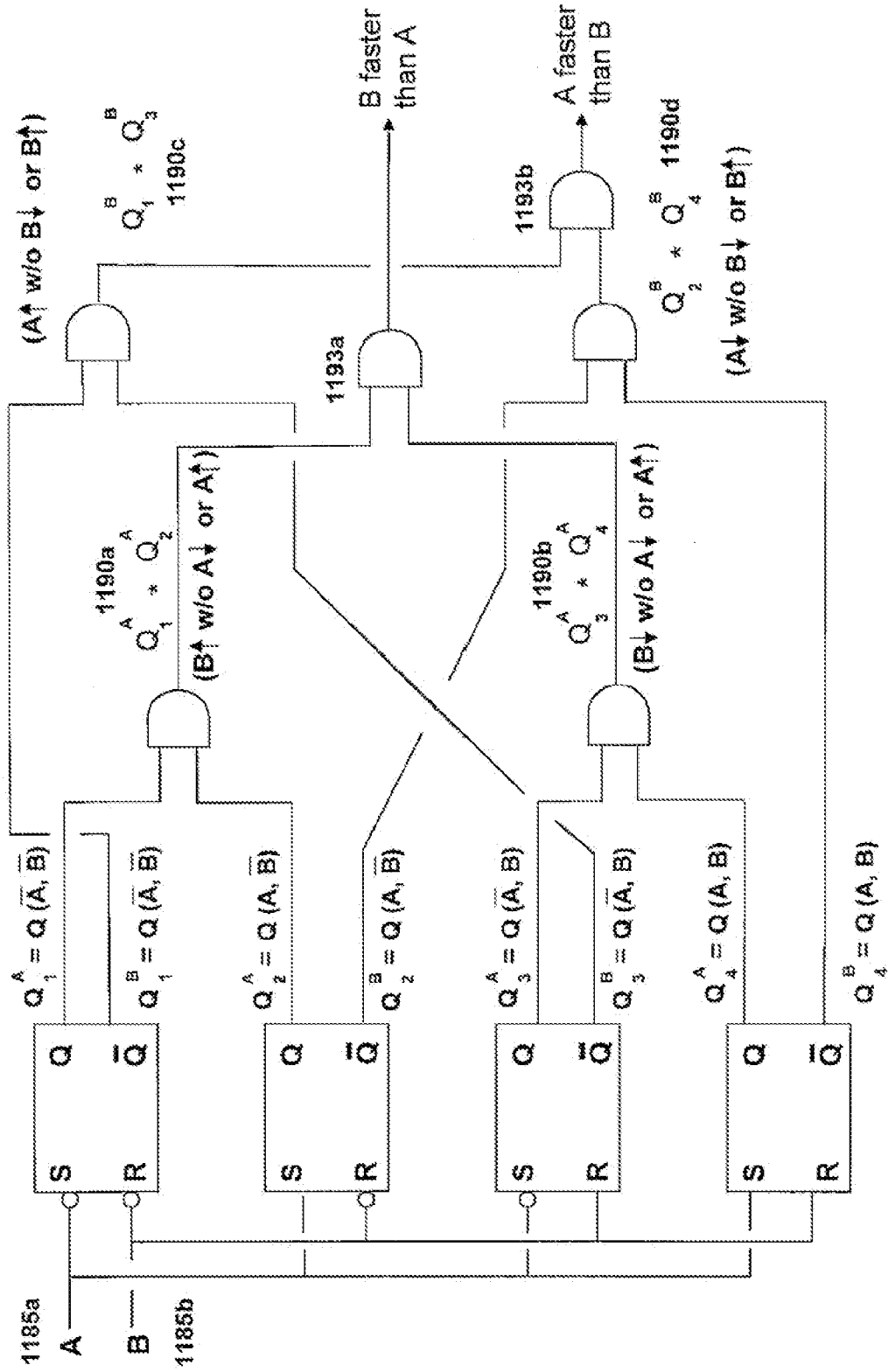
FIG. 11f shows an exemplary resulting superposition of the arrangement of FIG. 11a with the arrangement of FIG. 11e.
Figure 12A:
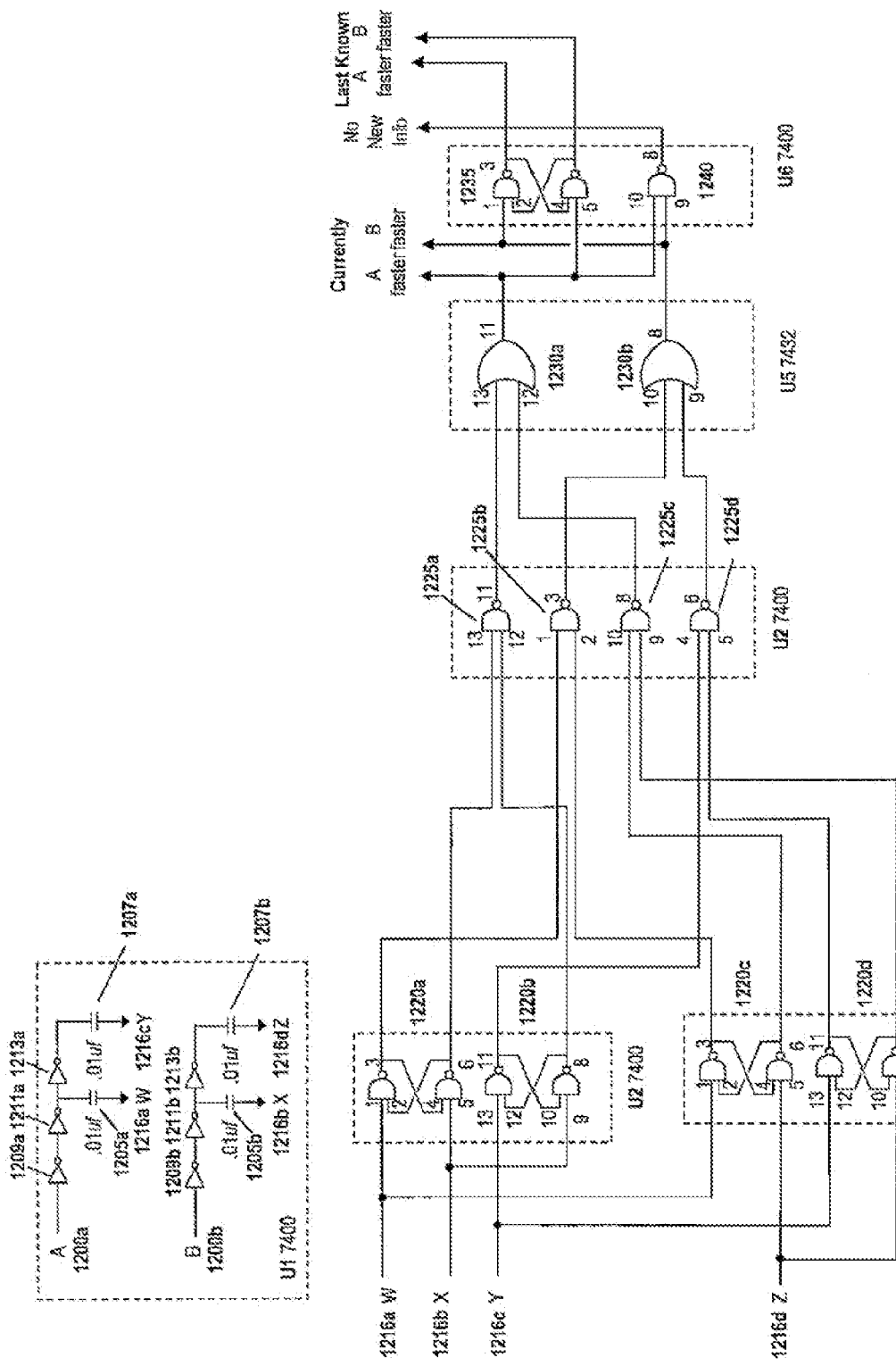
FIG. 12a illustrates an logic-circuit implementation of the arrangement of FIG. 11f.

FIG. 12*a* shows a reference circuit realization of the arrangement of FIG. 11*f*, and utilizes standard TTL/CMOS series integrated circuits. The pulse transition edges of applied signals A 1200*a* and B 1200*b* are isolated by, for example, 0.01 uf of capacitors 1205*a*, 1207*a*, 1205*b*, 1207*b* driven by buffer and inverter circuits comprised of inverter elements 1209*a*, 1211*a*, 1213*a*, 1209*b*, 1211*b*, 1213*b*. This transition-driven pulse generation arrangement is a simplified alternative to the circuits of FIGS. 6*a*-6*g*, but has frequency-range limitations and can readily be replaced by circuits employing the techniques depicted in FIGS. 6*a*-6*g*.

These four transition-driven pulse signals (W 1216*a*, X 1216*b*, Y 1216*c*, Z 1216*d*) are applied to inverted-input RS-latches 1220*a*-1220*d* formed from pairs of NAND gates. The inverted property of the latch inputs, together with the choice of capacitively coupled signals, are aligned to match the latch-driving arrangements of FIG. 11*f*.

The four (NAND gate, inverted-input) RS latches 1220*a*-1220*d* provide both original and inverted versions of latch state output simultaneously, and these output signals are directed (in positive-valued logic) to four additional NAND gates 1225*a*-1225*d*. These latter four NAND gates 1225*a*-1225*d* produce (in inverted-valued logic) signals corresponding to the $Q_1^A$ & $Q_2^A$ 1190*a*, $Q_3^A$ & $Q4^A$ 1190*b*, $Q_1^B$ & $Q_3^B$ 1190*c*, $Q_2^B$ & $Q_4^B$ 1190*d* signals of FIGS. 11*e* and 11*f*. The inverted values of these logic signals is in keeping with inverted-value conventions of TTL/CMOS families of logic chips, should these signals be used for other purposes, and are also convenient for direct driving of indicator LEDs. These inverted-value logic signals are then applied to two OR gates 1230*a*-1230*b*, which by DeMorgan's law act as NAND gates on positive-valued logic signals.

This gives inverted indications of "A faster than B" and "B faster than A," the inverted-value signals are in keeping with inverted-value conventions of TTL/CMOS families of logic chips, and convenient for direct driving of indicator LEDs. When actual square waves are applied, the indications of "A faster than B" and "B faster than A" are constantly being reset when the slower waveform finally makes its transition. Thus by applying the inverted "A faster than B" and "B faster than A" signals to another NAND gate inverted-input RS latch 1235, the last indication of which of input signals A 1200*a* and B 1200*b* had the higher frequency can be stored until that condition changes.

Further, when no condition indicating that one or the other of input signals A 1200*a* and B 1200*b* had the higher frequency is currently active, there is no new conclusive information as to which of input signals A 1220*a* and B 1220*b* had the higher frequency. Under these circumstances, both of the outputs of the inverted "A faster than B" and "B faster than A" signals are high, so when they are applied to an additional NAND gate 1240*a* signal indicating "No New Information Available" is produced, again in inverted-value form and thus in keeping with inverted-value conventions of TTL/CMOS families of logic chips, and convenient for direct driving of an indicator LED.

Figure 12B:
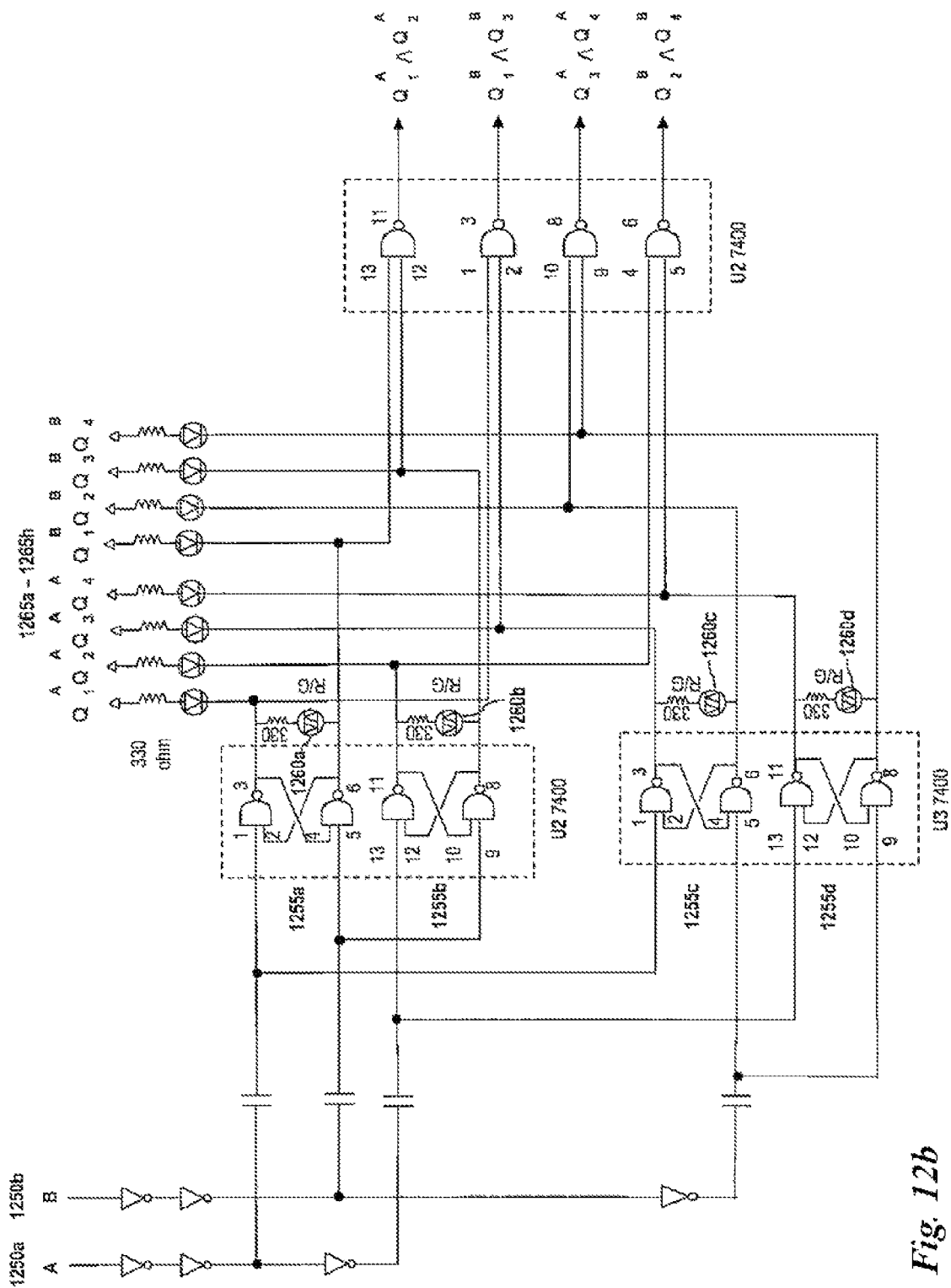
FIGS. 12b and 12c illustrate the addition of LEDs to the implementation of FIG. 12a. The LEDs indicate various operating conditions, states, and obtained results.
Figure 12C:
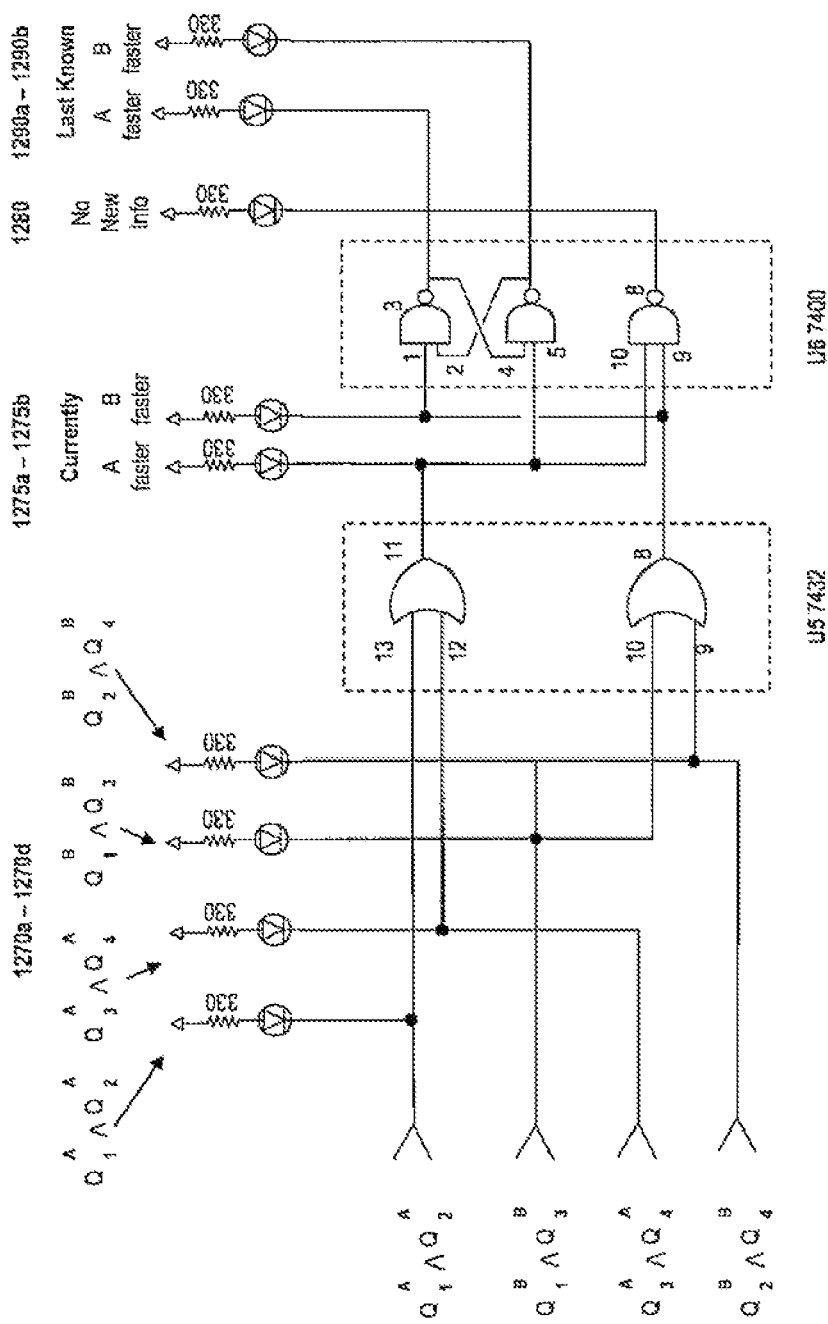

FIGS. 12*b* and 12*c* show an LED demonstration adaptation of the reference circuit realization of FIG. 12*a*. Here a number of LEDs are added to indicate the various logic levels of the signal flow, demonstrating operation. As indicated in the above discussion, the inverted-value signal conventions may be used for directly driving indicator LEDs tied to the power supply and fitted with an appropriate current limiting resistor (for example 330 ohms for 5-volt TTL logic). Green LEDs, for example, may be employed to represent states of affairs relating to input signal A 1250*a* being faster than input signal B 1250*b*, and red LEDs may be employed to represent states of affairs relating to input signal B 1250*b* being faster than input signal A 1250*a*.

Using this convention, commonly available polarity-reversal bi-color LEDs 1260*a*-1260*d* (green for one current direction, red for the opposite current direction) may be attached, as shown across the complementary-valued outputs of the four NAND gate inverted-input RS latches 1255*a*-1255*d*; these, too, light as green for states of affairs relating to input signal A 1250*a* being faster than input signal B 1250*b*, and light as red for states of affairs relating to input signal B 1250*b* being faster than input signal A 1250*a*. As shown in FIG. 12*b*, individual single color LEDs 1265*a*-1265*h* may be added to redundantly indicate the status of individual flip-flop outputs from the view point of favorable conditions relating to the red and green convention. The signals produced by the four NAND gates of U2 are passed to FIG. 12*c* where additional LEDs 1270*a*-1270*d* indicate the status of individual flip-flop outputs from the view point of favorable conditions relating to the red and green convention. The indication of which signal is deemed as being currently faster may be displayed with an additional pair of LEDs 1275*a*, 1275*b* which also be color coded according to the color convention. As these light only at isolated moments, an additional LED 1280, for example yellow, may be used to indicate "No New Information Available" status. The additional latch circuit may be used to drive red and green LEDs 1290*a*, 1290*b* to indicate the last known relative speed determination, in which case the (yellow) LED 1280 may be interpreted as a cautionary "No New Information Available" warning condition to caveat the displayed latched relative speed indication.

The various LED indications introduced in FIGS. 12*b* and 12*c* readily verify details of the design theory when inputs A 1250*a* and B 1250*b* are driven with signals from a (electromechanically-debounced) pushbutton. When driven with low-frequency symmetric square wave oscillators, the LED indications visually demonstrate the patterns resulting from the various relative square wave conditions that lead to the frequency comparator output determination.

When driven with signals from (electromechanically-debounced) pushbuttons, the circuit plainly demonstrates another application: it provides an indication as to which of two buttons or switches was last cycled between on and off with no change in the status of the other button or switch. This observation provides further motivation for a chip implementation of at least the transition-based embodiment of the invention as it can be used not only as a frequency comparator but also in user-interface, sequence-auditing, and other industrial applications.

Figure 13:
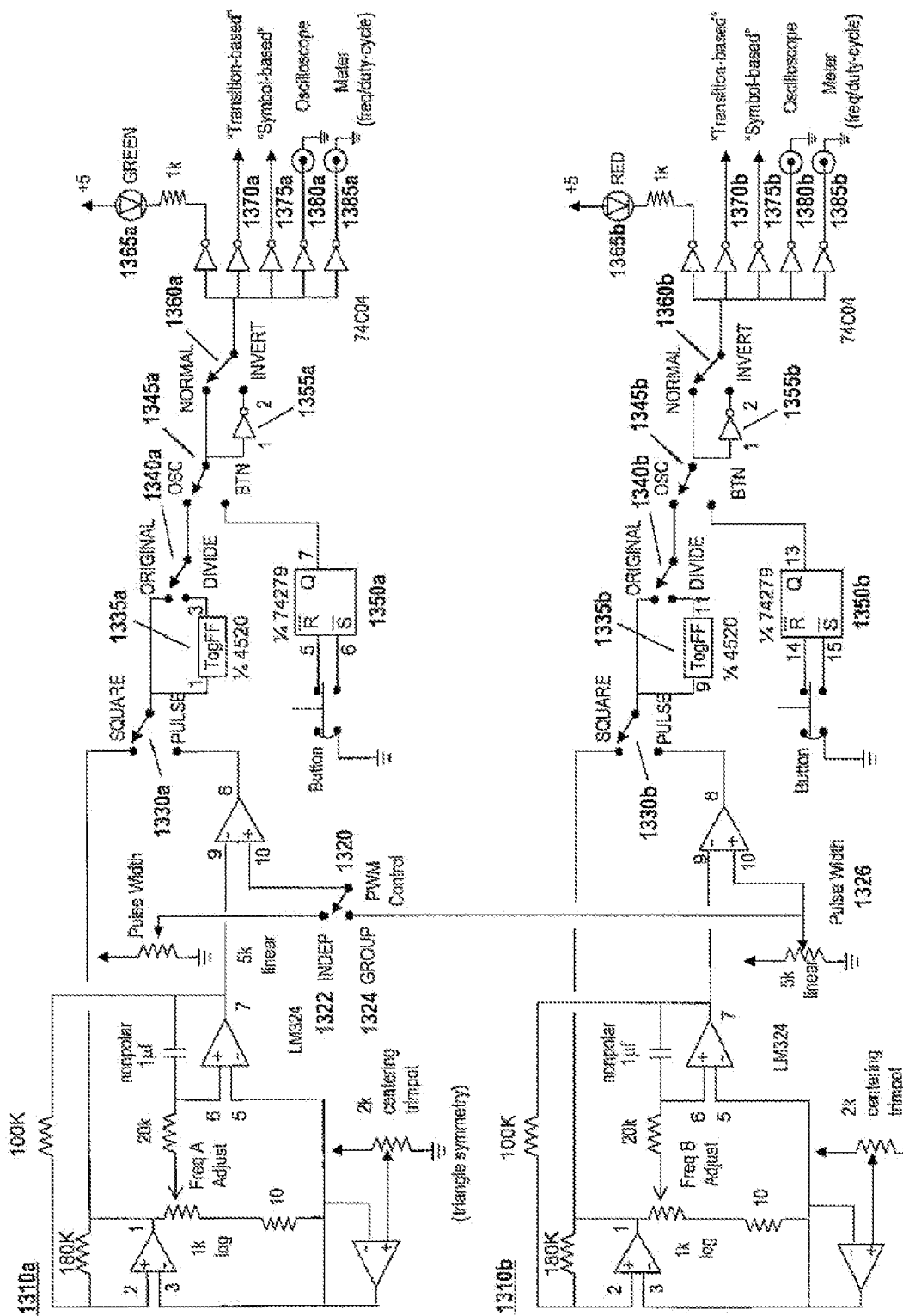
FIG. 13 illustrates an exemplary two-channel signal source for use in demonstrating, prototyping, and performing additional research and development of various aspects of the invention.

Signal Source for Demonstration of Symbol-Based and Transition-Based Embodiments FIG. 13 shows a demonstration signal source providing pushbutton actuation and variable frequency low-frequency oscillators with controllable symmetry useful in exercising the configurations of FIG. 12b and FIGS. 8a-8c, for example. This exemplary demonstration signal source 1300 comprises two nearly identical independent versions 1310a and 1310b of the same circuit; the only exception is switch 1320 that allows for pulse widths to be set and adjusted separately (in which case the two circuits 1310a and 1310b indeed are fully identical and independent) or set with a common pulse width adjustment control, Each nearly identical circuits 1310a, 1310b comprises an adjustable low-frequency oscillator, internally comprising an integrator and a comparator in a positive feedback loop.

The comparator output is a binary-valued periodic waveform very closely resembling (if not matching) that of a symmetric square wave, while the integrator output is a continuous-valued periodic waveform very closely resembling (if not matching) that of a symmetric triangle-wave. Such a low-frequency oscillator is well known in the art of analog music synthesizers. The comparator compares the integrator triangle wave output to a fixed reference voltage set to a value that is half that of the amplitude of the triangle wave.

Circuit 1300 of FIG. 13 provides this reference voltage by buffering the output of a trimpot that may be adjusted for maximal symmetry of the overall output (or for precise duty-cycle matching when the two halves 1310a and 1310b of circuit 1300 share the same pulse-width adjustment control, to be described next). The output of the comparator is variably attenuated by a logarithmic potentiometer panel control arrangement to provide variable frequency control. A small resistor (here 10 ohms) between the logarithmic potentiometer panel control and the buffered reference voltage sets the lower limit of the frequency range possible with the other components and configuration involved.

The triangle wave is additionally directed to a second comparator that compares the integrator triangle wave output to a freely adjustable voltage set by a linear potentiometer panel control. This allows variation in the asymmetry duty-cycle of the resultant pulse waveform, as is well known in the art of analog music synthesizers, motor control, and communications. Switch 1320 allows, as described earlier, pulse widths of the two oscillators to be adjusted separately with individual panel controls ("INDEPENDENT" 1322) or together ("GROUP" 1324), sharing the pulse width adjustment panel control 1326 for oscillator B.

Switches 1330a, 1330b are provided for each oscillator to permit selection of a nearly-symmetric square wave or a controllably asymmetric pulse waveform. The results are individually passed to respective toggle flip-flops 1335a, 1335b that restore symmetry under all conditions while also dividing the frequency by a factor of 2. Additional switches 1340a, 1340b are individually provided to each oscillator so as to permit selection of the undivided ("ORIGINAL") waveform or the symmetric frequency-divided ("DIVIDED") version. The resulting signal selections are then passed to yet another pair of switches 1345a, 1345b, which are provided to each channel so as to permit selection of the selected oscillator signal or a binary signal responsive to the position of a debounced pushbutton.

The pushbuttons are debounced using RS latches 1350a-1350b as is well known in the art of digital user interface design. The resulting choices is then passed to inverters 1355a, 1355b, and additional switches 1360a, 1360b are provided for each channel, These additional switches 1360a, 1360b are configured to select between the original ("NORMAL") and inverted ("INVERT") version of the respective signals created thus far.

At this point the signals are directed to one or more additional buffering stages for driving external circuitry. Here inverters are used to drive LEDs 1365a, 1365b, provide separate outputs 1370a, 1370b, 1375a, 1375b, 1380a, 1380b, 1385a, 1385b to the symbol-based and transition-based embodiments (such as those of FIGS. 8a-8c and FIGS. 12a, 8b) as well as test instruments such as oscilloscopes, phase meters, and frequency meters.

Other implementations may add additional inverters to change the logic sense of the signal outputs, employ op amps for better current drive and static electricity immunity, and the like. As to phase and frequency measurement, it is noted that the quite inexpensive Extech model MN26 DVM provides adequately precise phase and frequency measurements for use with the demonstration circuits of FIGS. 8a-8c and FIG. 12a.

The demonstration signal source 1330 just described facilitates relatively deep introductory study of the properties of pairs of asynchronous square wave waveforms and the present invention as described thus far, as well as exploring the behaviors of pairs of asynchronous asymmetric binary waveforms, to be discussed in a subsequent section.

Single-Chip System and Sub-System Embodiments

Symbol-based or transition-based embodiments may be implemented as a subsystem of discrete components, as a devoted functional integrated circuit, as a configuration of standard cells in a gate array, FPLA, ASIC, VLSI on a chip, or as an "IP core" within a System-on-a-Chip (SoIC).

The design of FIG. 8a can be readily adapted to an integrated circuit implementation via appropriate transformations and simplifications. For example, the magnitude comparator chip reduces the wiring and chip count in the FIG. 8a implementation, but has far more functionality than is required to detect symmetry-events; it may be replaced by a more focused symmetry-event detector such as that illustrated in FIG. 9. Similarly, the 4-bit de-multiplexer, convenient for showcasing the individual symmetry-event detections, can be replaced with more focused combinational logic, potentially leveraging as opportune the extensive structures and symmetries identified earlier. Additionally, shift-registers 830a, 830b may be restructured as alternative flip-flop configurations. Further, the entire functionality, or variations thereof, may be adapted into an algorithm, as will be described later in conjunction with FIGS. 15a-15b.

Similarly, the arrangement of FIG. 11f and/or its reference circuit realization of FIG. 12a may also be readily adapted to an integrated circuit implementation. As described earlier, a chip implementation of at least the transition-based embodiment of the invention can be used not only as a frequency comparator but also in a user-interface, sequence-auditing, and other industrial applications.

Figure 14A:
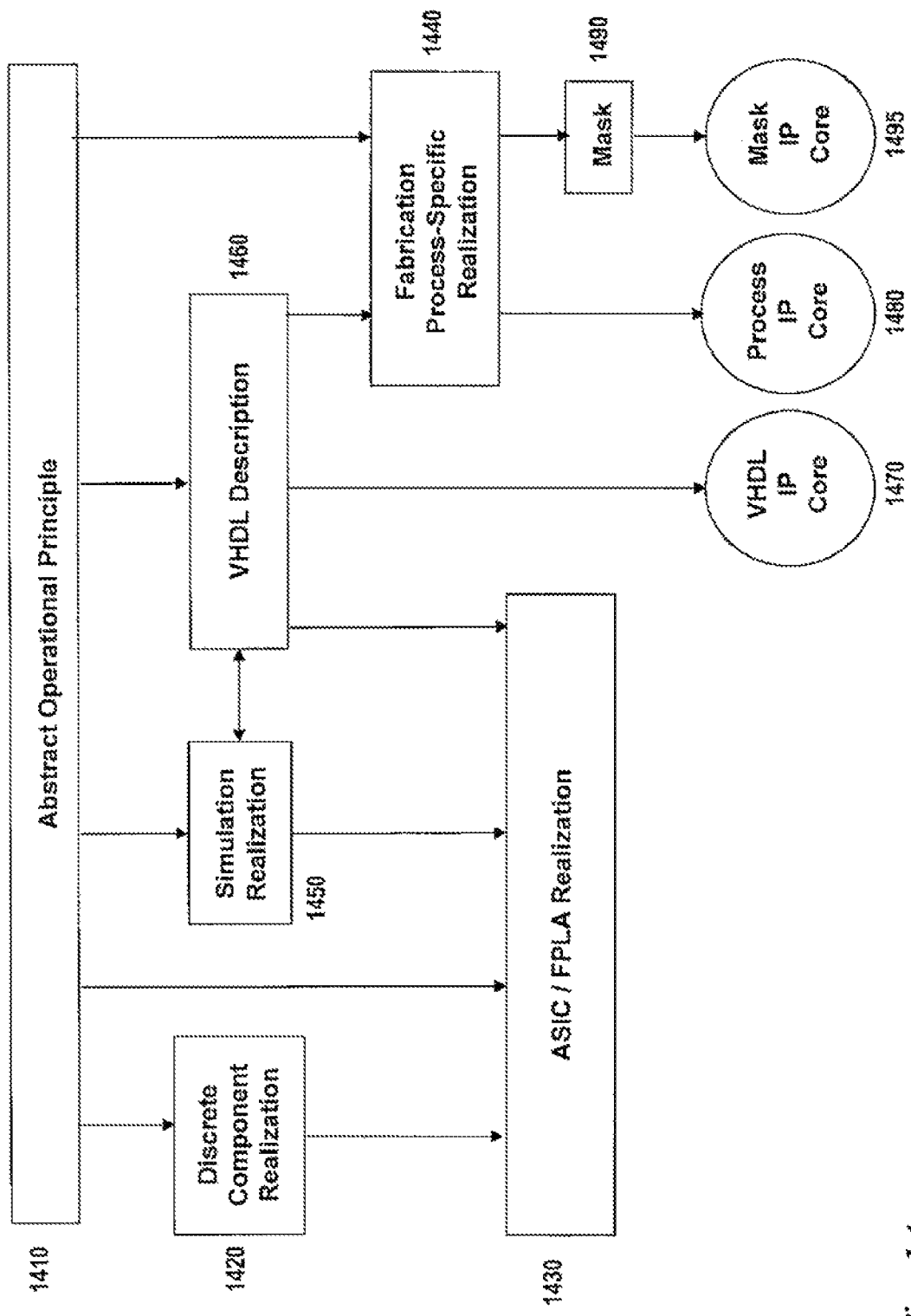
FIG. 14a illustrates exemplary geometric localizations of various "IP-cores" in an exemplary "system-on-a-chip" ("SoIC") implementation, wherein one or more of the IP cores may include an embodiment of the invention.

FIG. 14a illustrates a wide range of silicon-based options in accordance with another embodiment of the invention. A chosen abstract operating principle 1410 provided for by the invention may be realized directly employing standard TTL/CMOS components 1420 in ways similar to that described in conjunction with FIGS. 8a-8c, and FIGS. 12a, 12b. Alternatively, abstract operating principle 1410 may be realized utilizing gate and/or cell primitives inherent to specific ASIC, FPLA, and related technologies 1430. Additionally, abstract operating principle 1410 may be realized utilizing primitives inherent to a specific fabrication process 1440.

In a more measured approach, abstract operating principle 1410 may be encoded into a simulation-oriented realization

1450. In some simulation environments, the simulation description may be directly applied to specific ASIC, FPLA, and related technologies 1430. Other types of simulation environments interwork with Very-High-level Description Language (VHDL) systems 1460 that in turn can be directly applied to specific ASIC, FPLA, and related technologies or a specific fabrication process 1440.

FIG. 14*a* also illustrates a number of ways the aforementioned realizations may be adapted to create an IP core for use as a subsystem in a larger functional integrated circuit, gate array, FPLA, ASIC, VLSI, or SoIC, VHDL environments may be packaged to create a VHDL-defined IP core 1470. Alternatively, fabrication process-specific realizations 1440 may be packaged at a high-level to create a process-specified IP core 1480, or packaged as a subsystem mask 1490 to create a mask-specified IP core 1495.

Figure 14B:
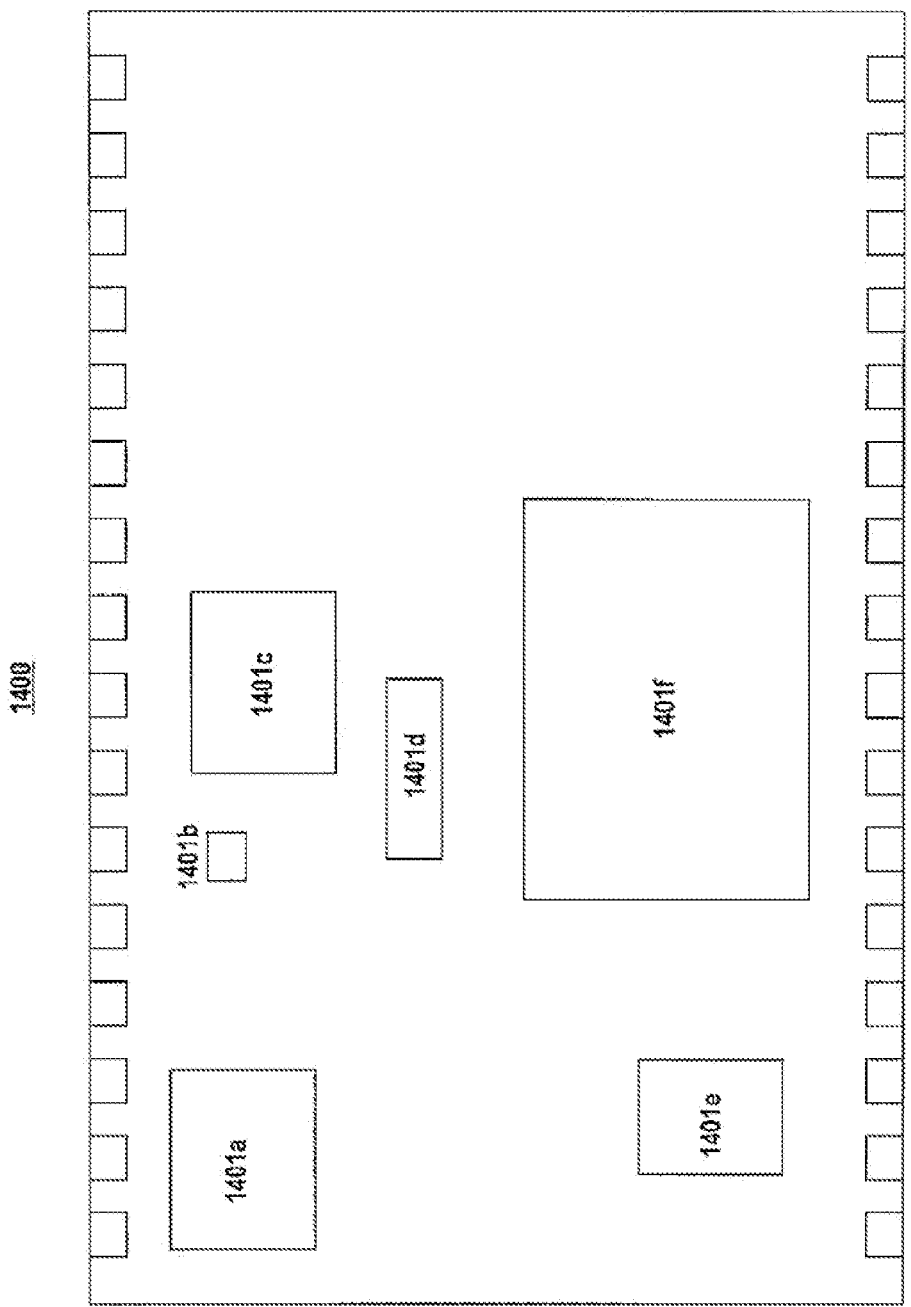
FIG. 14b illustrates a wider range of silicon-based embodiment options for the invention.

FIG. 14*b* illustrates an exemplary chip (integrated circuit) physical layout that comprises an exemplary number of "IP core" subsystems 1401*a*-1401*f*, all co-integrated to form a larger system in a large functional integrated circuit 1400. This large functional integrated circuit 1400 may be realized employing underlying gate array, FPLA, ASIC, VLSI, or SoIC technology. It is in this context wherein an embodiment of the present invention may comprise or be comprised by one of the subsystems 1401*a*-1401*f*.

Algorithmic Embodiments

Figure 15A:
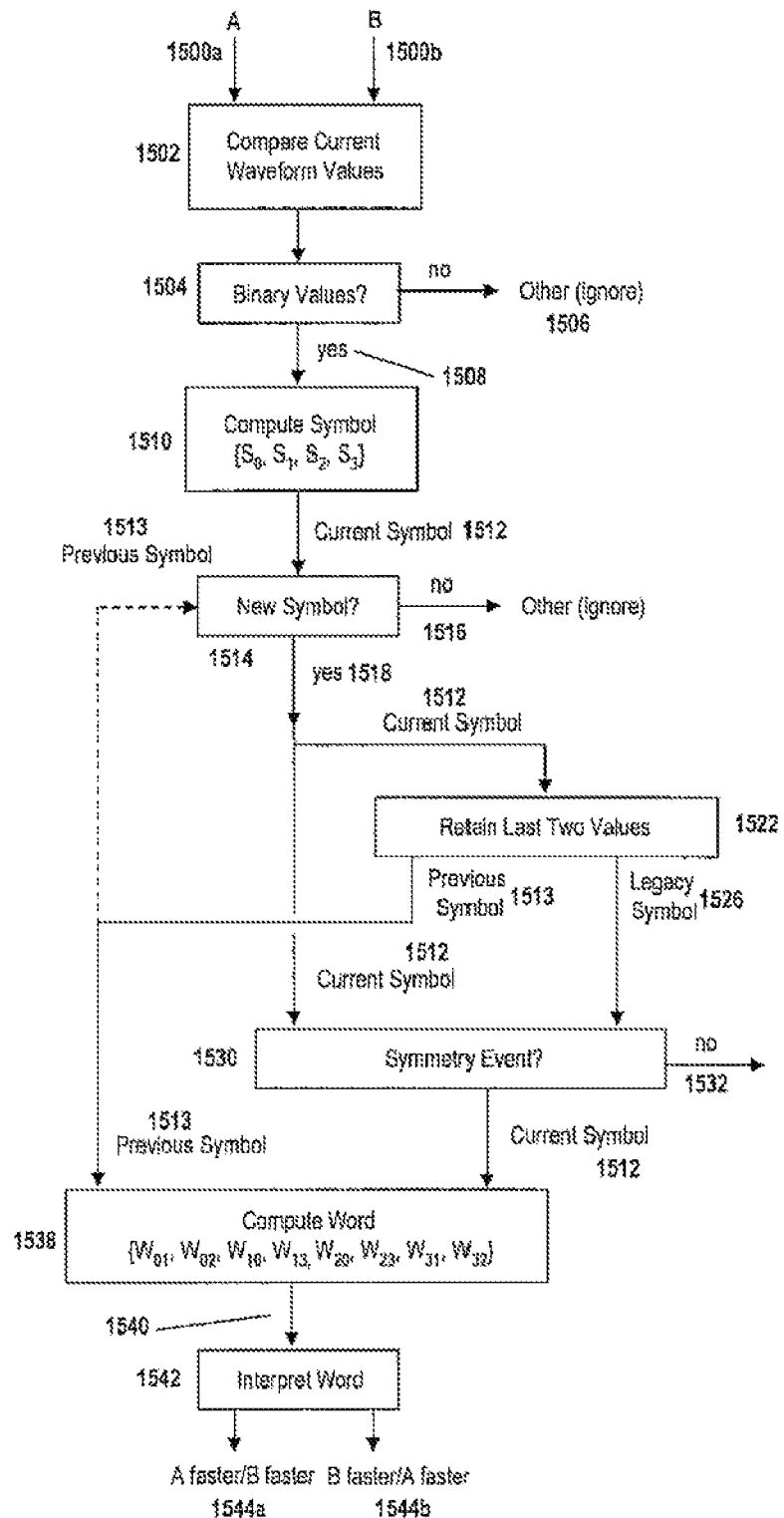
Figure 15B:
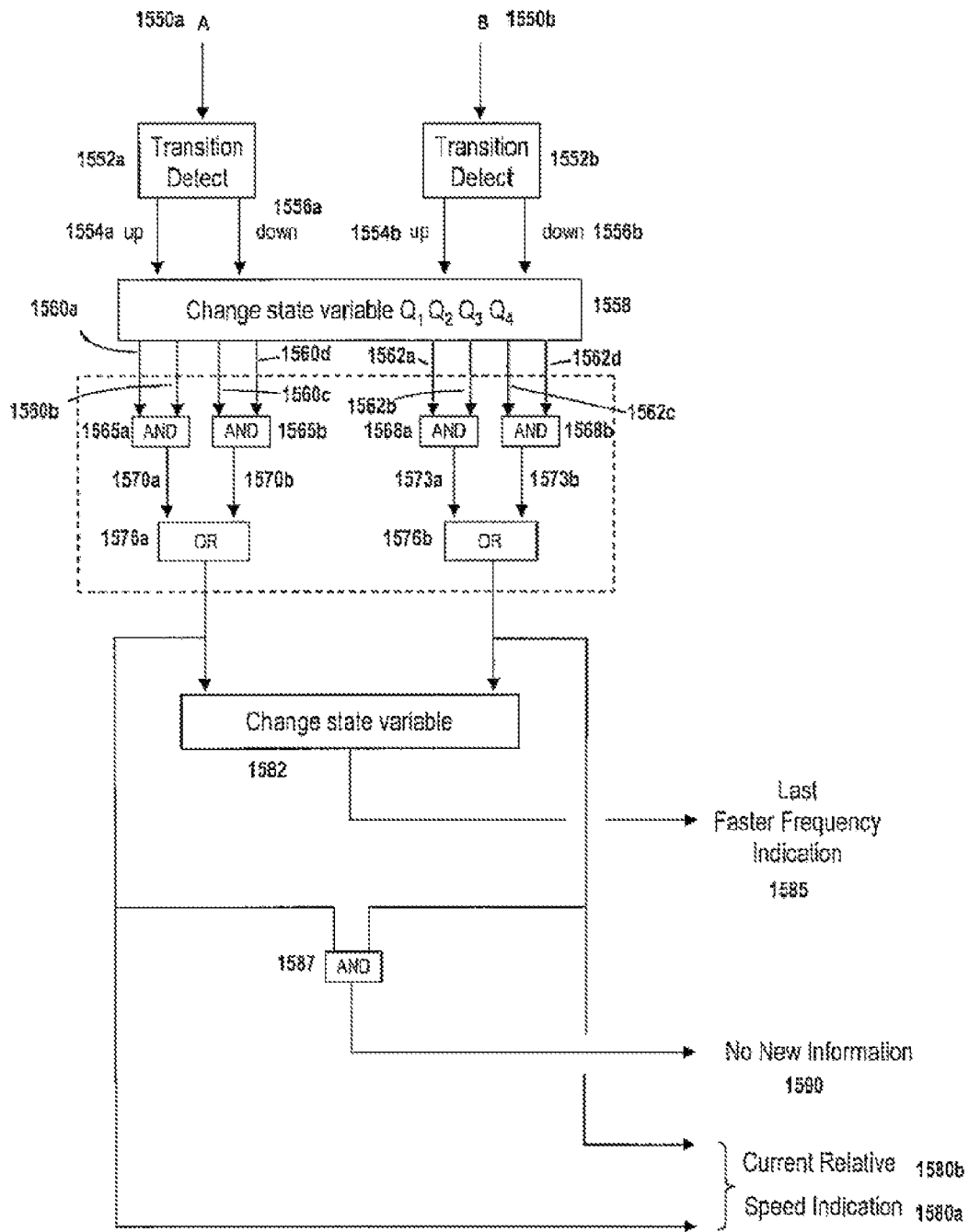
FIG. 15b illustrates an exemplary algorithmic embodiment of a transition-based embodiment of the invention.

The invention further provides for an algorithmic implementation of the symbol-based and transition-based embodiments presented earlier. As an example, FIG. 15*a* is a flow-chart depicting an exemplary algorithmic embodiment of a symbol-based implementation operating in a time-driven fashion as depicted in FIG. 1*f*.

The ongoing dataflow begins with comparison 1502 of the current values of applied input signals 1500*a*, 1500*b*. If these input signals can be successfully and unambiguously quantized 1504 into well-defined binary values 1508, the resultant pair of binary values 1508 (one for each input signal) are then converted 1510 to an appropriate "current symbol" {$S_0$, $S_1$, $S_2$, $S_3$} 1512 as described earlier and summarized in FIG. 2*c*.

This current symbol 1512 is compared 1514 to the previously stored value of the "previous symbol" 1513 to determine if current symbol 1512 has changed value since it was last stored. If it has not, no action is needed 1516 (although current symbol 1512 may overwrite the identical stored value of the previous symbol 1513 without consequence should that prove useful in an implementation).

If the symbol has changed 1518, the value of previous symbol 1513 is retained 1522 as the new value of a "legacy symbol" 1526, and the value of the current symbol 1512 is retained as the new value of the previous symbol 1513. The current symbol 1512 and the legacy symbol 1526 are compared 1530, and if they are identical, a symmetry event has occurred 1534. The particular symmetry event is determined 1538 by the value of the current symbol 1512 and the value of the previous symbol 1513; these may be used either to directly determine which applied signal has the higher frequency, or to compute 1538 a corresponding symmetry event "word" {$W_{01}$, $W_{02}$, $W_{10}$, $W_{13}$, $W_{20}$, $W_{23}$, $W_{31}$, $W_{32}$} 1540 which is subsequently interpreted 1542 to determine which applied signal has the higher frequency 1544*a*, 1544*b*.

An exemplary algorithmic embodiment of a transition-based implementation operating in a time-driven fashion as depicted in FIG. 1*f* follows directly from the operational sequence depicted in FIG. 11*f* and FIGS. 12*a*, 12*b*. This would be understood by one skilled in the art, but an exemplary algorithmic flow chart is provided in FIG. 15*b*. Referring to the figure, applied binary-valued input signals A 1550*a* and B 1550*b* are checked for transitions 1552*a*, 1552*b*, and any detected transitions 1554*a*, 1554*b* and 1556*a*, 1556*b* are used to change the binary state of four stored-value state variables $Q_1$, $Q_2$, $Q_3$, and $Q_4$ 1558 in a fashion consistent with that of FIG. 11*f* and FIG. 12.

These state variables are acted on by four AND operations 1565*a*-1565*b* and 1568*a*-1568*b*, collectively producing results 1570*a*, 1570*b*, and 1573*a*, 1573*b* corresponding to the $Q_1^A$ & $Q_2^A$, $Q_3^A$ & $Q4^A$, $Q_2^B$ & $Q_3^B$, $Q_2^B$ & $Q_4^B$ signals of FIG. 11*f*, and denoted as 1190*a*-1190*d*. These results are then applied to two OR gates 1576*a*, 1576*b*, producing pulsed indications of "A faster than B" and "EB faster than A" conditions 1580*a*, 1580*b*. These pulsed indications 1580*a*, 1580*b* are then applied 1582 to set the state of a stored-value state variable 1585 whose state denotes the last indication of which input signal A 1550*a* or B 1550*b* had the higher frequency. The pulsed indications are also directed to an additional AND operation 1587, producing a result 1590 indicating that "No New Information Available."

It is understood that a wide range of alternative realization techniques may be used to implement various aspects of the invention as described thus far, as well as additional aspects to be described in subsequent sections.

Extension to Three or More Input Signals

Provisions for handling three or more input waveforms are also possible and provided for by the invention. This may be done in a number of ways. In one approach, the input waveforms are compared for all possible pairs. The outcomes are then directed to additional logic operations or computations to identify which waveform is fastest, and potentially additional ordering information. For example, consider the case of four input signals A, B, C, D. Four signals compared two at a time in all combinations require (by standard combinatorial formulas) six comparisons. If the pairwise comparison outcomes are, for example, as follows:

(Frequency of C)>(Frequency of B)
(Frequency of C)>(Frequency of A)
(Frequency of C)>(Frequency of D)
(Frequency of B)>(Frequency of A)
(Frequency of B)>(Frequency of D)
(Frequency of A)>(Frequency of D)

then the overall uniquely determined result is:

$$\text{(Frequency of } C) > \text{(Frequency of } B) > \text{(Frequency of } A) > \text{(Frequency of } D). \quad \text{(Eq. 7)}$$

In this first ("all pairwise combinations") approach, for N input signals, the number of required frequency comparator stages grows as $N!/[(N-2)!2!]$ with increasing number of inputs N. In a second ("cascading") approach, the N input signals are separated into N/2 groups. If N is even, the N/2 groups will comprise N/2 pairs. If N is odd, the N/2 groups will comprise (N−1)/2 pairs plus one additional signal. Each of the input signal pairs is independently compared to choose the faster of each pair. The faster of each pair is passed to a subsequent stage where this process is repeated. A first stage will thus comprise on the order of N/2 frequency comparators, a second stage will comprise on the order of (N/2)/2N/4 frequency comparators, a third stage will comprise on the order of (N/4)/2=N/8 frequency comparators, and so on. In this approach, for N input signals, the number of required frequency comparator stages grows roughly as N log.sub.2N. For N>6, the second approach is of less complexity, particularly if N is reasonably large. For N=20 the second approach has about half the complexity of the first approach, for N=40 the improvement is by a factor of approximately three, and for N=100 the improvement is by a factor greater than seven.

Figure 16A:
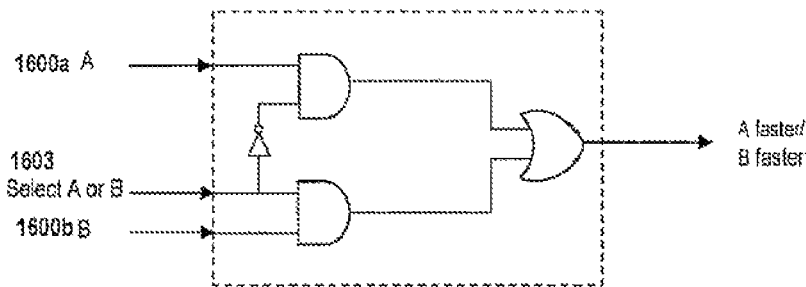
FIGS. 16a-16c illustrate examples of how frequency comparator technology may be extended to handle more than two input signals, as provided for by an embodiment of the invention.

FIG. 16a illustrates an exemplary circuit that propagates selected input 1603 from a pair of applied inputs 1600a, 1600b based on the outcome of a frequency comparator. When the pair of applied inputs 1600a, 1600b is the same as applied to the frequency comparator, the circuit will propagate the input signal of faster frequency (or slower frequency, depending upon the connections and logic value assignments).

Figure 16B:
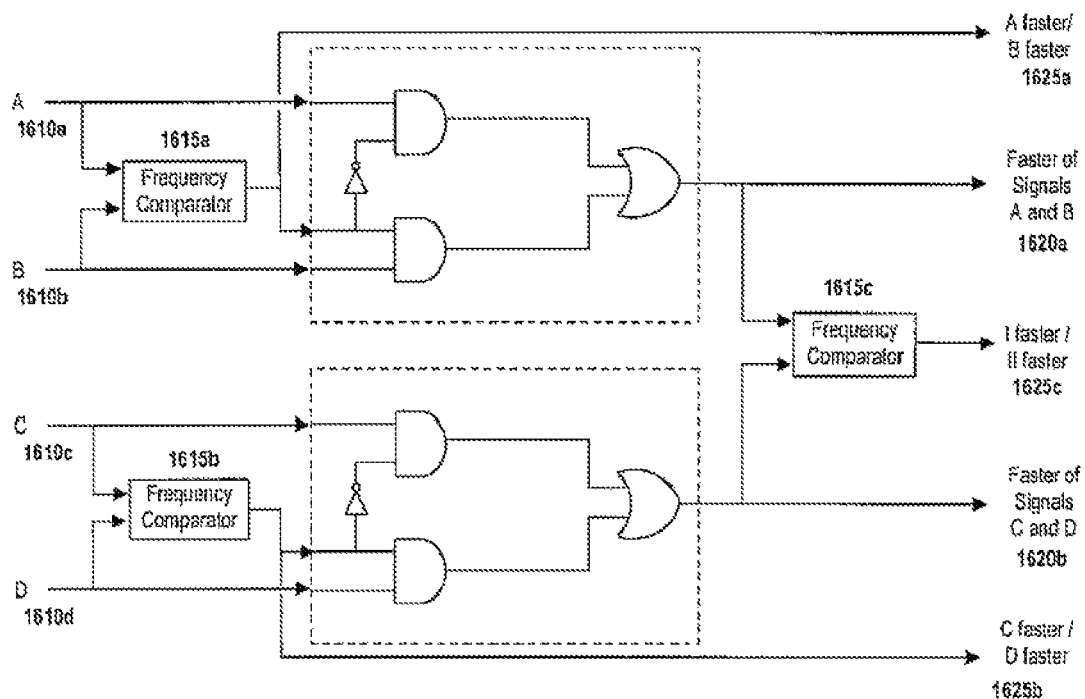

FIG. 16b shows this arrangement being used with three frequency comparators 1615a-1615c to identify the fastest of four input signals 1610a-1610d. The results shown provide the faster of each pair of comparisons 1620a, 1620b and a logical indication 1625a-1625c as to which of these is faster; these may be used directly if valuable in that form or be directed to a subsequent instance of the circuit of FIG. 16a to deliver the fastest (or in a complementary implementation, slowest) input signal. Alternatively, the logical indication as to which input of each pair is faster may be subjected to logical processing along with the output of the last frequency comparator to logically identify which of the four signals 1610a-1610d is faster.

Figure 16C:
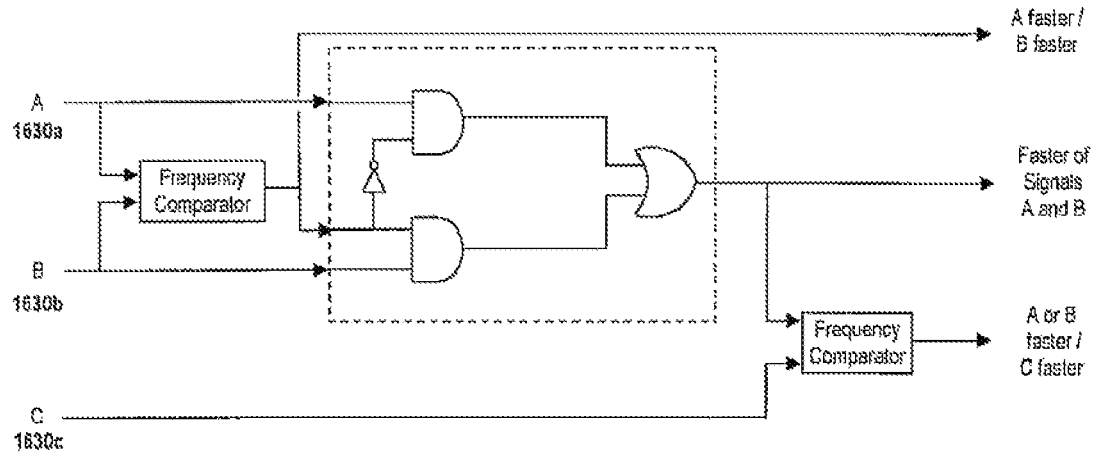

FIG. 16c shows a similar arrangement for the case of three input signals 1630a-1630c. In this fashion, one or more instances of the circuits of FIGS. 16a-16c may be ganged in various combinations to realize a circuit implementation of the second cascading approach.

View of Square Wave Pair Dynamics as Symbolic Dynamics

Symbolic dynamics, also known as topological dynamics, is a rich area of nonlinear science. Embodiments of the invention provide for symbolic dynamics [1-6] interpretations of the dynamics of a square wave pair. Such interpretations may be used as a design tool, as a means for creating additional applications, and as a means for extending functionality. In fact, the symbolic dynamics framework is an excellent setting in which to define and explain many aspects of the invention. Only a very small amount of the symbolic dynamics formalism, and practically none of the extensive theory, is necessary to obtain a useful engineering framework. This section presents the relevant, adapted, and interpreted material.

Figure 17:
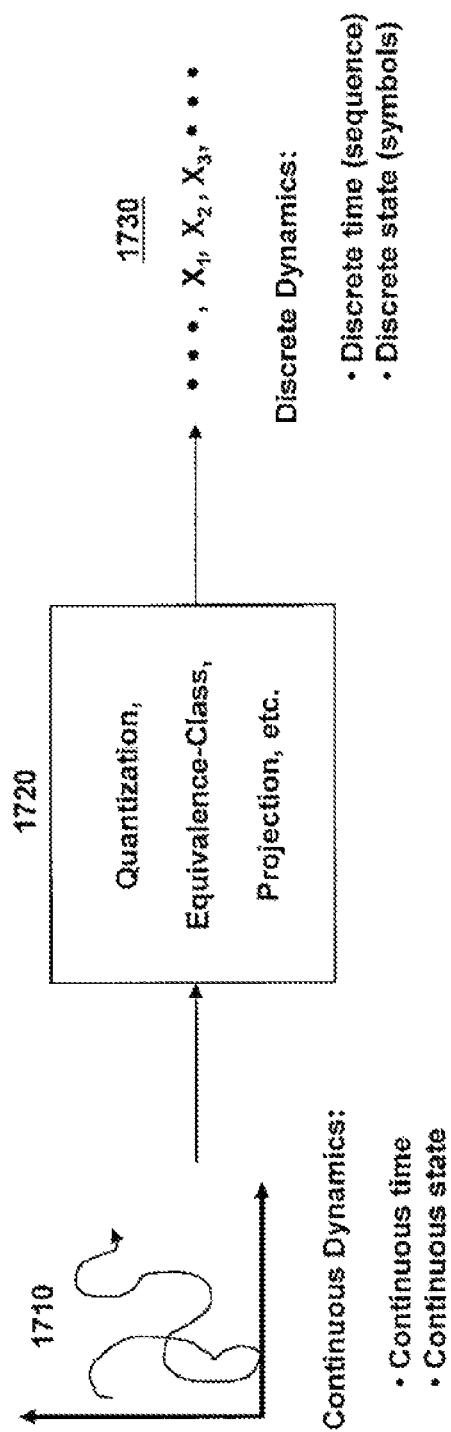
FIG. 17 illustrates a descriptive representation of how a continuous-time/continuous-state dynamical system may be collapsed into a discrete-time/discrete-state dynamical system, relevant in the setting of symbolic dynamics (also known as topological dynamics).

FIG. 17 shows one general setting in which to think of a symbolic dynamics system [6 (page 1)], although many others, often far more mathematically abstract, are commonly accepted [3,4,5]. In one version, a continuous-valued time, continuous-valued state dynamical system 1710 has its state quantized, mapped to equivalence classes of states, projected onto a smaller collection of states, etc. 1720; all of these result in a small collection of discrete states (called symbols) which are arranged in a (discrete-time) sequence 1730. The result is an overall mapping of the continuous-valued time, continuous-valued state dynamical system 1710 to a discrete-valued time, discrete-valued state (a.k.a. symbols) dynamical system 1730. Equivalent discrete-valued time, discrete-valued state dynamical systems may model computers, machines, natural phenomena, etc., as well as equivalent abstract discrete-valued time, discrete-valued state dynamical systems which are purely mathematical. At a common level of abstraction, all of the equivalent forms may be thought of as identical. The study of the dynamics and other properties of such discrete-valued time, discrete-valued state dynamical systems is found in the subject of symbolic dynamics.

For the purposes of studying pairs of oscillators, some of the modeling machinery of symbolic dynamics is helpful. FIGS. 18a-18c illustrate a torus model for the state-space of two continuous-valued oscillators. Here the periodic oscillations of one oscillator 1810a-1810c are represented as periodic motion in a vertical circle, while the periodic oscillations of second oscillator 1820a-1820c are represented as periodic motion in a horizontal circle.

As shown in FIG. 18a, the combinations of the circular patterns in general sweep out the donut/bagel shape of torus 1830. If one associates the periodic timekeeping within each period of each oscillator with a moving point in the circular motion, and keeps track of this moving point for the combined pair of oscillators, the center of one circle is centered at the location of the moving point of second circle 1825 in FIG. 18a in a manner similar to adding the components of orthogonal vectors. This is illustrated in FIG. 18b, and as the moving points of each oscillator actually move, a trajectory is traced out along the surface of torus 1840 as illustrated in FIG. 18c.

If one of the oscillators is faster than the other, it will wrap around the surface of the torus faster in its rotation direction than will that of the other oscillator. Note that all that is needed of the torus/donut/bagel 1830 is its surface, and its interior is, for present purposes, hollow. In more formal terms this torus surface 1830 represents a continuous-value state, continuous-valued time dual oscillator manifold, often used to describe or study uncoupled and coupled linear and non-linear differential equations and other systems.

Figure 19A:
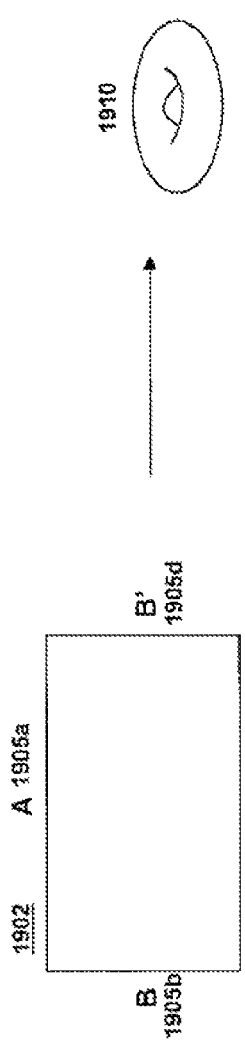
FIGS. 19a-19d illustrate how different integer frequency ratios between the two oscillators of FIGS. 18a-18c result in differing wrapping characteristics and trajectory slopes, employing a view of the torus as joined edges of a flat tile.

In another view, shown in FIG. 19a, a hollow tubular torus/donut/bagel 1910 may be cut once in each of the two orthogonal directions and flattened out. Flattened torus surface 1902 comprises four edges 1905a-1905d resulting from the two aforementioned cuts.

If edge A' 1905c is rejoined, or abstractly identified, with edge A 1905a and, similarly, edge B' 1905d is rejoined or abstractly identified with edge B 1905b, torus 1910 can be readily reconstructed.

Figure 19B:
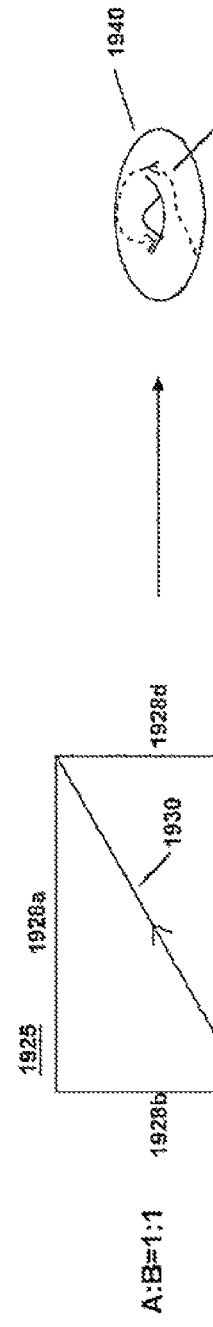

If both oscillators oscillated at precisely the same frequency and started in a lower corner of flattened torus 1925, the composite state trajectory would move along diagonal line 1930 over time up to the far opposite corner. This traces out a connected winding path 1935 around the torus 1940 comprising exactly one wrap in each direction, This is depicted in FIG. 19b. As time continues past the duration of one period, the curve repeats, and the flattened torus corresponds to starting over again at the original comber mentioned above.

Figure 19C:
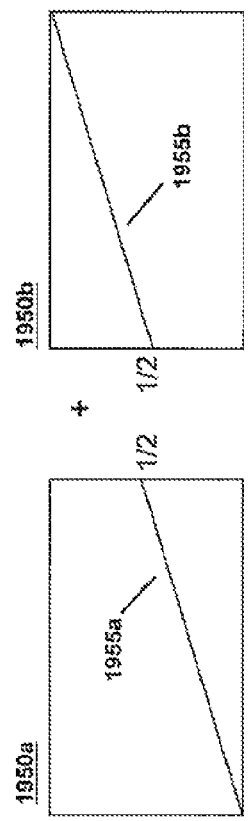
Figure 19D:
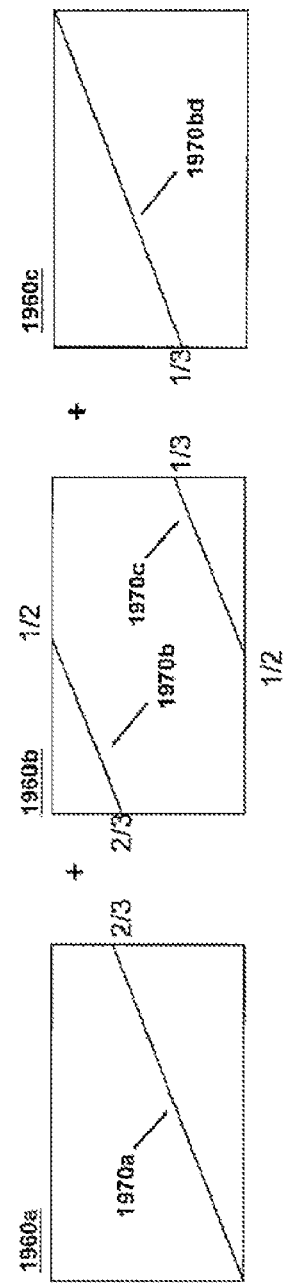

If the two oscillators oscillate at different frequencies, more complicated windings occur. For example, if the oscillator corresponding to the horizontal direction oscillates at twice the frequency of the oscillator corresponding to the vertical direction, the torus will be wrapped with two turns in one direction and one turn in the other direction; the corresponding paths 1955a, 1955b on flattened torus 1950a, 1950b appear as shown in FIG. 19c. Similarly, if the oscillator corresponding to the horizontal direction oscillates at three times the frequency of the oscillator corresponding to the vertical direction, the torus will be wrapped with two turns in one direction and one turn in the other direction; the corresponding paths 1970a-1970d on the flattened torus 1960a-1960c appear as shown in FIG. 19d. The various copies 1950a, 1950b, and 1960a-1960c of the flattened torus surface depicted in FIGS. 19c and 19d may be lined up side-by-side, like flooring or wall tiles, and the trajectory can be connected to form an uninterrupted path. This "tiled" representation may be thought of as an unwrapped version of the wrapped trajectories on the surface of the unflattened torus.

The trajectories depicted in FIGS. 19b-19d show cases where the ratio of frequencies is exactly the ratio of two integers. This causes the trajectory to always eventually meet back up where it started from and repeat the pattern. The number of cycles involved for the repeat involves the least common multiple of the two frequencies. More formally, the trajectories depicted in the examples of FIGS. 19b-19d correspond to oscillator trajectories on manifolds for phase-locked, rational-valued frequency ratios of the two oscillators. In cases where the ratio of frequencies cannot be expressed as a ratio of integers (i.e., as a rational number), the trajectory path on the torus never crosses itself.

Additionally, FIGS. 19c, 19d illustrate how different integer frequency ratios between the two oscillators of FIGS. 18a-18c result in differing wrapping characteristics and trajectory slopes.

This arrangement for abstracting the dynamic behavior of pairs of square waves can, in this way, be related to models of a dynamical system that, as a function of frequency ratio, produces either:

- a regular ("self organizing") pattern for so-called "commensurate" frequencies (i.e., the frequency ratio is a rational number), or
- an irregular pattern (i.e., "quasi-periodic" or "chaotic" behavior) for "incommensurate" frequencies (i.e., the frequency ratio is not a rational number).

These patterned behaviors of periodic binary waveforms for frequencies very close together, for frequencies related to these via aliasing phenomena, and/or waveforms comprising asymmetric pulses exhibit very interesting and complex attributes, yet are characterizable enough to be able to facilitate informative measurements with simple circuitry or algorithms as seen thus far and in the material to follow.

Figure 20:
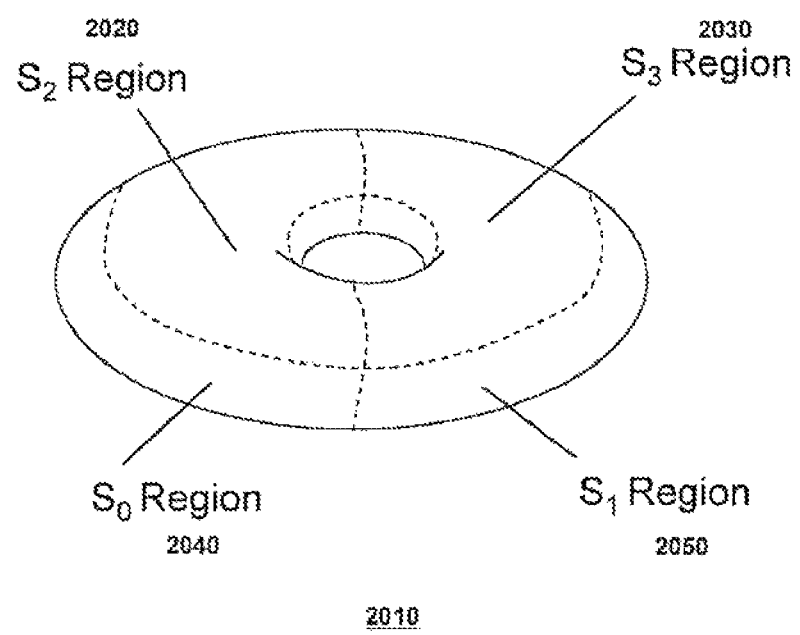
FIG. 20 illustrates how the torus of FIGS. 18a-18c and 19a-19b may be symmetrically quantized into regions associated with the symbols employed by the invention, In particular, the symmetric quantization corresponding to the case where the input signals are symmetric square waves is depicted.

FIG. 20 illustrates how the torus of FIGS. 18a-18c and FIGS. 19a, 19b may be symmetrically quantized into regions associated with the symbols employed by the invention. In particular, the symmetric quantization corresponding to the case where the input signals are symmetric square waves is depicted. The square wave model is naturally obtained by quantizing the continuous-value continuous-time oscillator torus manifold 2010 into four regions 2020, 2030, 2040, and 2050 corresponding to the symbols $\{S_0, S_1, S_2, S_3\}$ as shown in FIG. 20.

Portions of trajectory paths on the torus surface (manifold) may then be characterized according to which of the quantized sections they lie in, each corresponding to the symbols $\{S_0, S_1, S_2, S_3\}$. Referring to the left side 2020, 2040 of torus 2010 of FIG. 20, oscillations occurring only in horizontally-oriented loops (corresponding to, for example, oscillator A) alternate between symbols $S_0$ and $S_2$ while oscillations occurring only in horizontally-oriented loops on the right side 2030, 2050 of torus 2010 alternate between symbols $S_1$ and $S_3$. Similarly, oscillations occurring in vertically oriented loops (corresponding to, for example, oscillator B) alternate between symbols $S_0$ and $S_1$ in the lower portion 2040, 2050 of torus 2010 and between symbols $S_2$ and $S_3$ in the upper portion 2020, 2030 of torus 2010.

With both oscillators A and B active, the trajectories may then cross through all four sections 2020, 2030, 2040, 2050, generating an event-driven symbol sequence having the symbols $\{S_0, S_1, S_2, S_3\}$. As a trajectory progresses from section to section, it may be thought of as generating an event-driven symbol sequence comprising one or more of the symbols $\{S_0, S_1, S_2, S_3\}$) In this way, this embodiment of the invention can be viewed in the more formal symbolic/topological dynamics context. This model is referred to herein as the "quantized-symbol torus model."

With this quantized-symbol torus model established, a corresponding infinite periodic symbol tiling model is next developed.

In FIGS. 19a, 19b the surface of torus 1910, 1940 is represented as a flattened tile 1902, 1925 with edges 1905a-1905d, 1928a-1928d that are identified together so that a trajectory crossing a location of one edge reappears at the corresponding spot on the directly opposite edge. In FIGS. 19c-19d, a trajectory passing over the surface of the torus in differing ways was represented on a sequence of tiles 1950a-1950b, 1960a-1960c. A general way to study complex wrappings of trajectories on the surface of a torus is that of a "tiling," wherein a sequence of adjacent images of tiles, each corresponding to a full copy of the surface of the torus, are arrayed edge-to-edge in a mosaic or grid.

In FIGS. 19b-19c, trajectories relating to oscillations with a fixed frequency ratio appear as straight lines 1955a, 1955b, and 1970a-1970d on each tile 1950a, 1950b, and 1960a-1960c. Edge A' 1905c is identified with edge A 1905a of the same square and edge B' 1905d is identified with edge B 1905b of the same square 1902 to form torus 1910. Alternatively, each edge A' of a particular square may be identified with an edge A of a different neighboring square to the right, and each edge B' of a particular square may be identified with an edge B of a different neighboring square above. This forms a tiling (more precisely, an infinite periodic tiling). Neighboring tiles may extend without bound in both vertical and horizontal directions, and thus trajectories relating to oscillations with a fixed frequency ratio appear as straight lines over the sequence of tiles.

Figure 21A:
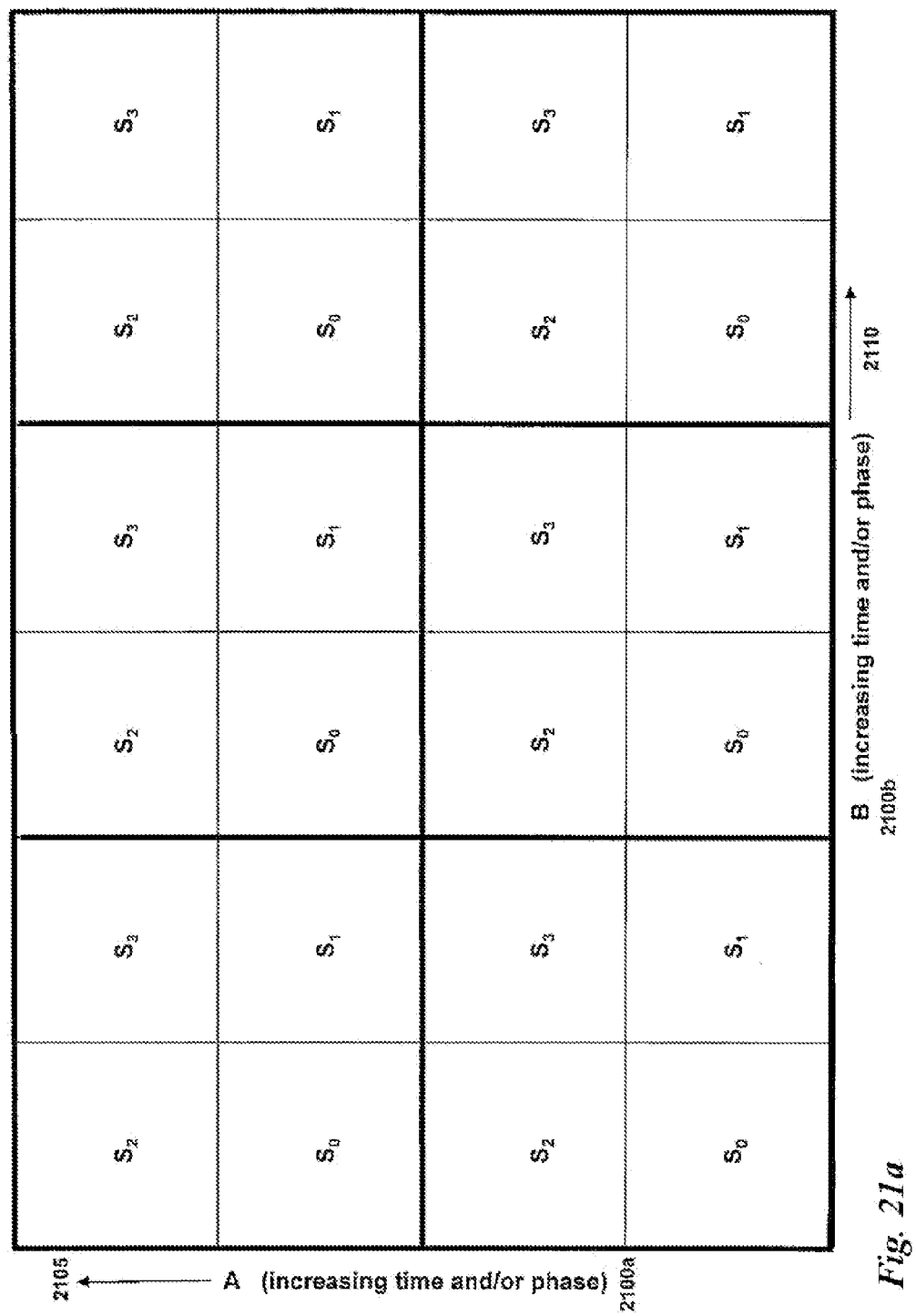
FIG. 21a illustrates a sequential tiling representation of the symmetrically quantized torus of FIG. 20, wherein motion in the vertical direction represents time and/or phase of one oscillator and motion in the horizontal direction represents time and/or phase of the other oscillator.

Such an infinite periodic tiling may be further adapted to include the four regions of the symmetrically quantized torus 2010 of FIG. 20. FIG. 21a illustrates a sequential tiling representation of the symmetrically quantized torus 2010 of FIG. 20, wherein motion in the vertical direction 2105 represents time and/or phase of one oscillator 2100a, and motion in the horizontal direction 2110 represents time and/or phase of the other oscillator 2100b.

Each tile of the full torus surface is indicated with a thick line boundary and is symmetrically subdivided into four separate areas. These subdivided areas within each of the full torus-surface tiles will be termed "symbol tiles." In the vertical direction, there are two alternating types of columns, one that sequences between $S_o$ and $S_2$ symbol tiles, and another that sequences between $S_1$ and $S_3$ symbol tiles. In the horizontal direction, there are two alternating types of rows, one that sequences between $S_0$ and $S_1$ symbol tiles and another that sequences between $S_2$ and $S_3$ symbol tiles. This model will be termed the "infinite periodic quantized-symbol tiling model." In this model, the arc-length of the trajectory corresponds linearly to measured time. Thus for a trajectory with a slope of 2, oscillator A 2100a changes symbol tiles at twice that of oscillator B 2100b.

With both oscillators A 2100a and B 2100b concurrently active, the trajectories in this model may then cross through any of the symbol tiles, and in this fashion may be seen as generating an event-driven symbol sequence comprising the symbols $\{S_0, S_1, S_2, S_3\}$ corresponding to those generated as a trajectory wraps around the torus.

Figure 21B:
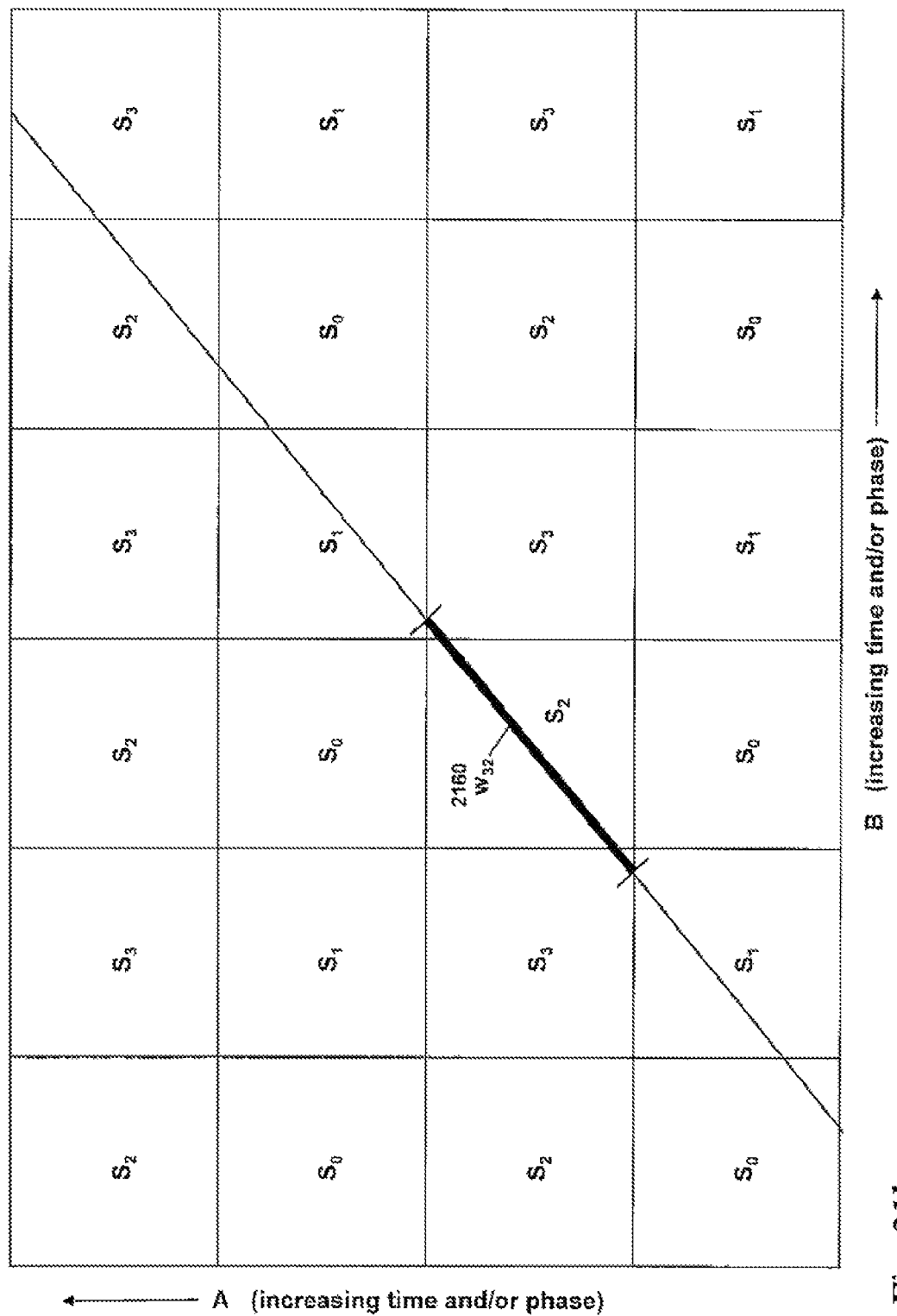
FIG. 21b illustrates an exemplary trajectory on the sequential tiling representation of FIG. 21a and the identification of an exemplary symmetry event.

FIG. 21b illustrates an exemplary trajectory on the sequential tiling representation of FIG. 21a. For visual simplification, the thicker boundaries have been equated to the other boundaries so that all boundaries are symbol tile boundaries. If the trajectory slope is not unity and the ratio of frequencies is not exactly that of two integers, symmetry events will occur in the sequence of crossings of symbol tiles, FIG. 21b thus additionally depicts the identification of an exemplary symmetry 2160 that is intrinsic to the exemplary trajectory.

As a side note, the boundaries of the symbol tiles are those of symbol boundaries; thus a symbol tiling represents an event-driven model. It is also possible to create tilings corresponding to time-driven models, but such would amount to simply a histogram of the frequency ratio. A discrete-time time-driven model would also have to confront the complications of sampling at the "forbidden" state transitions where a trajectory simultaneously changes a symbol tile in both the vertical and horizontal directions. In the physical world, the effects of temporal race conditions, mechanical non-uniformity, and the like essentially male the "forbidden" state transitions a theoretical pathology.

Figure 22:
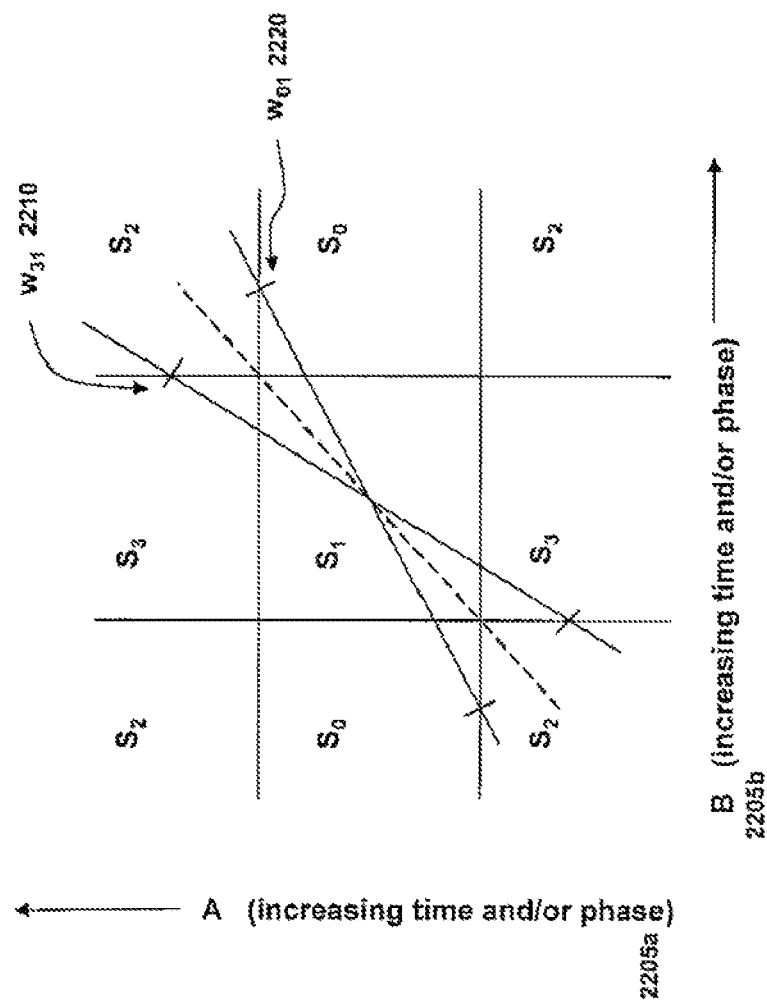
FIG. 22 illustrates how varying the slope of the trajectory on the sequential tiling, the slope determined by the ratio of the frequencies of the two oscillators, to values above or below unity, results in differing symmetry events each giving complementary indication as to which oscillator has the higher frequency.
Figure 23:
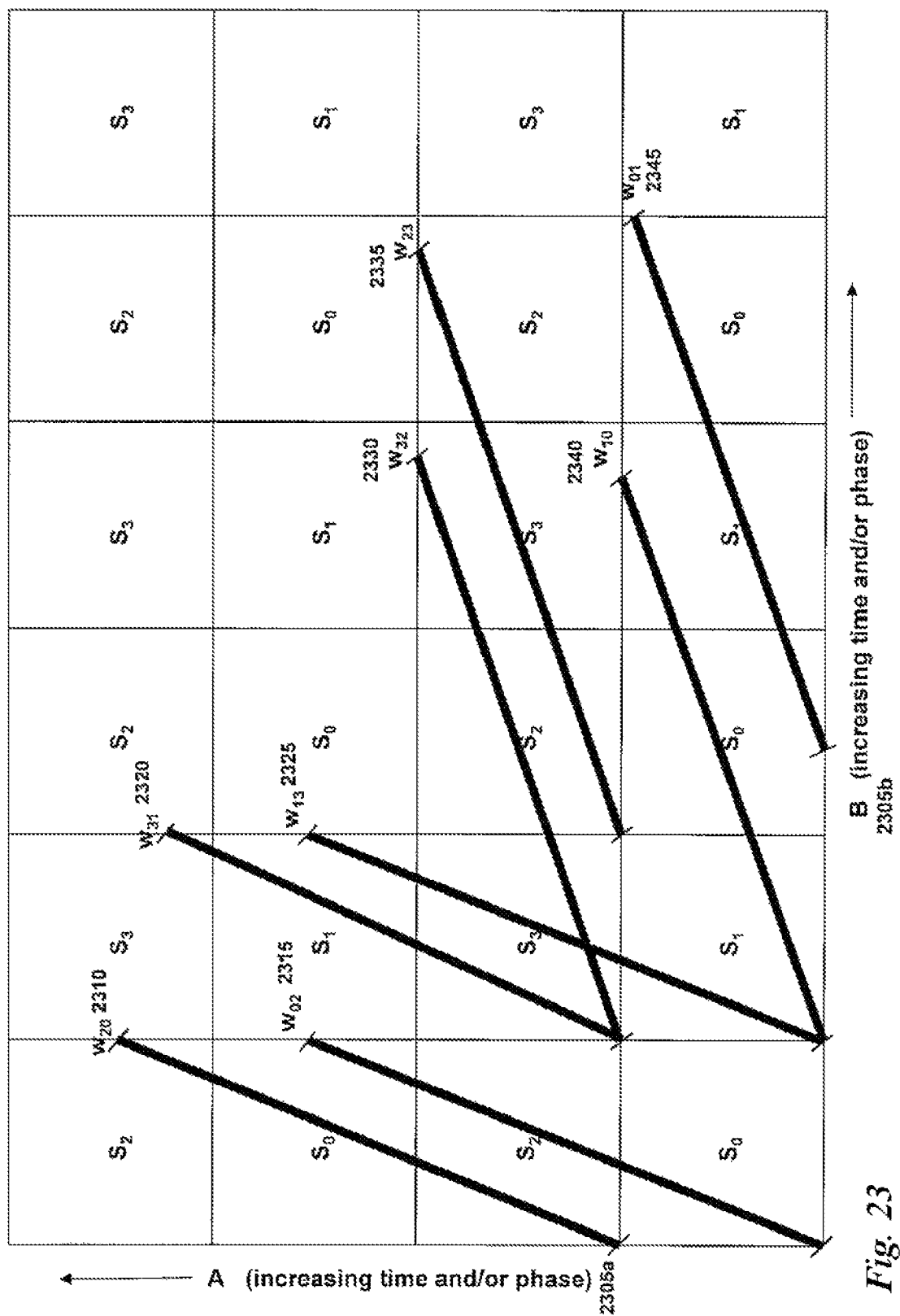
FIG. 23 illustrates exemplary portions of trajectories associated with each of the eight symmetry events associated with an embodiment of the invention. The four symmetry events on trajectories with slopes greater than unity are uniquely associated with one oscillator being faster, while the four symmetry events on trajectories with slopes less than unity are uniquely associated with the other oscillator being faster.

Continuing the study made possible by the infinite periodic quantized-symbol tiling model, FIGS. 22 and 23 illustrate how varying the slope of a trajectory, the slope determined by the ratio of the frequencies of the two oscillators, changes the class of incurred symmetry events.

FIG. 22 shows a trajectory with slope greater than unity incurring a $w_{31}$ symmetry 2210, as well as a trajectory with slope less than unity incurring a $w_{01}$ symmetry event 2220. Referring to the table of FIG. 3b, the $w_{31}$ symmetry 2210 implies oscillator A 2205a is faster than B 2205b, while the $w_{01}$ symmetry 2220 implies oscillator B 2205b is faster than A 2205a, in agreement with the situation depicted in FIG. 22.

In general, as the trajectory slope attains values above or below unity, differing classes of symmetry events occur. Each of the resulting two symmetry event classes yields a complementary indication as to which oscillator has the higher frequency. As to this, FIG. 23 illustrates exemplary portions of trajectories associated with each of the eight symmetry events according to an embodiment.

Referring again to the table of FIG. 3b, the four symmetry events $w_{02}$ 2315, $w_{13}$ 2325, $w_{20}$ 2310, $W3_1$ 2320 incurred on trajectories with slopes greater than unity are uniquely associated with oscillator A 2305a being faster than B 2305b, while the four symmetry events $w_{01}$ 2345, $w_{10}$ 2340, $w_{23}$ 2335, $w_{32}$ 2330 incurred on trajectories with slopes less than unity are uniquely associated with oscillator B 2305b being faster than A 2305a.

Figure 24:
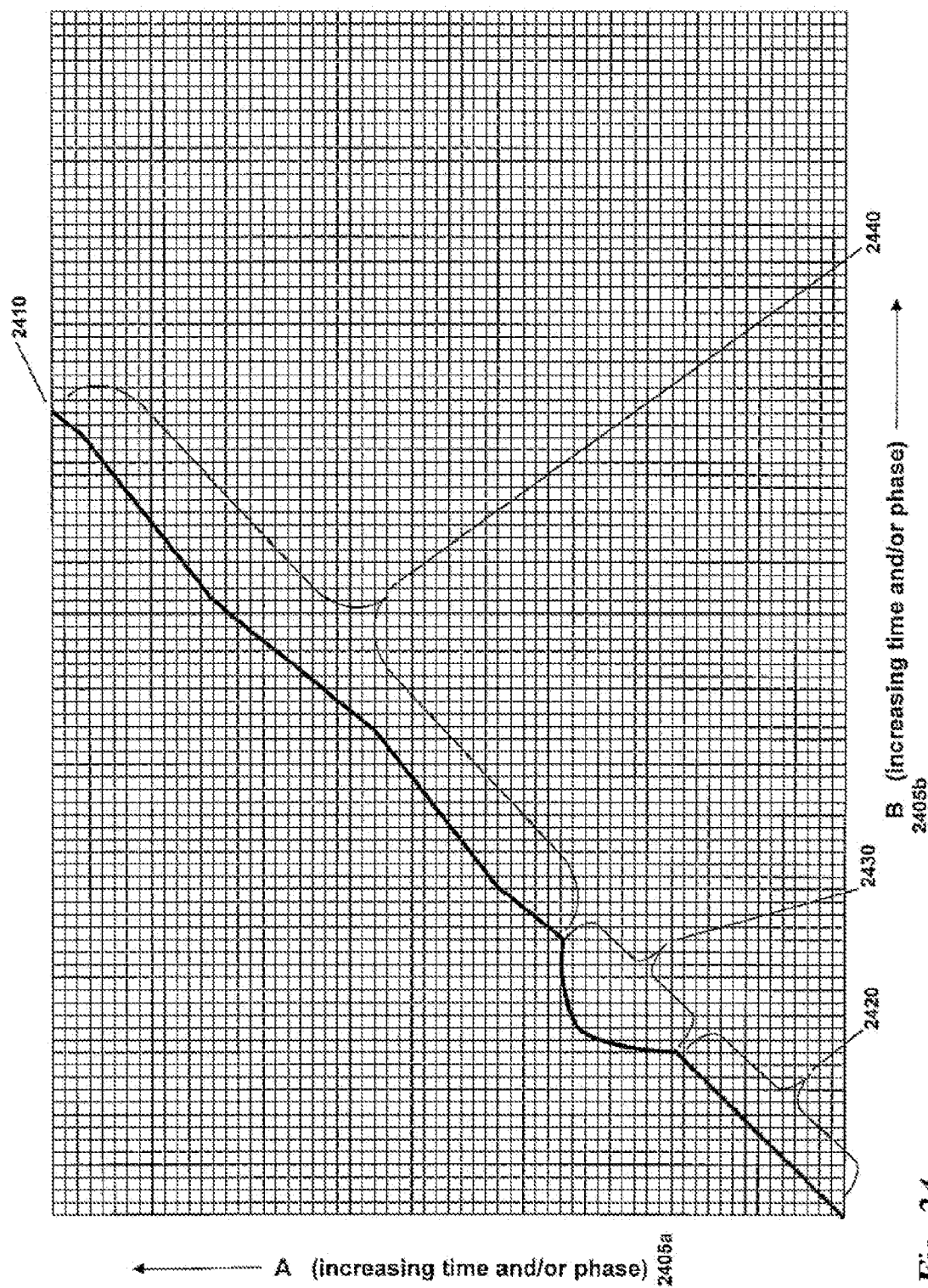
FIG. 24 illustrates a larger scale view of a portion of a trajectory of an exemplary pair of waveforms whose relative ratio of oscillating frequencies varies in some intervals in time.
Figure 25A:
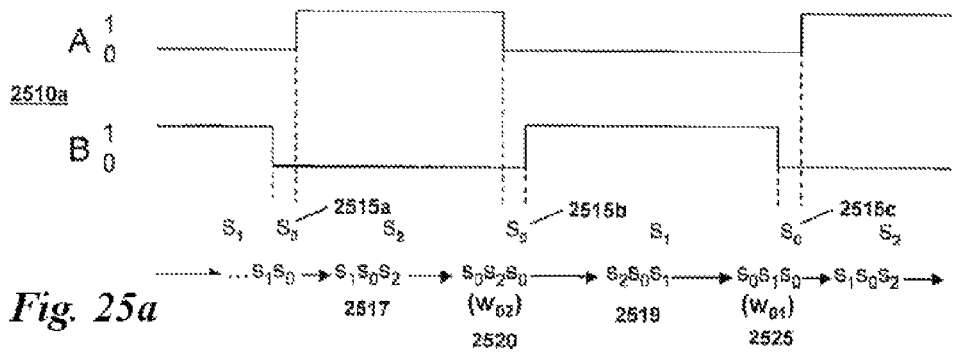
FIGS. 25a-25d illustrate exemplary symbol generation phenomena resulting from applying asymmetric pulse waveforms as input signals. In particular, such input waveform asymmetry, when applied to implementations of the invention designed specifically for symmetric input waveforms, can create problematic alternating indications that each of the oscillators is faster than the other when the two oscillator frequencies are sufficiently close together.
Figure 25B:
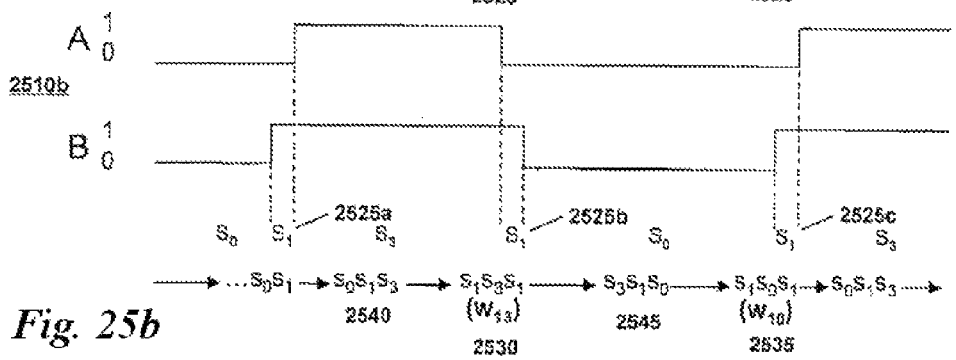
Figure 25C:
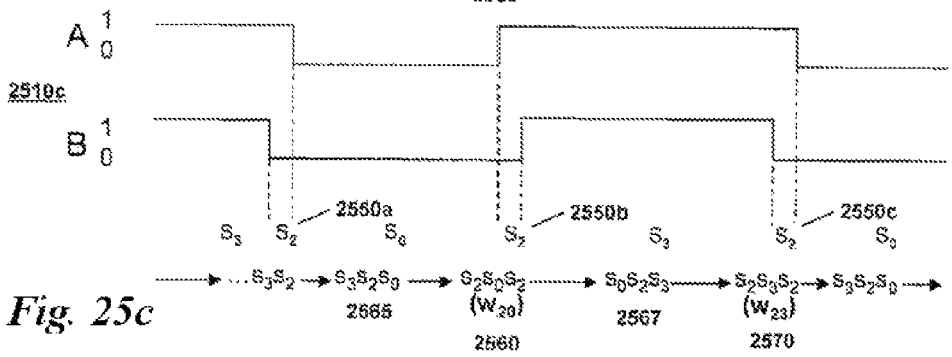
Figure 25D:
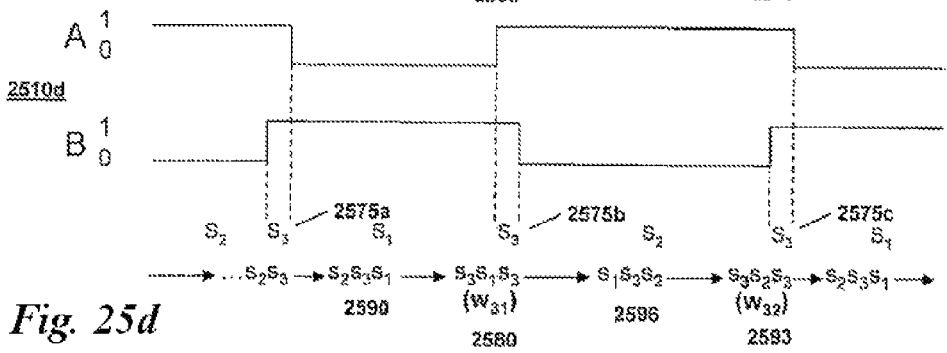

FIG. 24 illustrates a larger scale view of a portion of a trajectory of an exemplary pair of waveforms 2405a, 2405b whose relative ratio of oscillating frequencies varies in some interval in time. Here, exemplary trajectory 2410 varies through the infinite periodic tiling representation as the ratio of the frequencies of the two oscillator systems 2405a, 2405b vary over time.

Several phenomena are depicted. Note the scale of the view is considerably larger, and each square represents an individual symbol tile, here unmarked for the sale of clarity. First exemplary trajectory 2410 experiences an epoch of time during which the two oscillators 2405a, 2405b experience a fixed frequency ratio 2420, then an epoch with a meandering ratio 2430, and then an epoch of piecewise-constant periodic modulation 2440. Other frequency-related trajectory phenomena, particularly those pertaining to frequency modulation and phase modulation, and the like can be depicted, noting that frequency modulation is time-differentiated phase modulation while phase modulation is time-integrated frequency modulation.

Asymmetric Pulse Waves and Their Symbolic Dynamics Phenomena

Many common oscillators constructed from feedback loops introduced around logic gates (for example, CMOS inverter gates) produce slightly asymmetric waveforms which differ in duty-cycle from that of complete symmetry (50%) by values such as 3% or more. In practice, all square wave oscillators will produce binary-valued waveforms that are at least slightly asymmetric.

Additionally, when the frequency of a square wave oscillator is modulated, asymmetries in pulse width are introduced as the waveform period expands or contracts. If the frequency is modulated rapidly with respect to the oscillator frequency or with large modulation index, these asymmetries can be significant. If the frequency is modulated relatively slowly with respect to the oscillator frequency or with a large modulation index, the asymmetries are insignificant.

When an asymmetric input binary-valued pulse waveform is sufficiently close in frequency to that of another waveform to which it is compared, a number of additional phenomena can occur:

the narrower portion of one asymmetric square wave experiences an enveloping event with respect to either:
  symmetric portions of a fully symmetric ideal compared square wave, or
  the wider portion of the other compared asymmetric square wave;
the wider portion of one asymmetric square wave experiences an enveloping event with respect to either:
  symmetric portions of a fully symmetric ideal compared square wave, or
  the narrower portion of the other compared asymmetric square wave.

These additional phenomena can confuse the methods described thus far.

The degree to which this situation can even occur is bounded by how close the waveforms are in frequency and how asymmetric each of the waveforms is. In cases where the frequencies of two compared waveforms are close enough to create these phenomena, a natural solution for many applications is to employ toggle flip-flops to homogenize the symmetry as described earlier in conjunction with FIG. 5c. However, various types of asymmetric conditions and the phenomena they induce can be readily detected, and in many cases adverse effects may be readily corrected. This section considers extensions that handle asymmetric binary-valued pulse waveforms.

To begin, FIGS. 25a-25d illustrate exemplary phenomena pertaining to the symbolic dynamics of asymmetric binary-valued pulse waveforms. Such input waveform asymmetry, when applied to implementations of the invention designed specifically for symmetric input waveforms, can create problematic alternating indications that each of the oscillators is faster than the other when the two oscillator frequencies are sufficiently close together.

Referring to these figures, four cases (polarity combinations) of asymmetric pulse waves of almost the same frequency and almost the same (asymmetric) duty-cycle 2510a-2510d are shown. As may be seen in these figures, asymmetric pulse waveforms have unique signature events as well, expressible in terms of "signature" sequences of symmetry events: if the enveloping event resulting from the asymmetry involves brief flashes of the S0 symbol 2515a-2515c, there will be a sequence of $w_{01}$ 2525 and $w_{02}$ 2520 symmetry events separated by one non-symmetry 2517, 2519.

If the enveloping event resulting from the asymmetry involves brief flashes of the $S_1$ symbol 2525a-2525c, there will be a sequence of $w_{10}$ 2535 and $W_{13}$ 2530 symmetry events separated by one non-symmetry 2540, 2545.

If the enveloping event resulting from the asymmetry involves brief flashes of the $S_2$ symbol 2550a-2550c, there will be a sequence of $w_{20}$ 2560 and $W_{23}$ 2570 symmetry events separated by one non-symmetry 2565, 2567.

If the enveloping event resulting from the asymmetry involves brief flashes of the $S_3$ symbol 2575a-2572c, there will be a sequence of $w_{31}$ 2580 and $w3_2$ 2593 symmetry events separated by one non-symmetry 2590, 2596.

Note the pairs of symmetry events in each list item are complementary in that the first symmetry event implies one oscillator would be faster if its pulse waveform were symmetric, while the other symmetry event implies the opposite. Without special considerations, then, these phenomena create problematic alternating indications that each of the oscillators is faster when the frequencies are close enough that slight asymmetries in the input waveforms are within the measurement capture range of the aforementioned implementations.

Several additional interesting algebraic relationships are also inherent in the above list of observations. Additionally, if the frequencies of the two square waves are very close, the sequence will repeat in an alternating pattern for two or more times, the number of times increasing monotonically as the frequencies become even closer to being identical. Further, each of the conditions in the above list individually identifies a particular type of relative asymmetry inherent in the pair of waveforms. These facts, and similar ones resulting from other cases (more divergent asymmetry, one waveform essentially symmetric while the other is asymmetric, etc.) may be used to create additional circuitry or algorithms to isolate and indicate these events, unique to the asymmetries involved. Additionally, once tile asymmetries are detected, the phenomena that would otherwise produce a con-fused outcome for the circuitry and algorithms can be used to produce definitive frequency comparison outcomes, and even provide additional information characterizing categorical details of the asymmetries.

Figure 26:
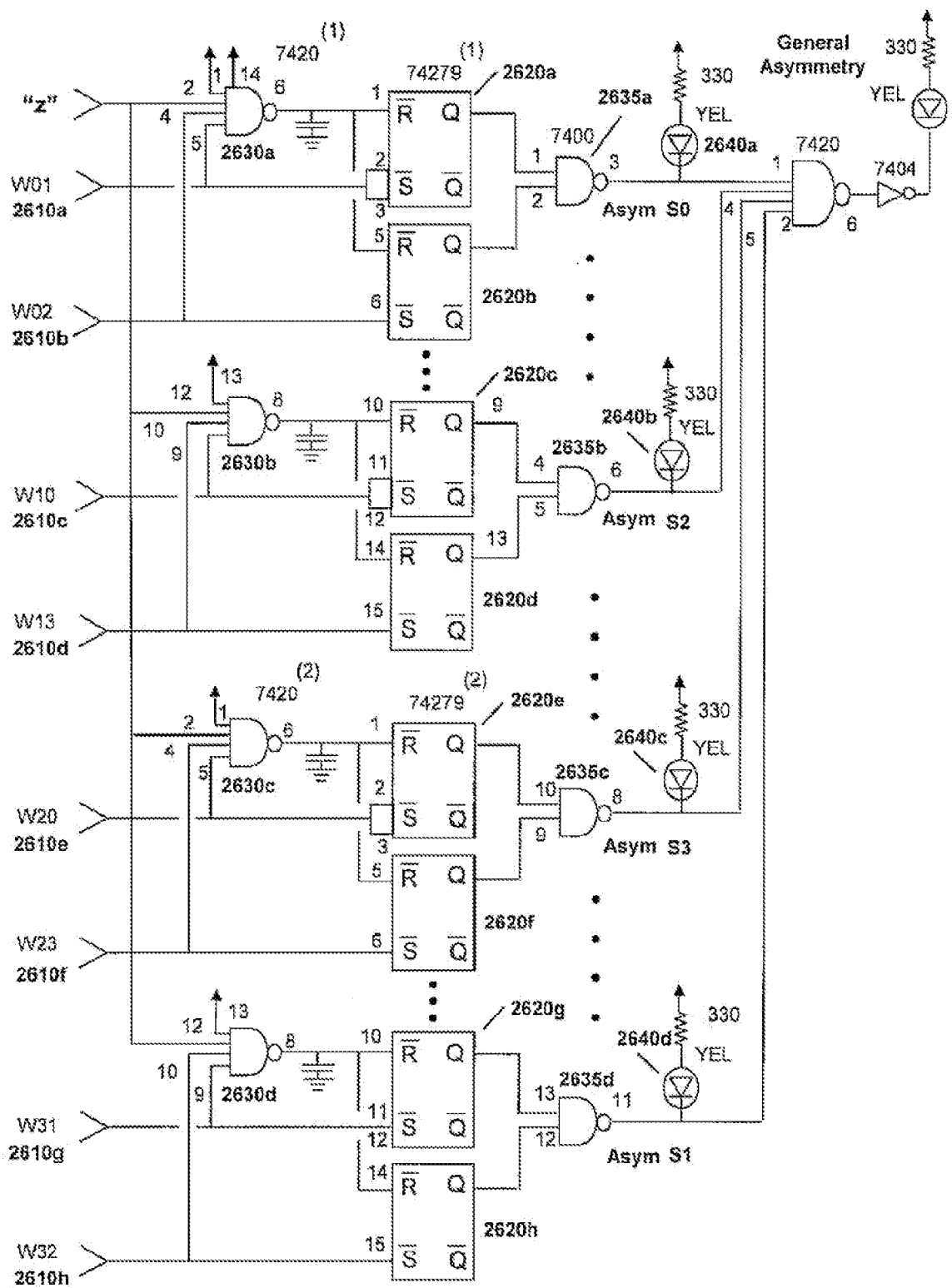
FIG. 26 illustrates adaptations to the exemplary symbol-based embodiment of FIGS. 8a-8c that provides for the handling of asymmetric pulse waveforms.

An example is provided in FIG. 26, which illustrates an exemplary adaptation made to the symbol-based embodiment of FIGS. 8a-c to handle asymmetric pulse waveforms. Following from the list provided above, a first pair of RS latches 2620a, 2620b are configured to set when a sequence of $w_{01}$ 2610a and $w_{02}$ 2610b symmetry events, respectively, are observed and reset when another symmetry event is observed. Note symmetry events $w_{01}$ 2610a and $w_{02}$ 2610b are complementary in that $w_{01}$ 2610a implies oscillator B would be faster if its pulse waveform were symmetric while $w_{02}$ 2610b implies oscillator A would be faster if its pulse waveform were symmetric; thus these events would not occur in this sequence if the two input pulse waveforms were symmetric and their frequencies were in a fixed ratio.

By taking a logical AND of these two captured events, the first asymmetry signature in the list above would be subsequently indicated. Using NAND gate 2630a to realize this AND operation facilitates use of an additional NAND gate 2635a to provide (via DeMorgan's law) an OR operation as well as drive an LED indication 2640a of the $S_0$ asymmetry event.

Similarly, three additional pairs of RS latches 2620c-2620d, 2620e, 2620f, 2620g, and 2620h are responsive to the remaining three pairs of signature symmetry event sequences 2610c, 2610d, 2610e, 2610f, 2610g, and 2610h, each similarly directed to a corresponding NAND gate 2635b-2635d and LED 2640b-2640d in the same fashion. All four of the $S_0$, $S_1$, $S_2$, $S_3$ asymmetry events are thus separately captured, separately provided with LED indication, and directed to an OR operation to globally report the general existence of an asymmetry event.

Figure 27:
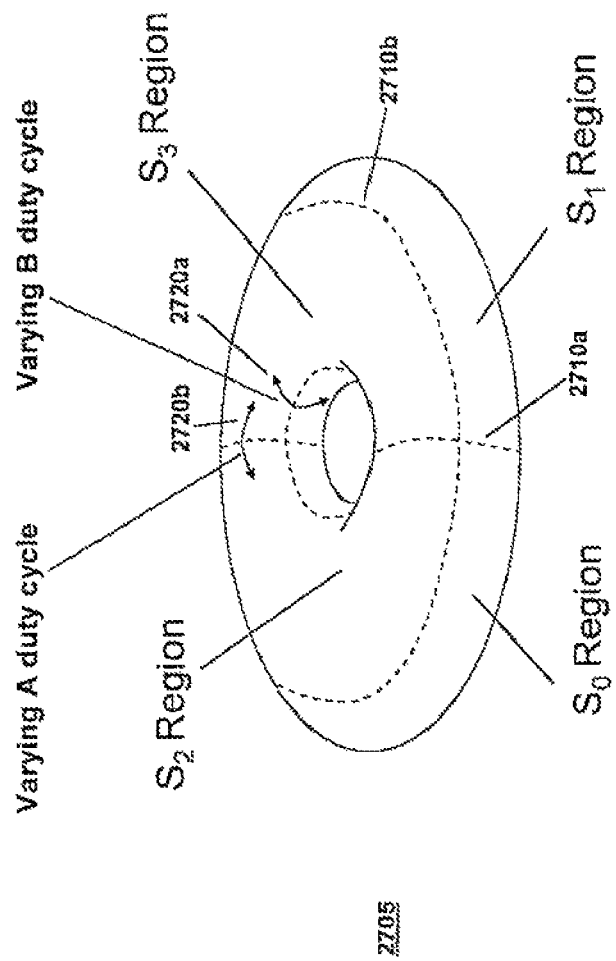
FIG. 27 illustrates a variation of the quantized torus of FIGS. 19a-19d, which is adapted to asymmetric pulse waveforms.

The general background as to the behavior of pairs of asymmetric pulse waveforms can be further rendered in terms of modified versions of the symbolic dynamics models introduced for the symmetric case. As to this, FIG. 27 illustrates a variation of the symmetrically quantized torus 2010 of FIG. 20 adapted for use with asymmetric pulse waveforms. Here, region boundaries 2710a, 2710b determining the quantization thresholds on the continuous-value continuous-time oscillator torus surface may be adjusted (indicated by arrows 2720a, 2720b) to obtain different duty-cycles. Clearly this affects the resulting event-driven symbol sequence.

Figure 28A:
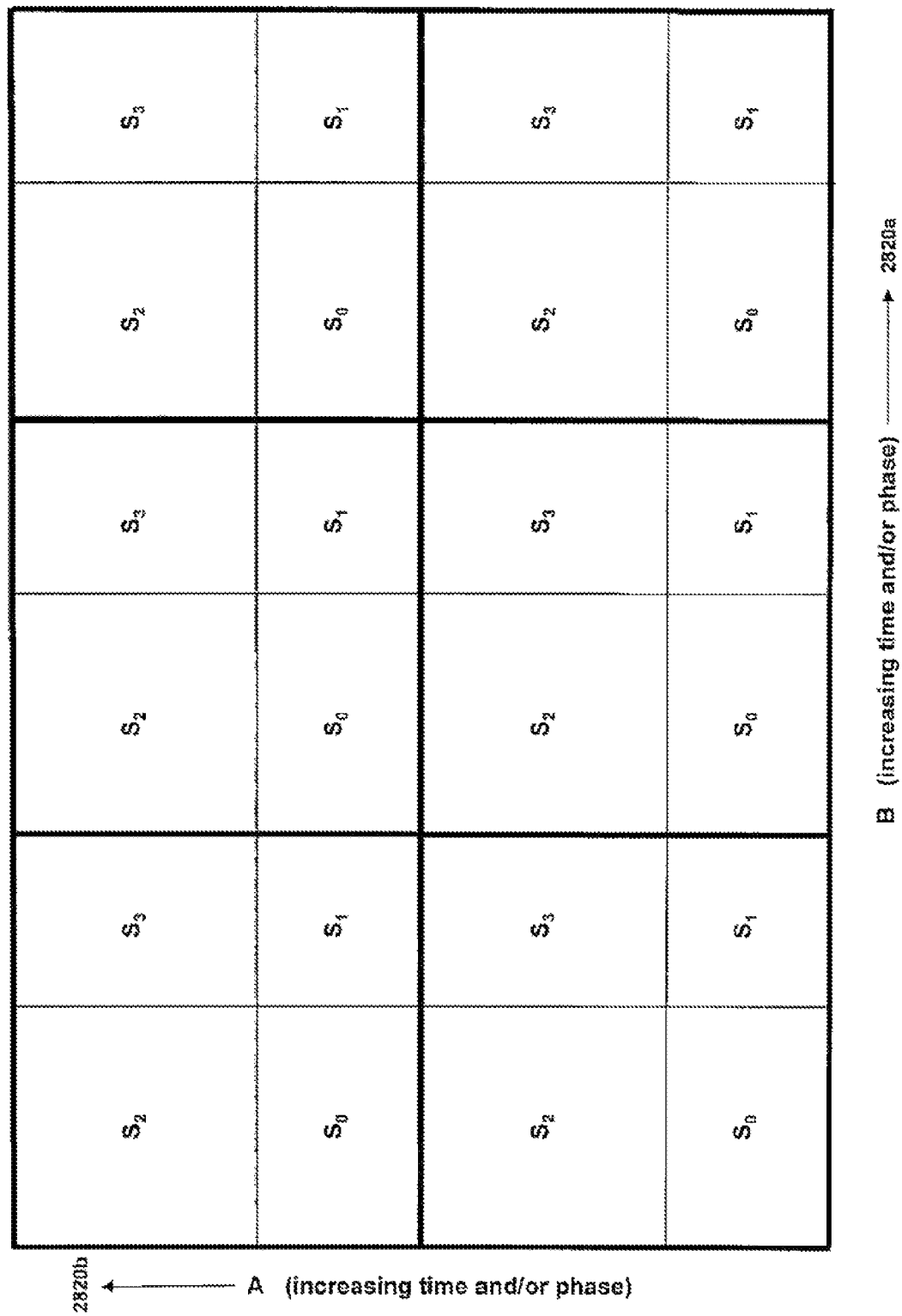
FIG. 28a illustrates an asymmetric sequential tiling representation of the asymmetrically quantized torus of FIG. 27.

Further detail can be seen by adapting the infinite periodic quantized-symbol tiling model to asymmetric pulse waveforms. As to this, FIG. 28a illustrates an asymmetric sequential tiling representation of the asymmetrically quantized torus 2705 of FIG. 27, akin to the symmetrically-quantized torus of FIG. 21a. As with FIG. 21a, each larger tile corresponding to the full torus surface is indicated with a thick line boundary, and each larger tile of the full torus surface is symmetrically subdivided into four separate areas. These subdivided areas within each of the full torus-surface tiles will be termed "symbol tiles."

In the vertical direction 2820a, there are two alternating types of columns, one that sequences between $S_0$ and $S_2$ symbol tiles and another that sequences between $S_1$ and $S_3$ symbol tiles. In the horizontal direction 2820b, there are two alternating types of rows, one that sequences between $S_0$ and $S_1$ symbol tiles and another that sequences between $S_2$ and $S_3$ symbol tiles.

Figure 28B:
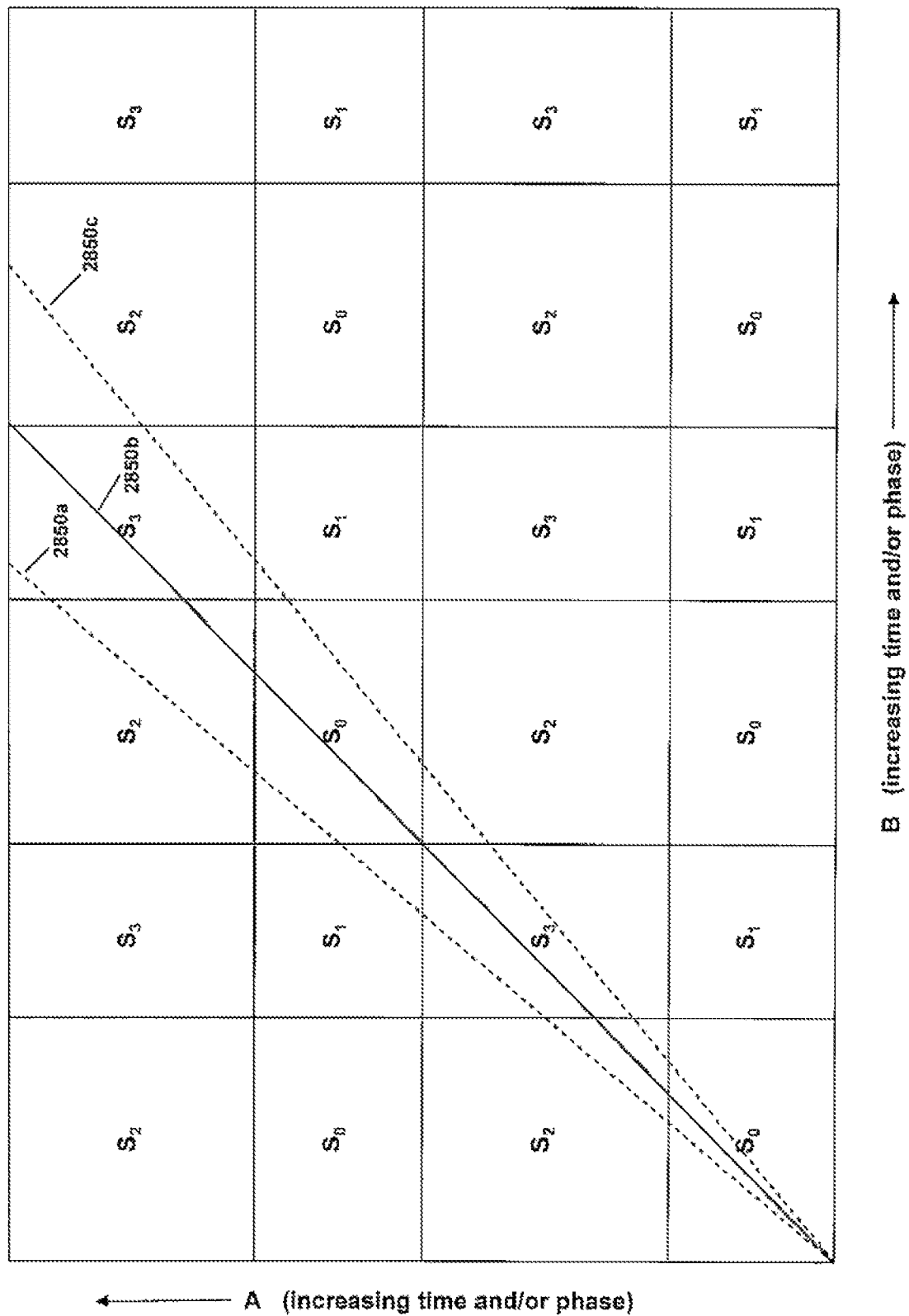
FIG. 28b illustrates exemplary trajectories associated with fixed frequency ratios of unity, less than unity, and greater than unity in their traversal over the asymmetric sequential tiling.
Figure 28C:
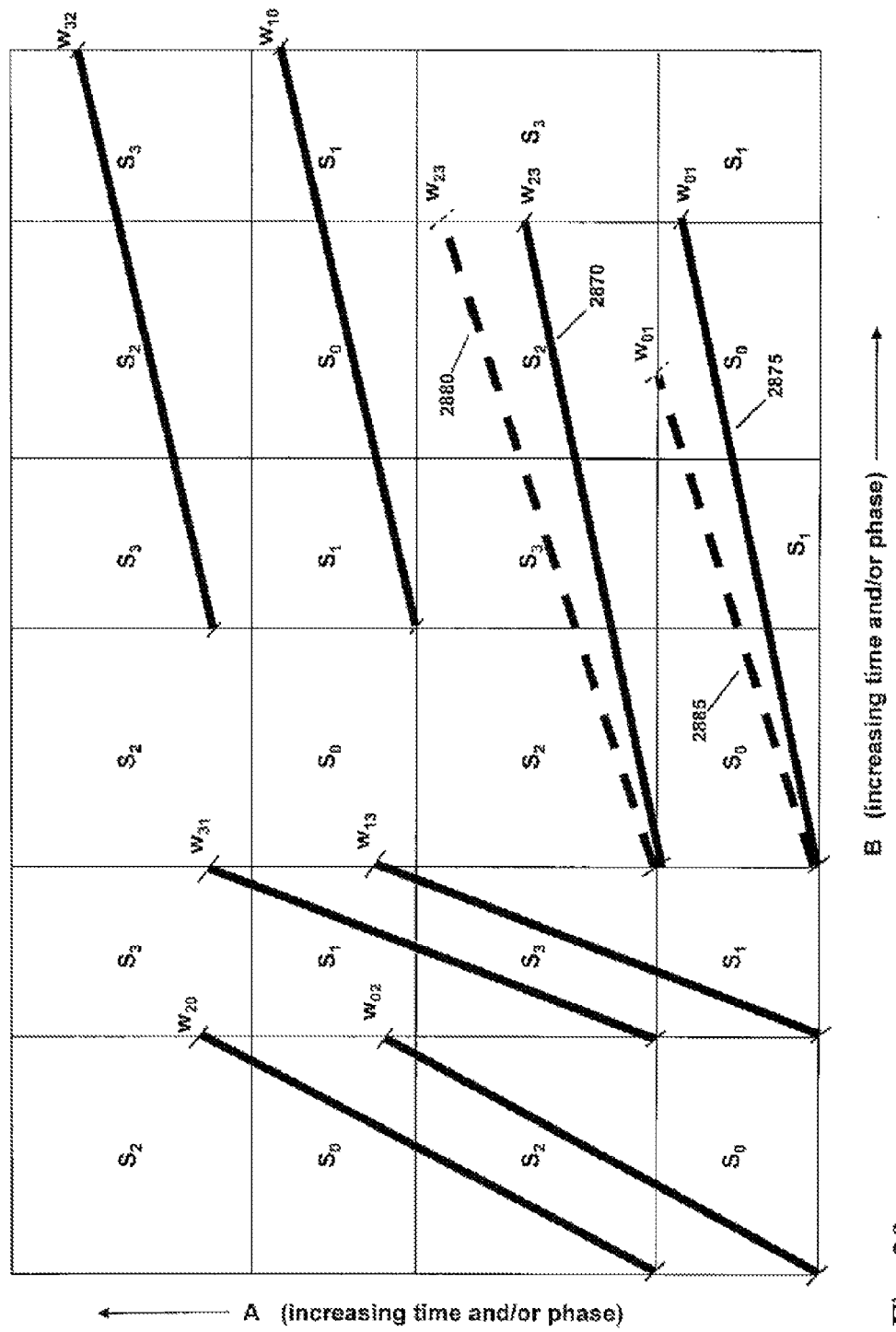
FIG. 28c illustrates exemplary portions of trajectories associated with each of the eight symmetry events associated with the invention.

FIG. 28b illustrates three exemplary trajectories associated with fixed frequency ratios of unity 2850b, less than unity 2850c, and greater than unity 2850a in their traversal over the asymmetric sequential tiling. Using the notions of FIGS. 28a, 28b, FIG. 28c illustrates exemplary portions of trajectories associated with each of the eight symmetry events of the invention. Note in particular that the two parallel solid-marked spans of symmetry events $w_{23}$ 2870 and $w_{01}$ 2875 are of equal length, while at a slightly different frequency ratio the two dashed-marked spans of symmetry events $w_{23}$ 2880 and $w_{01}$ 2885 are of unequal length, resultant from the waveform asymmetry.

Attention now is directed to the relation between closeness in frequency and degrees of asymmetry that give rise to asymmetric events and the duration of constituent alternating patterns of complementary event symbols.

Figure 29A:
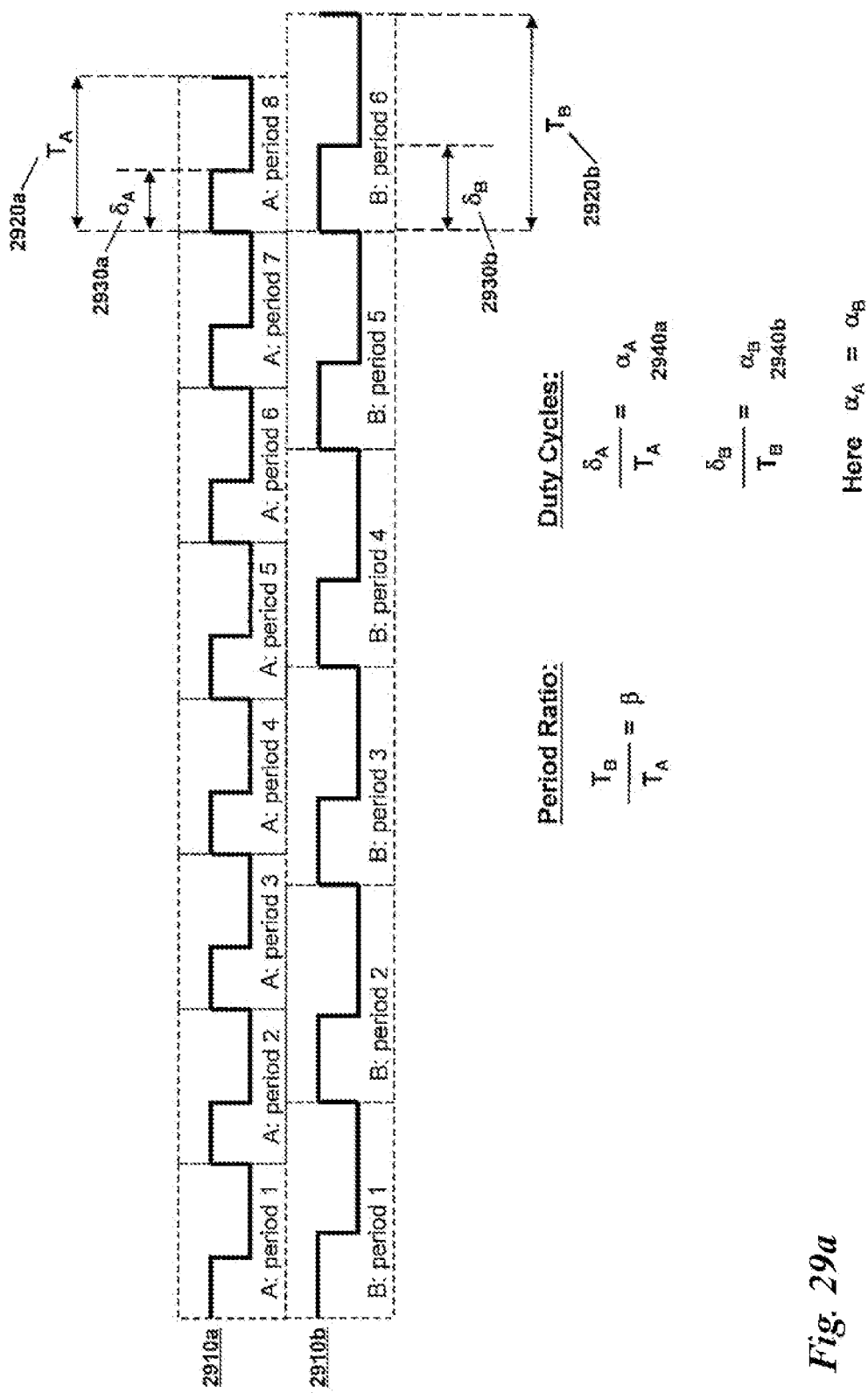
FIG. 29a illustrates timing notations that may be applied to asymmetric input waveforms.

To begin, FIG. 29a illustrates timing notations that may be applied to an exemplary pair of asymmetric input waveforms that share a nearly identical asymmetric duty-cycle. The top waveform comprises an asymmetric pulse pattern with a given duty-cycle (other than 50%) which repeats periodically at a given rate to form pulse-wave A 2910a. The lower waveform is a time-stretched version of the original asymmetric pulse pattern; this time-stretched version repeats periodically to form a slower pulse-wave B 2910b of lower frequency of the same duty-cycle.

In this example the period of the time-stretched version is depicted as 7/5 longer than the period of the original asymmetric pulse pattern. Herein, the ratio of frequency of pulse wave A 2910a to frequency of pulse wave B 2910b is 7/5, and their co-aligned phase-locked pattern repeats every 7 cycles of pulse wave 2910a and every 5 cycles of pulse wave B 2910b. Note that for the predominant cases where one or both of the frequencies either drift from the illustrative phase-lock condition of FIG. 29a or are non-commensurable, the relative positions of the waveforms will shift variably over time.

For subsequent discussion and additional calculation, the following quantities are in general defined:
- the period of waveform A 2910a is $T_A$ 2920a, measured in units of time;
- the period of waveform B 2910b is $T_B$ 2920b, measured in units of time;
- the duty-duration of waveform A 2910a is $\delta_A$ 2930a, measured in units of time;
- the duty-duration of waveform B 2910b is $\delta_B$ 2930b, measured in units of time;

the duty-cycle of waveform A 2910a is $\alpha_A$ 2940a, measured as dimensionless fraction;

the duty-cycle of waveform B 2910b is $\alpha_B$ 2940b, measured as dimensionless fraction;

the duration over which waveform A 2910a has logical value 0 is $T_{(a=0)}$, measured in units of time;

the duration over which waveform A 2910a has logical value 1 is $T_{(a=1)}$, measured in units of time;

the duration over which waveform B 2910b has logical value 0 is $T_{(b=1)}$, measured in units of time;

the duration over which waveform B 2910b has logical value 1 is $T_{(b=1)}$, measured in units of time;

the period ratio of waveform B 2910b to waveform A 2910a is $\beta = T_B/T_A$.

Note that $\delta_A$ 2930a and $T_{(a=1)}$ are equivalent, as are $\delta_B$ 2930b and $T_{(b=1)}$. Additionally, for the example above, $\delta = 7/5$ and $\alpha_A = \alpha_B$. Also since period is the reciprocal of frequency, the period ratio of waveform B to waveform A is identical to the frequency ratio as defined throughout this specification.

Figure 29B:
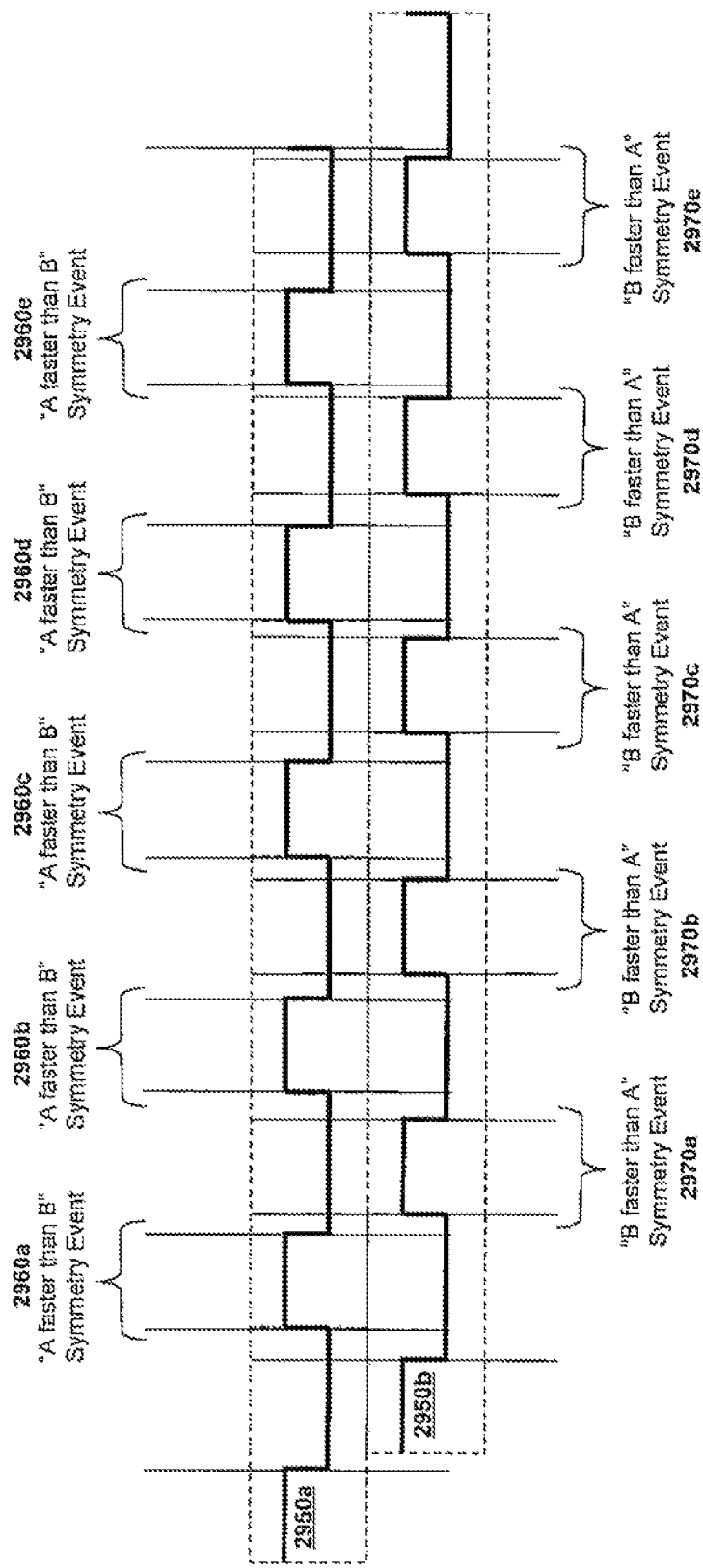
FIG. 29b illustrates the interval of evolving occultations of asymmetric aspects of two exemplary asymmetric input waveforms with frequencies sufficiently close together to result in alternating indications that each of the oscillators is faster than the other.

In a situation in contrast to that of FIG. 29a, FIG. 29b illustrates a portion of a case where the frequency ratio is only slightly larger than 7/5. This frequency ratio guarantees the eventuality of a situation depicted in FIG. 29b wherein the evolving occultations of the asymmetric aspects of two exemplary asymmetric input waveforms 2950a, 2950b with frequencies sufficiently close together result in alternating indications 2960a-2960e and 2970a-2970e that each of the oscillators 2950a, 2950b in turn is faster than the other.

In the slightly larger view, pairs of asymmetric waveforms at sufficiently close frequencies experience alternating intervals of general typical behavior and intervals of asymmetry events comprising alternating indications of symmetry events (the situation depicted in FIG. 29b being an example of the latter) as non-phase-locked waveforms slip by one another. This alternation can be viewed as a type of macro-cycle (although if the frequencies are non-commensurable, this macroscopic behavior will not be periodic but rather slowly evolving).

In general, the macroscopic behavior will be similar to that depicted in FIGS. 30a-30d. In particular, FIGS. 30a-30d depict four macroscopic behavioral signatures, respectively, corresponding to the asymmetry events depicted in FIGS. 25a-25d. These four signatures are distinguished by the presence of specific pairs of complementary symmetry events. Detection of these signatures, further, specifically indicates relative relationships that must exist among $T_{(a=0)}$, $T_{(a=1)}$, $T_{(b=0)}$, and $T_{(b=1)}$. Note that all of this is simply a formalization of the geometric pulse width relationships depicted in FIGS. 25a-25d.

In a more aggregate and general behavioral view of the macro-cycle situations depicted in FIGS. 30a-30d, FIGS. 31a-31c depict the evolution of macro-cycle behavior that occurs for waveforms comprising (even minor) asymmetry as the frequency ratio is increased from a value sufficiently lower than unity, through ratios sufficiently close to unity, and then in ratios sufficiently greater than unity.

FIG. 31a illustrates macro-cycle behavior for the case where the frequency ratio is a value sufficiently lower than unity. FIG. 31b illustrates the case where the frequency ratio is close enough to unity that the waveform asymmetry (however small it may be) becomes theoretically detectable. However, in any physical implementation, the minimum response times of the logic circuitry, mechanical apparatus, chemical process, sampling rate for data provided to algorithmic implementations, etc. will determine a minimum threshold for which this situation can be detected. As the frequency ratio continues to increase to ratios sufficiently greater than unity, the behavior will become that depicted in FIG. 31c.

The process giving rise to the phenomena of FIG. 31b may be understood in terms of the example of FIGS. 32a-32c. For two waveforms whose frequencies are sufficiently close together, one of the waveforms may be viewed as progressing past the viewpoint of the other waveform. The rate of this progression is proportional to the difference in frequencies (and as such is similar to a "beat frequency," well-known in the practices of vibrational mechanics, acoustics, and communications). As one waveform progresses past the other, the waveform asymmetries undergo various enveloping arrangements (or occultations) of one another.

In particular, FIGS. 32a-32c illustrate the evolution of symbol sequences and symmetry events before, during, and after occultations of asymmetric aspects of two exemplary asymmetric input waveforms with frequencies sufficiently close together. Before occultation, there are no symmetry events, as illustrated in the specific illustrative example of FIG. 32a. During occultation, the asymmetric aspects give rise to various asymmetry events, in particular the sequence of complementary symmetry events 3240, 3245, 3250, 3255, as illustrated in FIG. 32b, depicting the slightly shifted epoch in specific illustrative example of FIG. 32a. After occultation, the asymmetric aspects no longer give rise to asymmetry events and the situation returns to one not unlike the situation of FIG. 32a. This is illustrated in FIG. 32c, depicting a yet further shifted epoch in the specific illustrative example of FIG. 32a.

Formulas may be computed (in terms of the quantities defined earlier) for the upper and lower thresholds at which, for a given frequency ratio and given duty-cycles, the behavior of FIGS. 31b will begin to appear. These formulas can be extended to further characterize thresholds for more detailed behavior such as that depicted in FIGS. 30a-30d, the temporal duration of macro-cycles, the number of alternations of complementary symmetry events in a macro-cycle and the frequency of these alterations, and the like. Threshold formulas may be further adjusted to account for minimum response times, sampling rates, and other factors to determine a minimum threshold for which asymmetry situations can be detected. Such formulas can be used to characterize the limitations of a particular embodiment. Additionally, such formulas may be used to design or create additional features, capabilities, and extensions.

For example, the use of resettable counters in conjunction with detection of specific alternating complementary symmetry events may be used to further characterize waveform asymmetries and specific aspects of asymmetry events that may be useful in specific applications.

The various methods and processes described herein may be implemented in a computer-readable medium using, for example, computer software, hardware, or some combination thereof. For a hardware implementation, the embodiments described herein may be performed by the above-noted circuitry and/or in conjunction with a processor. As such, hardware embodiments may be implemented within, for example, one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof.

For a software implementation, the embodiments described herein may be implemented with separate software modules, such as procedures, functions, and the like, each of which perform one or more of the functions and operations described herein. The software codes can be implemented with a software application written in any suitable programming language and may be stored in a memory unit, and executed by a processor. The memory unit may be implemented using any type (or combination) of suitable volatile and non-volatile memory or storage devices including random access memory (RAM), static random access memory (SRAM), electrically erasable programmable read-only memory (EEPROM), erasable programmable read-only memory (EPROM), programmable read-only memory (PROM), read-only memory (ROM), magnetic memory, flash memory, magnetic or optical disk, or other similar or effective memory or data storage device.

Other Applications

It was noted earlier that realizations of the invention can also be used to determine which of two buttons or switches was last cycled on and off. Additional logic circuitry can be added to create a "radio-button" chip that can be ganged to arbitrary numbers of buttons. Further, the invention may be adapted to a wide range of phase-detection applications.

The invention is applicable to a wide range of possible application areas. These include both system and method realizations, as well as realizations of analytical methods. Some examples of applicable application areas include:

- synchronous motor control and operation;
- cross-traffic or resource-constrained timing in transportation systems;
- resource allocation in manufacturing or project scheduling theory;
- scheduling of real-time tasks in real-time and near-real-time operating systems;
- astronomy calculations, perhaps applied in new analyses of ancient archaeoastronomy sites;
- tool for study of oscillator-coupling phenomena in chaotic and self-organizing systems;
- geometric lattice design;
- quantum effects in nanotechnologies;
- long-duration timing systems as may be used in radioactive waste storage or long-distance space travel;
- study of energy-transfer among inharmonic periodic modes of oscillation;
- analysis of biological and ecological systems.

Those skilled in the art will realize the wide range of alternatives applicable to embodiments of the invention; these are recognized due to the general character of the invention and are thus provided as part of by the invention.

While the invention has been described in detail with reference to disclosed embodiments, various modifications within the scope of the invention will be apparent to those of ordinary skill in this technological field. It is to be appreciated that features described with respect to one embodiment typically may be applied to other embodiments. Therefore, the invention properly is to be construed only with reference to the claims.

References

[1] Bai-Lin, Hao, *Elementary Symbolic Dynamics and Chaos in Dissipative Systems*, World Scientific, Singapore 1989, ISBN 9971-50-682-3.

[2] Hale, Jack K.; Kocak, Huseyin, *Dynamics and Bifircations*, Springer-Verlag, New York, 1991, ISBN 0-387-97141-6.

[3] Kitchens, Bruce P., *Symbolic Dynamics—One-sided, Two-sided and Countable State Markov Shifts*, Springer-Verlag, Berlin 1998, ISBN 3-540-62738-3.

[4] Nerurkar, M. G.; Doldcen, D. P.; Ellis, D. B. (eds.), *Topological Dynamics and Applications, Contemporary Mathematics*, American Mathematical Society, Providence 1998, ISBN 0-8218-0608-4.

[5] Walters, Peter (ed.), *Symbolic Dynamics and its Applications, Contemporary Mathematics*, American Mathematical Society, Rhode Island 1992, ISBN 0-8218-5146-2.

[6] Williams, Susan G. (ed.), *Symbolic Dynamics and its Applications, Proceedings of Symposia in Applied Mathematics*, American Mathematical Society, Providence 2004, ISBN 0-8218-3157-7.

I claim:

1. A method, comprising:
    detecting samples of a first signal and samples of a second signal;
    identifying, from the detected samples of the first and second signals, an event in which at least two transitions of the first signal have occurred between two transitions of the second signal; and
    in response to identifying the event, providing an output indicative of the first signal having a different frequency than the second signal.

2. The method of claim 1, wherein the output specifies that the first signal has a higher frequency than the second signal.

3. The method of claim 1, wherein the identifying includes:
    determining a sequence of symbols from the detected samples of the first and second signals; and
    identifying a pattern in the sequence of symbols, wherein the pattern is indicative of the event.

4. The method of claim 3, wherein a given one of the symbols is indicative of a sample of the first signal and a sample of the second signal.

5. The method of claim 3, wherein the pattern indicates that values of the first signal have changed within an interval while values of the second signal have not changed within the interval.

6. The method of claim 1, wherein the detecting the samples of the first signal includes capturing the samples of the first signal in response to one or more transitions of the second signal, and wherein detecting the samples of the second signal includes capturing the samples of the second signal in response to one or more transitions of the first signal.

7. An apparatus, comprising:
    a comparison circuit, wherein the comparison circuit is configured to make a determination of whether a pulse of a first signal is enveloped within a pulse of a second signal, and wherein the comparison circuit is further configured to indicate, based on the determination, whether the first signal has a different frequency than the second signal.

8. The apparatus of claim 7 wherein the comparison circuit is configured to:
    determine a sequence of symbols based on instantaneous values of the first and second signals; and
    identify one of a set of patterns in the sequence of symbols, wherein the patterns indicate 1) whether a pulse of the first signal is enveloped within a pulse of the second signal or 2) whether a pulse of the second signal is enveloped within a pulse of the first signal.

9. The apparatus of claim 8, wherein the comparison circuit is configured to:
    generate a clock pulse signal from the first and second signals; and
    based on the clock pulse signal, capture instantaneous values of the first and second signals into a shift register, wherein the comparison circuit is configured to use the captured instantaneous values to identify one of the set of patterns in the sequence of symbols.

10. The apparatus of claim 7, wherein the comparison unit includes:
   a first set of latches, wherein each of the first set of latches is configured to capture instantaneous values of the first signal in response to a respective clock signal, wherein one of the respective clock signals is the second signal, and wherein one of the respective clock signals is an inverted form of the second signal; and
   a second set of latches, wherein each of the second set of latches is configured to capture instantaneous values of the second signal;
   wherein the determination is based on the captured values of the first and second signals.

11. The apparatus of claim 7, wherein the comparison unit includes:
   a plurality of set-reset latches, wherein each set-reset latch is configured to:
      receive a respective set signal that is either the first signal or an inverted form of the first signal;
      receive a respective reset signal that is either the second signal or an inverted form of the second signal; and
      output a respective value usable in making the determination.

12. The apparatus of claim 7, further comprising:
   another comparison circuit configured to receive a third signal, wherein the apparatus is configured to indicate whether the third signal has a different frequency relative to the first signal or relative to the second signal.

13. The apparatus of claim 7, wherein the comparison circuit is configured to: identify a signal as having an asymmetric waveform; and
   generate a corresponding output indicative of the asymmetric waveform.

14. A non-transitory computer readable medium having program instructions stored thereon that are executable to cause a computing device to perform:
   comparing a first signal and a second signal by determining whether at least two transitions of the first signal have occurred within two transitions of the second signal; and
   based on the comparing, providing an output indicative of whether the first signal has a different frequency than the second signal.

15. The computer readable medium of claim 14, wherein the output identifies one of the first and second signals as having a higher frequency than the other signal.

16. The computer readable medium of claim 14, wherein the determining includes:
   determining a set of symbols from the first and second signals; and
   identifying a pattern in the set of symbols.

17. The computer readable medium of claim 16, wherein the set of symbols includes at least three symbols, and wherein each of the at least three symbols is determined based on a respective instantaneous value of the first signal and a respective instantaneous value of the second signal.

18. The computer readable medium of claim 14, wherein the determining includes:
   capturing an instantaneous value of the first signal in response to a transition of the second signal; and
   capturing an instantaneous value of the second signal in response to a transition of the first signal.

19. The computer readable medium of claim 14, wherein the program instructions are further executable to perform:
   comparing a third signal with the first signal and the second signal; and
   provide an output indicative of whether the third signal has a higher frequency than the first signal and the second signal.

20. The computer readable medium of claim 14, wherein the program instructions are further executable to perform:
   detecting that the first signal or the second signal has an asymmetric waveform.

\* \* \* \* \*